US011695031B2

(12) United States Patent
Lee et al.

(10) Patent No.: US 11,695,031 B2
(45) Date of Patent: Jul. 4, 2023

(54) LIGHT-EMITTING DEVICE, LIGHT SOURCE MODULE, AND METHOD OF MANUFACTURING LIGHT-EMITTING DEVICE

(71) Applicant: SAMSUNG ELECTRONICS CO., LTD., Suwon-si (KR)

(72) Inventors: Jungwook Lee, Suwon-si (KR); Jaeyoon Kim, Yongin-si (KR); Sangbum Lee, Hwaseong-si (KR); Sungwook Lee, Seoul (KR); Sumin Hwangbo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 219 days.

(21) Appl. No.: 17/114,875

(22) Filed: Dec. 8, 2020

(65) Prior Publication Data
US 2021/0366980 A1 Nov. 25, 2021

(30) Foreign Application Priority Data
May 25, 2020 (KR) .................. 10-2020-0062581

(51) Int. Cl.
| | |
|---|---|
| *H01L 27/15* | (2006.01) |
| *H01L 33/52* | (2010.01) |
| *H01L 33/48* | (2010.01) |
| *H01L 33/62* | (2010.01) |

(52) U.S. Cl.
CPC .......... *H01L 27/156* (2013.01); *H01L 33/483* (2013.01); *H01L 33/52* (2013.01); *H01L 33/62* (2013.01)

(58) Field of Classification Search
CPC combination set(s) only.
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |

(Continued)

*Primary Examiner* — Mark W Tornow
*Assistant Examiner* — Priya M Rampersaud
(74) *Attorney, Agent, or Firm* — Sughrue Mion, PLLC

(57) ABSTRACT

A light-emitting device is provided. The light emitting device includes a support substrate having a light-emitting cell region, a pad region and an edge region, the edge region surrounding the light-emitting cell region and the pad region; a plurality of unit light-emitting devices arranged in a matrix in the light-emitting cell region and spaced apart from each other; a plurality of pads formed in the pad region; partition walls arranged on the plurality of unit light-emitting devices, the partition walls defining a plurality of cell spaces respectively corresponding to the plurality of unit light-emitting devices; and a plurality of fluorescent layers arranged on the plurality of unit light-emitting devices in the plurality of cell spaces. The light-emitting device has a cuboid shape, in which a first length in a first direction is greater than a second length in a second direction.

20 Claims, 40 Drawing Sheets

(56) References Cited

U.S. PATENT DOCUMENTS

| | | | |
|---|---|---|---|
| 7,064,450 B1* | 6/2006 | Eghan | H01L 22/32 257/773 |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,397,127 B2 | 7/2008 | Lin et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,400,064 B2 | 3/2013 | Wei et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,911,673 B2 | 3/2018 | Akiba et al. | |
| 10,126,831 B2 | 11/2018 | Kim et al. | |
| 10,163,747 B2 | 12/2018 | Heng et al. | |
| 10,196,742 B2 | 2/2019 | Lee | |
| 10,256,436 B2 | 4/2019 | Kim | |
| 2010/0237788 A1* | 9/2010 | Tsai | H05B 47/155 315/185 R |
| 2015/0373793 A1* | 12/2015 | Bower | G02B 26/04 362/20 |
| 2017/0250316 A1* | 8/2017 | Yeon | H01L 33/504 |
| 2018/0182931 A1* | 6/2018 | Lee | H01L 33/50 |
| 2018/0197924 A1* | 7/2018 | Tada | H10K 71/00 |
| 2019/0319065 A1* | 10/2019 | Daikoku | H01L 27/156 |
| 2019/0326349 A1* | 10/2019 | Kwon | H01L 33/0093 |
| 2020/0110307 A1* | 4/2020 | Chang | H01L 25/0753 |
| 2020/0127228 A1 | 4/2020 | Huang et al. | |
| 2020/0152694 A1* | 5/2020 | Lee | H01L 33/50 |
| 2021/0265429 A1* | 8/2021 | Yamanaka | G09F 9/30 |
| 2021/0351263 A1* | 11/2021 | Okabe | H10K 50/844 |

* cited by examiner

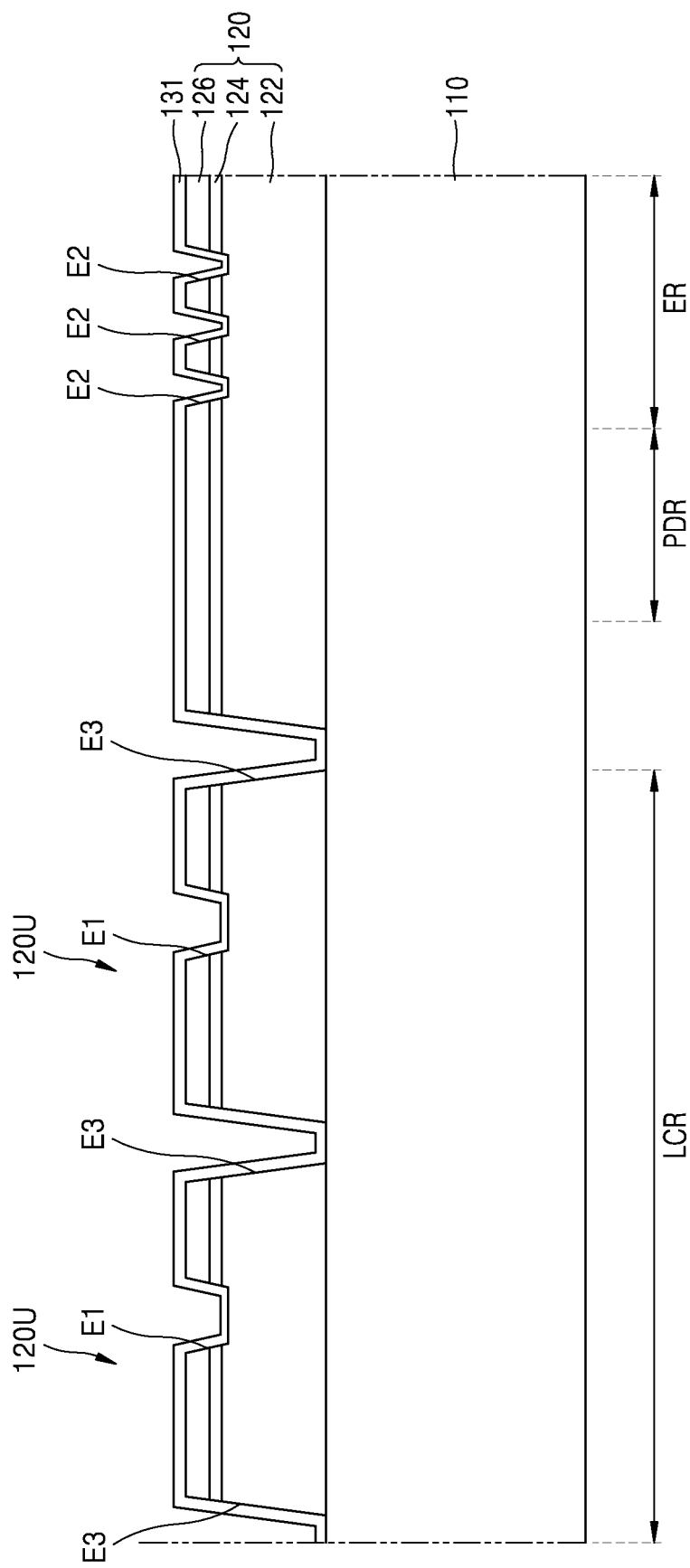

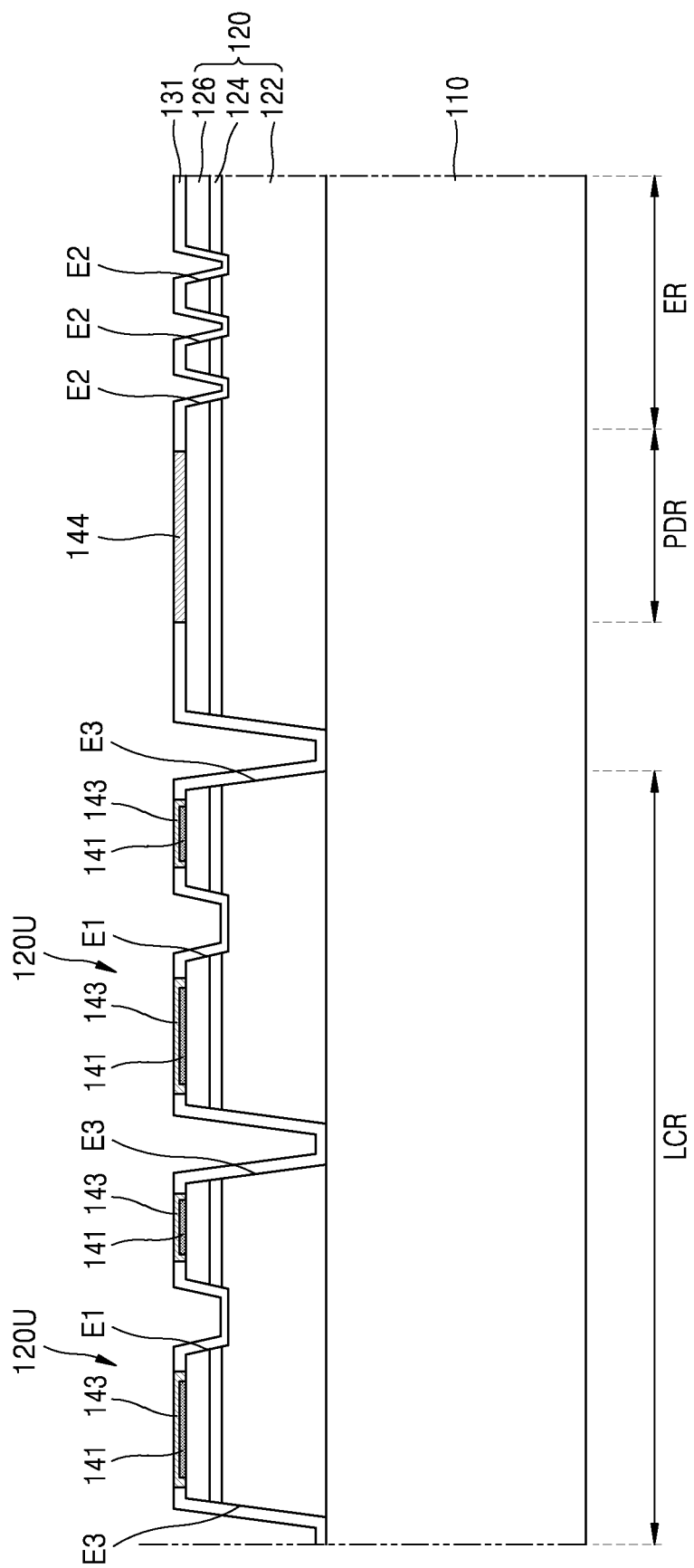

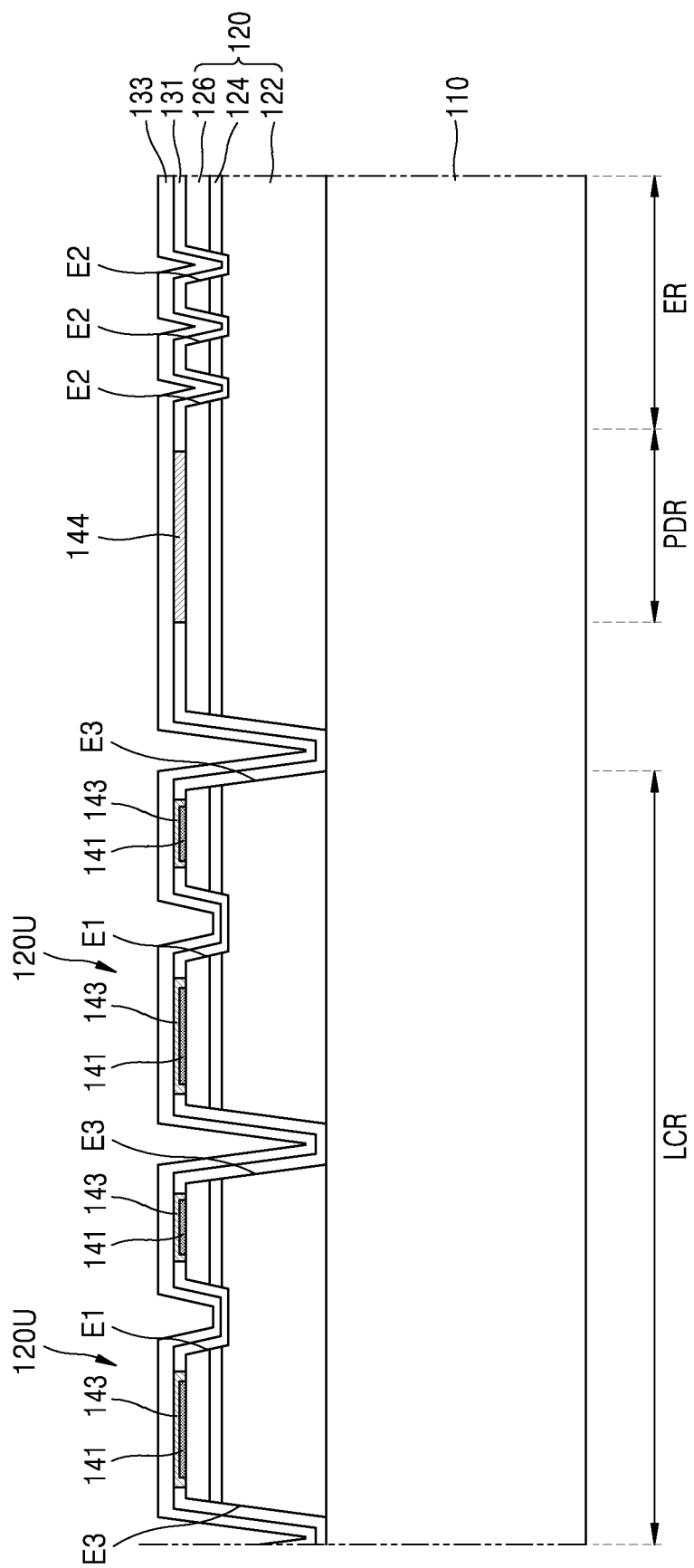

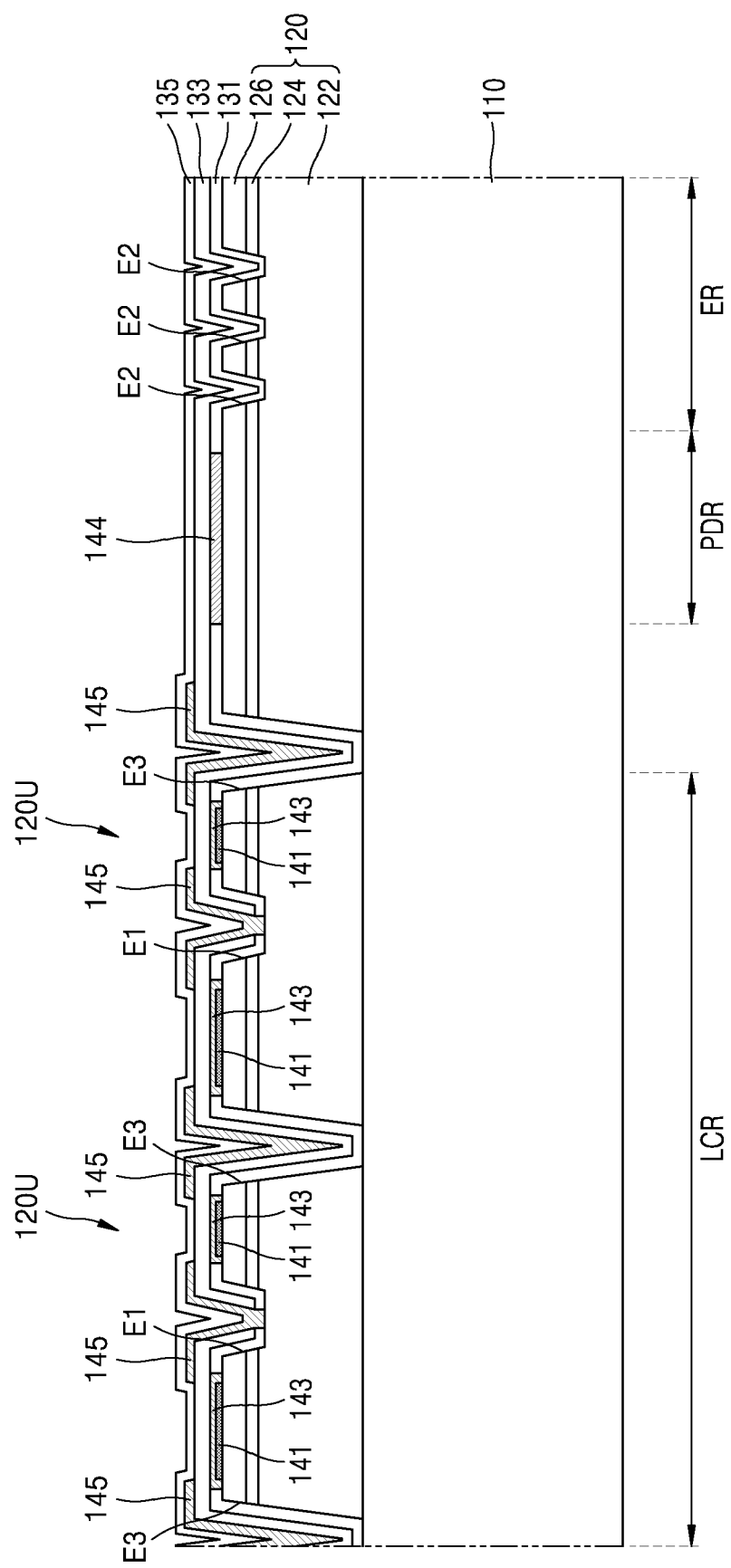

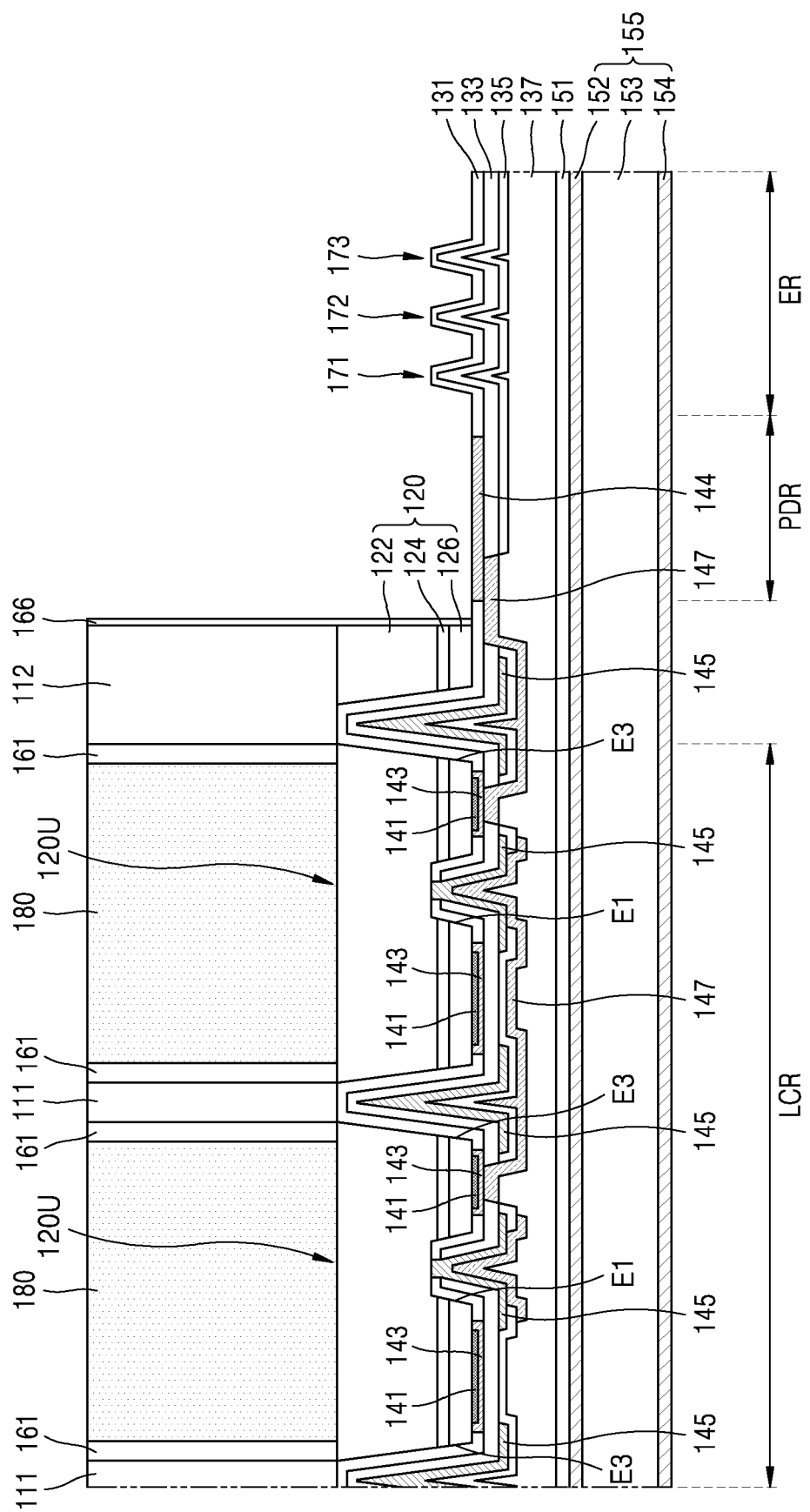

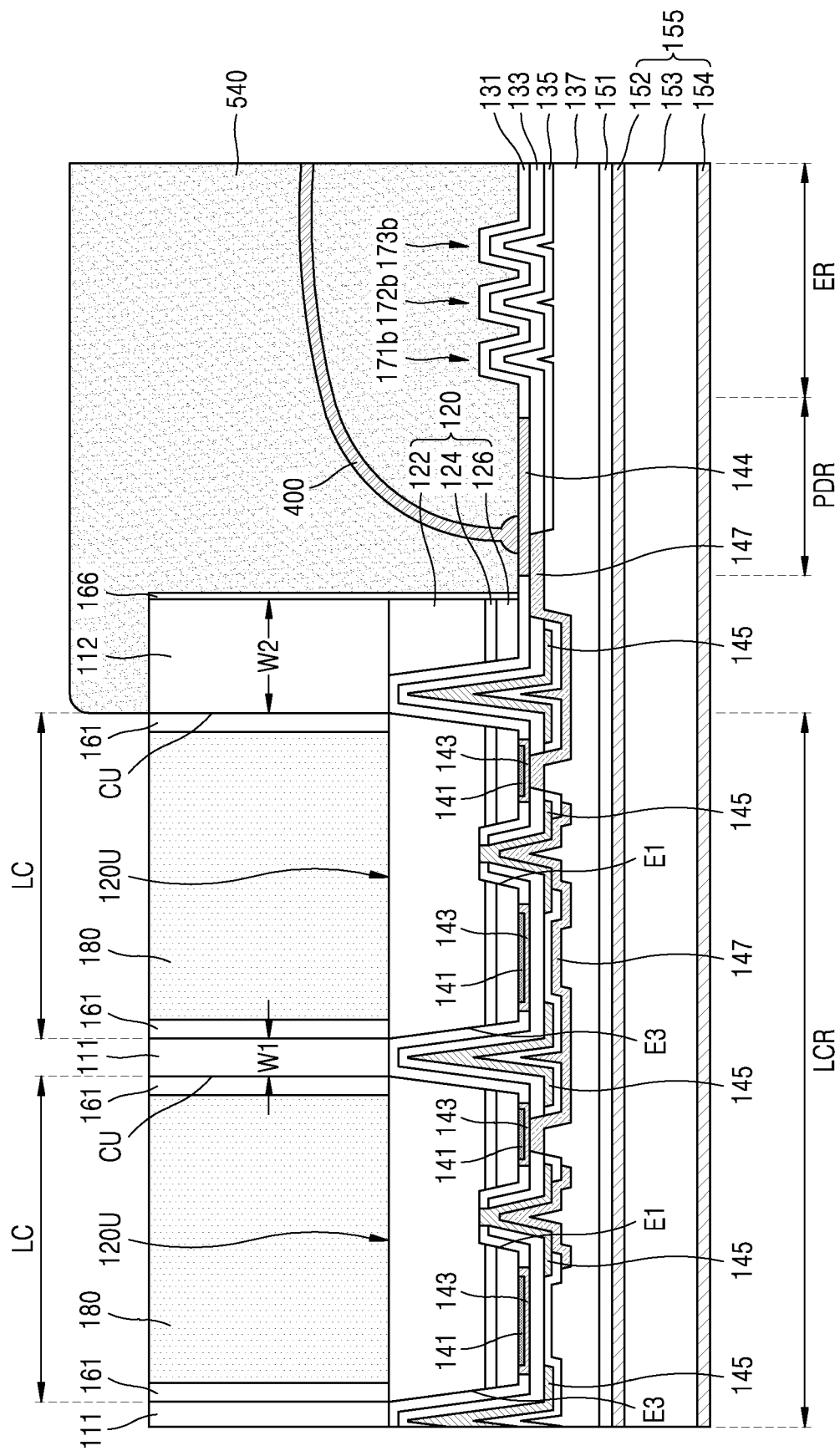

LIGHT-EMITTING DEVICE, LIGHT SOURCE MODULE, AND METHOD OF MANUFACTURING LIGHT-EMITTING DEVICE

CROSS-REFERENCE TO RELATED APPLICATION

This application priority from Korean Patent Application No. 10-2020-0062581, filed on May 25, 2020, in the Korean Intellectual Property Office, the disclosure of which is incorporated herein by reference in its entirety.

BACKGROUND

Methods and apparatuses consistent with example embodiments relate to a light-emitting device, a light source module, and a method of manufacturing the light-emitting device.

Light-emitting devices include elements, such as light-emitting diodes (LEDs), and are being used as light sources in an increasingly wide range because the light-emitting devices have many advantages, such as low power consumption, high brightness, and long lifespan. In recent years, there has been a growing interest in light-emitting devices as units capable of replacing the existing halogen or xenon lamps used as light sources for headlamps or tail lamps for vehicles.

When a light-emitting device is applied as a light source to a lighting apparatus, it may be necessary to adjust a brightness, a light orientation angle, and a light irradiation angle of the light-emitting device according to lighting conditions. For example, a headlamp or a tail lamp for a vehicle requires a light-emitting device capable of finely adjusting a lighting apparatus according to surrounding road conditions.

SUMMARY

Example embodiments provide a light-emitting device, which is resistant to electrical and mechanical damage and has high luminous efficiency.

Example embodiments are not limited by the above description, and other unmentioned aspects will be clearly understood by one of ordinary skill in the art from the following description.

According to an aspect of an example embodiment, a light-emitting device includes: a support substrate having a light-emitting cell region, a pad region and an edge region, the edge region surrounding the light-emitting cell region and the pad region; a plurality of unit light-emitting devices arranged in a matrix in the light-emitting cell region and spaced apart from each other; a plurality of pads formed in the pad region; partition walls arranged on the plurality of unit light-emitting devices, the partition walls defining a plurality of cell spaces respectively corresponding to the plurality of unit light-emitting devices; and a plurality of fluorescent layers arranged on the plurality of unit light-emitting devices in the plurality of cell spaces. The light-emitting device has a cuboid shape, a first length of the light-emitting device in a first direction is greater than a second length of the light-emitting device in a second direction, the first direction is parallel to a top surface of the support substrate, and the second direction is parallel to the top surface of the support substrate and perpendicular to the first direction.

According to an aspect of an example embodiment, a light-emitting device includes a plurality of unit light-emitting devices arranged in a matrix shape and spaced apart from each other in a lateral direction; a first insulating layer covering bottom surfaces of the plurality of unit light-emitting devices; a second insulating layer covering a bottom surface of the first insulating layer; a third insulating layer covering a bottom surface of the second insulating layer; a buried insulating layer covering a bottom surface of the third insulating layer and comprising a planar surface; an adhesive layer in contact with the planar surface of the buried insulating layer; and a support substrate in contact with the adhesive layer. The light-emitting device has a rectangular planar shape and a first of the rectangular planar shape is perpendicular to a second side of the rectangular planar shape, a first length of the first side is about 1.1 times to about 100 times a second length of the second side, and a thickness of the light-emitting device is less than about $\frac{1}{10}$ the first length.

According to an aspect of an example embodiment, a light source module includes: a package substrate; a light-emitting device disposed on the package substrate and comprising a plurality of unit light-emitting devices arranged in a matrix, the light-emitting device having a rectangular planar shape; and at least one driver chip configured to drive the light-emitting device. A first side of the rectangular planar shape is perpendicular to a second side of the rectangular planar shape, a first length of the first side is about 1.1 times to about 100 times a second length of the second side, and a thickness of the light-emitting device is less than about $\frac{1}{10}$ the first length.

BRIEF DESCRIPTION OF THE DRAWINGS

The above, and other aspects, features and advantages will be more clearly understood from the following detailed description of example embodiments, taken in conjunction with the accompanying drawings in which:

FIGS. 7A, 7B, 7C, 7D, 7E, 7F, 7G, 7H, 7I, 7J, 7K, 7L, 7M, 7N, and 7O are cross-sectional views of a process sequence of a method of manufacturing a light-emitting device according to example embodiments;

FIGS. 8A, 8B, 8C and 8D are cross-sectional views of a light-emitting device according to example embodiments;

DETAILED DESCRIPTION

Figure 1A:
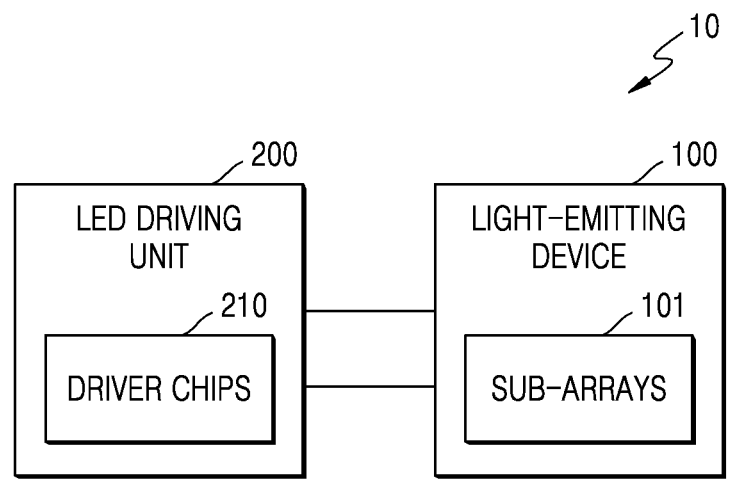
FIGS. 1A and 1B are block diagrams of configurations of a light source module according to example embodiments.

Hereinafter, example embodiments will be described in detail with reference to the accompanying drawings. The same reference numerals are used to denote the same elements in the drawings, and repeated descriptions thereof will be omitted. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present.

FIG. 1A is a block diagram of a configuration of a light source module 10 according to example embodiments.

Referring to FIG. 1A, the light source module 10 may include a light-emitting device 100 and a light-emitting diode (LED) driving unit 200.

The light-emitting device 100 may include an LED array including a plurality of light-emitting cells. According to example embodiments, the LED array included in the light-emitting device 100 may include a plurality of sub-arrays 101. Light-emitting cells (refer to LC in FIG. 3B) included in different sub-arrays 101 may be electrically insulated from each other.

The LED driving unit 200 may be connected to a power supply. The power supply may generate power required for operations of the light-emitting device 100 and provide the power to the light-emitting device 100. According to example embodiments, the light source module 10 may be a headlamp for a vehicle, and the power supply may be a battery mounted in the vehicle. According to other example embodiments, the light source module 10 may be a household or industrial lighting fixture, and the light source module 10 may further include a power supply configured to generate alternating-current (AC) power, a rectifying circuit configured to rectify the AC power, and a voltage regulating circuit.

The LED driving unit 200 may include a plurality of driver chips 210. Each of the plurality of driver chips 210 may include an integrated circuit (IC) chip.

The plurality of driver chips 210 may drive the LED array included in the light-emitting device 100. In an example embodiment, each of the plurality of driver chips 210 may be electrically connected to a corresponding one of the plurality of sub-arrays 101. Each of the plurality of driver chips 210 may control operations of light-emitting cells included in the corresponding sub-arrays 101. In an example embodiment, the number of driver chips 210 may be equal to the number of sub-arrays 101 included in the light-emitting device 100. However, example embodiments are not limited thereto. The number of driver chips 210 may be different from the number of sub-arrays 101.

Figure 1B:
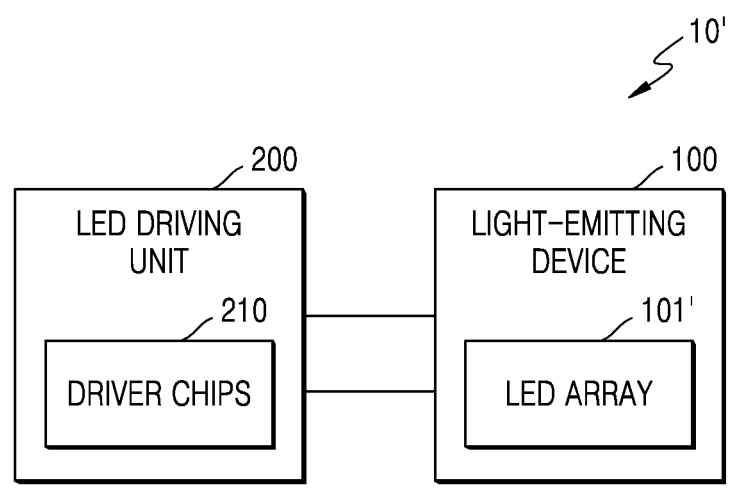

FIG. 1B is a block diagram of a configuration of a light source module 10' according to example embodiments.

The same descriptions as given with respect to FIG. 1A is omitted for brevity, and differences between the configurations of FIGS. 1A and 1B are mainly described.

Referring to FIG. 1B, light-emitting cells included in a light-emitting device 100 may constitute a single LED array 101'. The light-emitting cells included in the single LED array 101' may be directly or indirectly electrically connected to each other. Accordingly, a single driver chip 210 may be provided in the LED driving unit 200. However, example embodiments are not limited thereto. For example, a plurality of driver chips 210 may be provided in the LED driving unit 200.

Figure 2A:
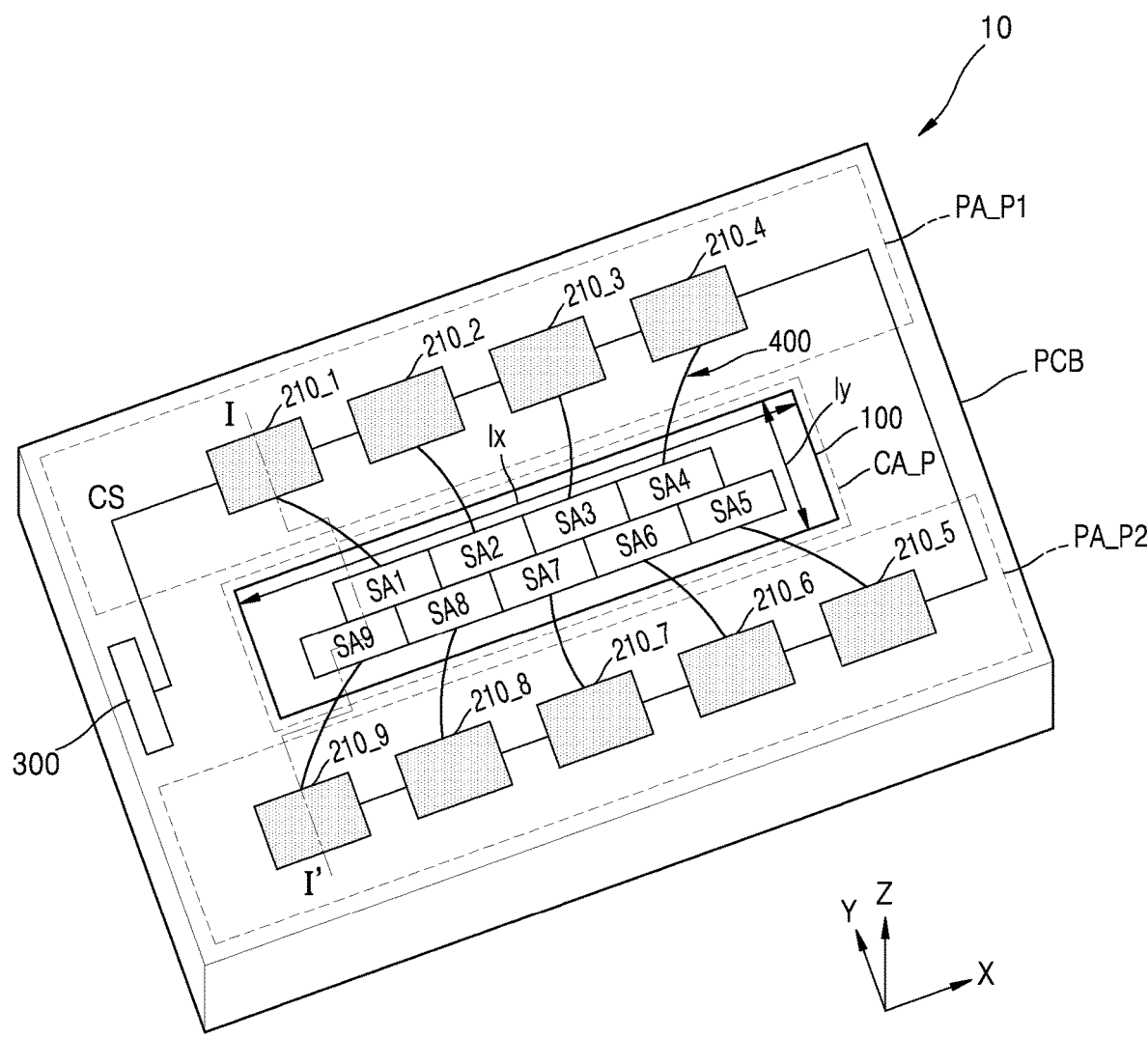
FIG. 2A is a perspective view of a configuration of a light source module according to example embodiments.

FIG. 2A is a perspective view of a configuration of a light source module 10 according to example embodiments.

Figure 2B:
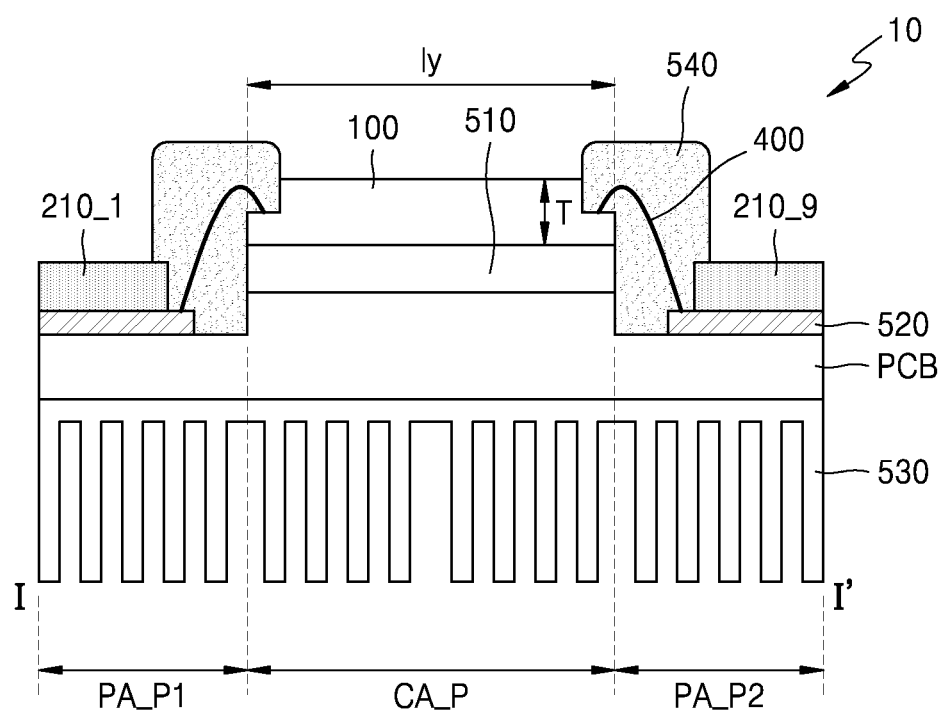
FIG. 2B is a cross-sectional view taken along line I-I' of FIG. 2A.

FIG. 2B is a cross-sectional view taken along line I-I' of FIG. 2A.

Referring to FIGS. 2A and 2B, the light source module 10 may include a light-emitting device 100 and a plurality of driver chips (e.g., first to ninth driver chips 210_1 to 210_9), which are mounted on a substrate PCB. According to some example embodiments, the light-emitting device 100 may be implemented as a single chip.

An X direction and a Y direction may correspond to two directions parallel to a top surface of the substrate PCB and perpendicular to each other, and a Z direction may correspond to a direction perpendicular to the top surface of the substrate PCB.

In a view from above, the light-emitting device 100 may substantially have a rectangular shape. A length of a first side of the rectangular shape (i.e., an X-directional length lx of the light-emitting device 100) may be greater than a length of a second side of the rectangular shape (i.e., a Y-directional length ly of the light-emitting device 100). According to example embodiments, the X-directional length lx of the light-emitting device 100 may be greater than or equal to about 1.1 times the Y-directional length ly thereof. According to example embodiments, the X-directional length lx of the light-emitting device 100 may be less than or equal to about 100 times the Y-directional length ly thereof. According to example embodiments, a thickness T (i.e., a Z-directional length) of the light-emitting device 100 may ranges from several tens of μm to several hundreds of μm. According to example embodiments, a thickness of the light-emitting device 100 may be less than or equal to about 1/10 the X-directional length lx of the light-emitting device 100. As described below, a plurality of pads (refer to 144 in FIG. 3A) may be respectively formed adjacent to edges of the light-emitting device 100, which are parallel to the X direction, that is, first sides of the rectangular shape of the light-emitting device 100. Because the light-emitting device 100 has the above-described dimensions, which are optimized for resistance to physical stress, the warpage of the light-emitting device 100 may be minimized.

The light-emitting device 100 may include an LED array in which a plurality of light-emitting cells are arranged. The LED array may be classified into a plurality of sub-arrays (e.g., first to ninth sub-arrays SA1 to SA9). Although nine sub-arrays (e.g., SA1 to SA9) are illustrated as an example in FIG. 2A, example embodiments are not limited thereto. The number and/or arrangement of sub-arrays included in the light source module 10 may vary as needed.

The first to ninth sub-arrays SA1 to SA9 may be electrically isolated from each other. That is, light-emitting cells included in different arrays may be electrically insulated from each other.

According to example embodiments, the first to ninth sub-arrays SA1 to SA9 may be arranged in two rows in the light-emitting device 100. For example, the first to fourth sub-arrays SA1 to SA4 may be arranged in a first row in regular order in the X direction, and the fifth to ninth sub-arrays SA5 to SA9 may be arranged in a second row in the reverse order in the X direction. Because the first to ninth sub-arrays SA1 to SA9 are arranged in two rows, a plurality of pads configured to connect the light-emitting device 100 to the first to ninth driver chips 210_1 to 210_9 may be easily formed.

Each of the first to ninth driver chips 210_1 to 210_9 may control operation of light-emitting cells included in a sub-array corresponding thereto. For example, the first driver chip 210_1 may be electrically connected to the first sub-array SA1 and control an operation of the first sub-array SA1. The second driver chip 210_2 may be electrically connected to the second sub-array SA2 and control an operation of the second sub-array SA2.

The light source module 10 may further include an input unit 300 configured to receive signals required for operating the light source module 10 from the outside. The first to ninth driver chips 210_1 to 210_9 may receive a control signal CS from the input unit 300 and control operations of the light-emitting device 100 based on the control signal CS. When the first to ninth driver chips 210_1 to 210_9 receive a control signal CS for allowing only the second, third, and seventh sub-arrays SA2, SA3, and SA7 in the center, from among the first to ninth sub-arrays SA1 to SA9, to emit light from the input unit 300, the second, third, and seventh driver chips 210_2, 210_3, and 210_7 may apply voltages to the second, third, and seventh sub-arrays SA2, SA3, and SA7, respectively. The first to ninth driver chips 210_1 to 210_9 may further receive driving power from the input unit 300.

Each of the first to ninth driver chips 210_1 to 210_9 may be adjacent to a corresponding one of the first to ninth sub-arrays SA1 to SA9. For example, because the first to fourth sub-arrays SA1 to SA4 are arranged in the X direction in the light-emitting device 100, the first to fourth driver chips 210_1 to 210_4 respectively corresponding to the first to fourth sub-arrays SA1 to SA4 may also be arranged in the X direction. In the light-emitting device 100, the fifth to ninth sub-arrays SA5 to SA9 may be arranged in the reverse order in the X direction, and the fifth to ninth driver chips 210_5 to 210_9 respectively corresponding to the fifth to ninth sub-arrays SA5 to SA9 may also be arranged in the reverse order in a first direction. Accordingly, the first to ninth driver chips 210_1 to 210_9 may be adjacent to the first to ninth sub-arrays SA1 to SA9 respectively corresponding thereto, and thus, the formation of wirings and/or wires configured to electrically connect the first to ninth driver chips 210_1 to 210_9 to the first to ninth sub-arrays SA1 to SA9 may be facilitated.

In an example embodiment, the number of driver chips (e.g., 210_1 to 210_9) may be equal to the number of sub-arrays (e.g., SA1 to SA9). However, example embodiments are not limited thereto. For example, at least two driver chips may be connected to one sub-array and control the one sub-array. Alternatively, one driver chip may be connected to at least two sub-arrays and control the at least two sub-arrays. For example, one driver chip that is connected to two sub-arrays may independently control the two sub-arrays.

In an example embodiment, the first to ninth driver chips 210_1 to 210_9 may be sequentially connected to each other. For example, the first driver chip 210_1 may be electrically connected to the second driver chip 210_2, the second driver chip 210_2 may be electrically connected to the first driver chip 210_1 and the third driver chip 210_3, and the third driver chip 210_3 may be electrically connected to the second driver chip 210_2 and the fourth driver chip 210_4. The first driver chip 210_1 may receive the control signal CS from the input unit 300 and transmit the control signal CS to the second driver chip 210_2, and the second driver chip 210_2 may receive the control signal CS from the first driver chip 210_1 and transmit the control signal CS to the third driver chip 210_3.

The light-emitting device 100 may be mounted on a central area CA_P of the substrate PCB, and the first to ninth driver chips 210_1 to 210_9 may be in first and second peripheral areas PA_P1 and PA_P2 of the substrate PCB adjacent the light-emitting device 100. For example, the first to fourth driver chips 210_1 to 210_4 may be in the first peripheral area PA_P1, and the fifth to ninth driver chips 210_5 to 210_9 may be in the second peripheral area PA_P2. The light-emitting device 100 may be interposed between the first to ninth driver chips 210_1 to 210_9 arranged in the first and second peripheral areas PA_P1 and PA_P2 of the substrate PCB, and thus, the formation of wirings or wires configured to electrically connect the first to ninth driver chips 210_1 to 210_9 to the first to ninth sub-arrays SA1 to SA9 may be facilitated.

In an example embodiment, the first and second peripheral areas PA_P1 and PA_P2 may extend in the X direction. The first and second peripheral areas PA_P1 and PA_P2 may be spaced apart from each other in the Y direction with the central area CA_P therebetween. In an example embodiment, the light-emitting device 100 may overlap the first to ninth driver chips 210_1 to 210_9 in a direction (e.g., the X direction or the Y direction) parallel to a top surface of the substrate PCB.

According to example embodiments, the light-emitting device 100 and the first to ninth driver chips 210_1 to 210_9 may be implemented as separate chips, and thus, the first to ninth driver chips 210_1 to 210_9 may be designed regardless of the structures of the plurality of light-emitting cells included in the light-emitting device 100. Accordingly, the first to ninth driver chips 210_1 to 210_9 may be efficiently designed.

In addition, the light-emitting device 100 may be implemented as one LED chip and in the central area CA_P of the light source module 10, and thus, light emitted from the light source module 10 may be concentrated in the central area CA_P. Because the emitted light is concentrated in the central area CA_P, the number of additional focusing components (e.g., lenses) may be reduced. Light loss may be reduced due to the reduction of the number of lenses, and thus, the light source module 10 may have high luminous efficiency.

The light-emitting device 100 and the first to ninth driver chips 210 may be mounted on the substrate PCB. The substrate PCB may be, for example, a printed circuit board. In an example, the substrate PCB may include a metal and/or a metal compound. The substrate PCB may include, for example, a metal-core printed circuit board and include copper (Cu).

In another example, the substrate PCB may be a flexible printed circuit board, which may be flexible and easily modified into various shapes. In another example, the substrate PCB may be a FR4-type printed circuit board and include a resin material including epoxy, triazine, silicon, and polyimide or a ceramic material, such as silicon nitride, aluminum nitride (AlN) and aluminum oxide ($Al_2O_3$).

A heat sink member 530 may be provided under the substrate PCB. The heat sink member 530, which is a type of heat sink, may support the substrate PCB and dissipate heat generated by the light-emitting device 100 to the outside. The heat sink member 530 may include a material (e.g., a metal) having highly thermal conductivity to improve heat dissipation efficiency.

The heat sink member 530 may have various shapes. For example, the heat sink member 530 may have a concave/convex structure including a plurality of protrusions protruding in a downward direction of the substrate PCB. However, example embodiments are not limited thereto. When the heat sink member 530 has a concave/convex structure, an area of the heat sink member 530 that is in contact with air is increased, and heat dissipation efficiency may be improved.

A bonding metal layer 510 may be on a partial region (e.g., the central area CA_P) of the substrate PCB. The bonding metal layer 510 may bond the light-emitting device 100 with the substrate PCB.

A wiring layer 520 having a metal-insulator-metal (MIM) structure may be on the first and second peripheral areas PA_P1 and PA_P2 of the substrate PCB, and the first to ninth driver chips 210_1 to 210_9 may be mounted on the wiring layer 520. According to example embodiments, a thickness of the wiring layer 520 may be in a range of about 1 μm to about 30 μm. However, example embodiments are not limited thereto.

Pads configured to connect the light-emitting device 100 to the first to ninth driver chips 210_1 to 210_9 may be formed on an emission surface through which the light-emitting device 100 emits light (e.g., a surface perpendicular to the Z direction). Each of the first to ninth driver chips 210_1 to 210_9 may be electrically connected to the light-emitting device 100 through a bonding wire 400 connected to the pads.

The bonding wire 400 may be insulated and protected by an encapsulant 540 including a material such as a resin. The encapsulant 540 may be provided between the light-emitting device 100 on the substrate PCB and the wiring layer 520. In some cases, the encapsulant 540 may be omitted.

Figure 3A:
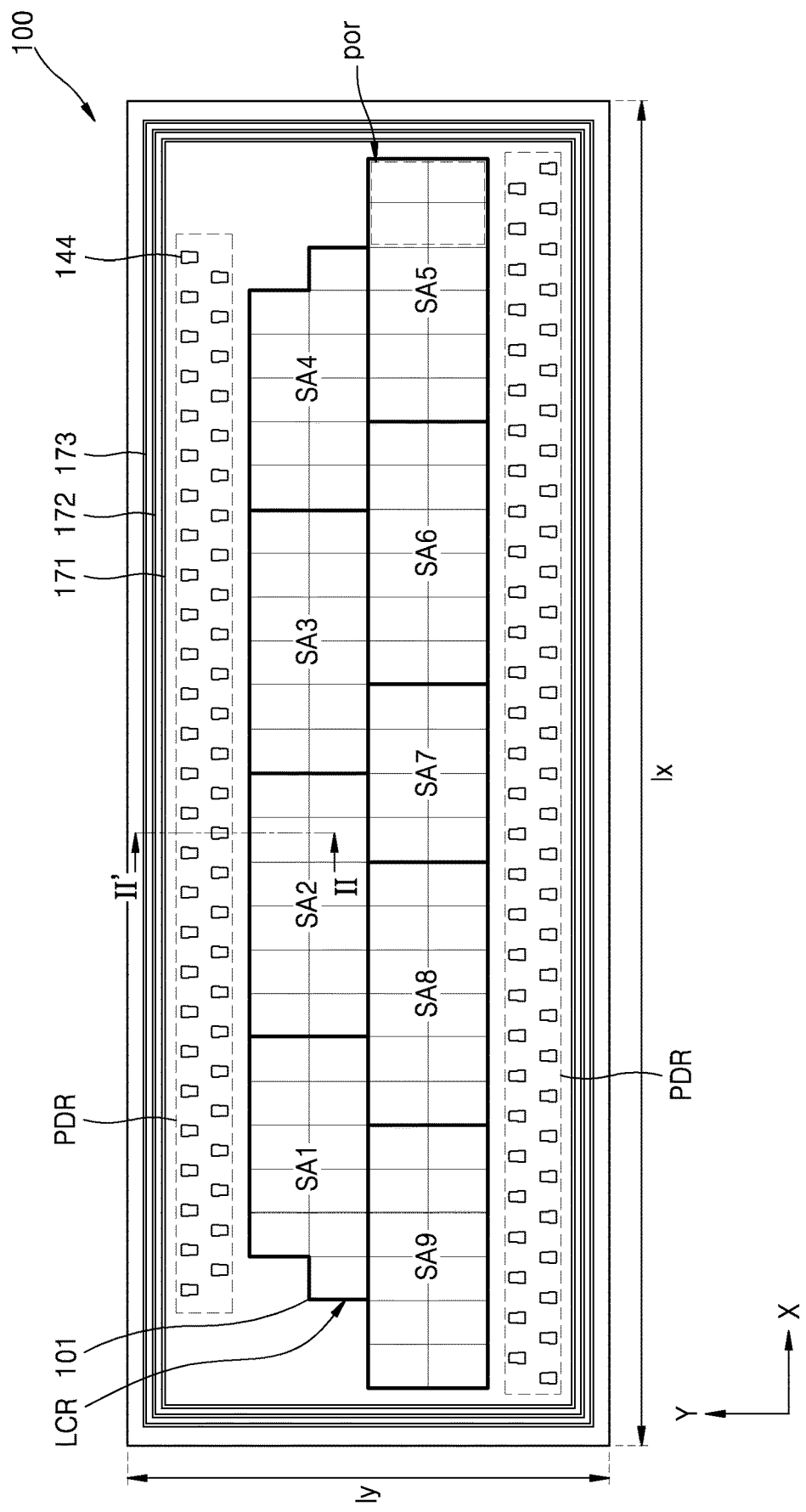
FIG. 3A is a plan view of a configuration of a light-emitting device according to example embodiments.

FIG. 3A is a plan view of a configuration of a light-emitting device 100 according to example embodiments.

Figure 3B:
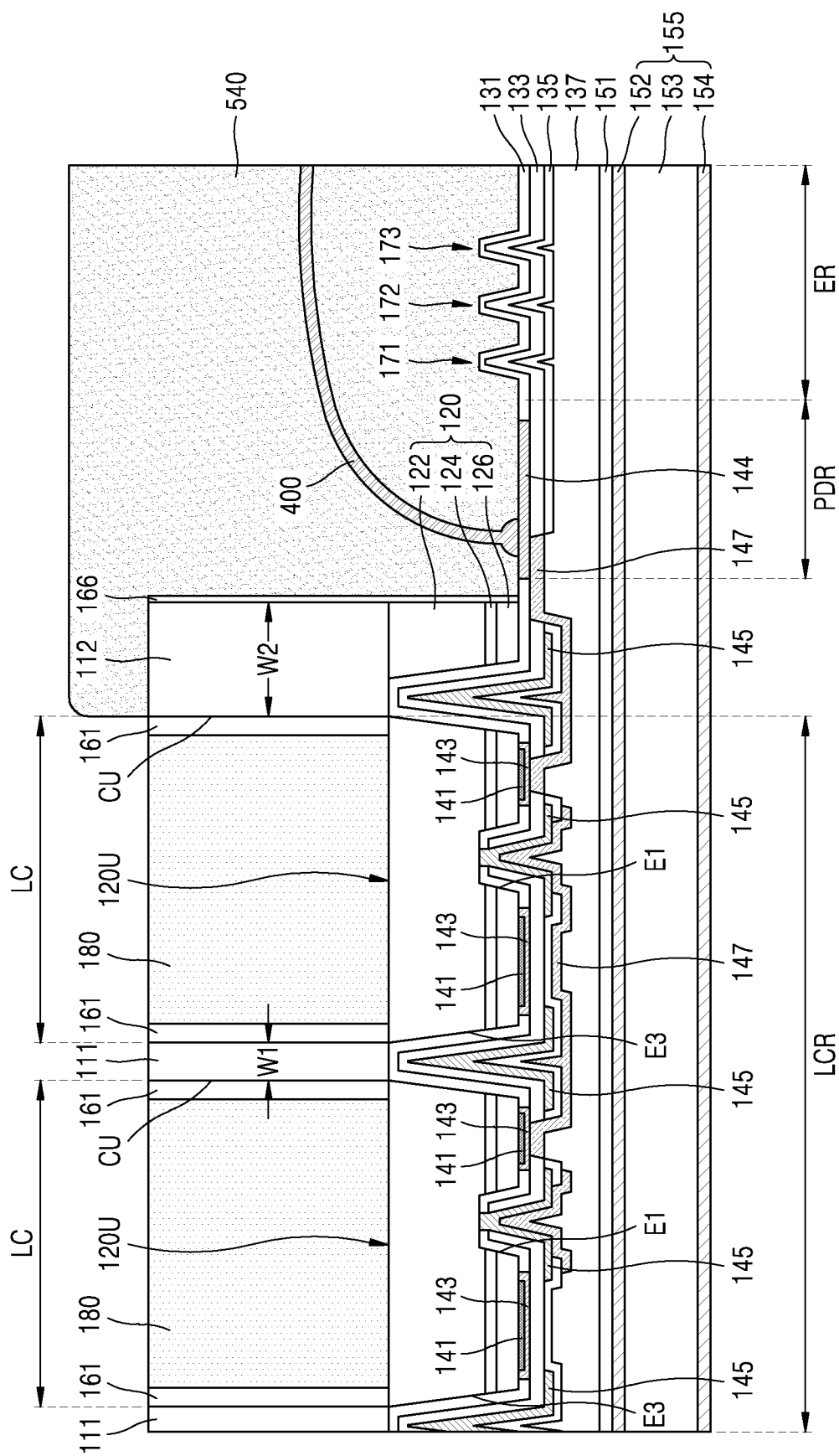
FIG. 3B is a cross-sectional view taken along line II-II' of FIG. 3A.

FIG. 3B is a cross-sectional view taken along line II-II' of FIG. 3A.

Figure 3C:
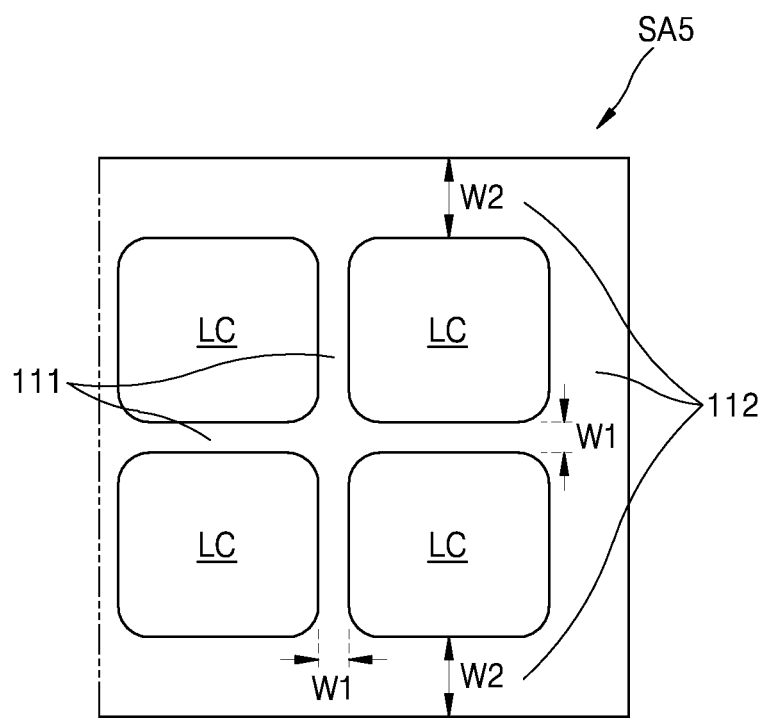
FIG. 3C is an enlarged plan view of region "por" of FIG. 3A.

FIG. 3C is a schematic plan view of region "por" of a fifth sub-array SA5 shown in FIG. 3A.

Referring to FIGS. 3A to 3C, the light-emitting device 100 may include a light-emitting cell region LCR in which a plurality of light-emitting cells LC are formed and pad regions PDR in which a plurality of pads 144 are formed. The light-emitting cell region LCR may be substantially in a central area of the light-emitting device 100. The pad regions PDR may extend in an X direction and be adjacent to edges of the light-emitting device 100. In FIG. 3A, the definitions of directions may be the same as in FIG. 2A. In the light-emitting cell region LCR of FIG. 3A, a thick solid line is used to distinguish first to ninth sub-arrays SA1 to SA9 from each other, and a thin solid line is used to distinguish light-emitting cells LC of a sub-array from each other.

The pad regions PDR may be spaced apart from each other in a Y direction with the light-emitting cell region LCR therebetween. First to third fences 171, 172, and 173 may be formed in an edge region ER, which surrounds the light-emitting cell region LCR and the pad region PDR. The second fence 172 may surround the first fence 171, and the third fence 173 may surround the second fence 172.

The first to third fences 171, 172, and 173 may respectively include first to third insulating layers 131, 133, and 135. The first to third fences 171, 172, and 173 may further include a buried insulating layer 137. The first to third insulating layers 131, 133, and 135 may include protruding structures of the first to third fences 171, 172, and 173 in a Z direction. Widths of the first to third fences 171, 172, and 173 may decrease in a direction away from a support structure 155.

According to example embodiments, top surfaces of the first to third fences 171, 172, and 173 may be at a higher level than a top surface of an active layer 124. According to example embodiments, the top surfaces of the first to third fences 171, 172, and 173 may be at substantially the same level as a top surface of the first insulating layer 131 in first etched units E1.

Due to the formation of the first to third fences 171, 172, and 173, a thickness of the light-emitting device 100 in the edge region ER may be increased, and a resistance of the light-emitting device 100 to external impact may be improved. As a result, during a process of manufacturing the light-emitting device 100, after at least two light-emitting devices 100 are formed on a growth substrate, when each of the light-emitting devices 100 is individualized using a dicing process, the first to third fences 171, 172, and 173 may prevent breakage from propagating to the light-emitting cell region LCR and the pad region PDR.

According to example embodiments, a plurality of sub-arrays (e.g., the first to ninth sub-arrays SA1 to SA9) may have different sizes. According to example embodiments, the first to ninth sub-arrays SA1 to SA9 may include different numbers of light-emitting cells LC. For example, each of the first and fourth sub-arrays SA1 and SA4 may include eleven light-emitting cells LC, each of the second, third, fifth, sixth, eighth, and ninth sub-arrays SA2, SA3, SA5, SA6, SA8, and SA9 may include twelve light-emitting cells LC, and the seventh sub-array SA7 may include eight light-emitting cells LC. However, example embodiments are not limited thereto. The light-emitting cells LC may be arranged in a matrix form in the X and Y directions.

Light-emitting cells included in each of the first to seventh sub-arrays SA1 to SA7 may be provided in various numbers in the light-emitting device 100 according to the example embodiments, and thus, the light-emitting cells may be arranged to correspond to a light distribution type of a product provided with the light-emitting device 100. In an example embodiment, the light-emitting device 100 may include the seventh sub-array SA7, which is substantially in the center of the light-emitting cell region LCR and includes a smaller number of light-emitting cells than other sub-arrays. When the light-emitting device 100 is used for a light source module of a lighting apparatus for a vehicle, the light source module including the light-emitting device 100 may need to irradiate light having a relatively high light intensity to a central area in front of a user in a direction in which the user travels. Accordingly, it may be required to supply a relatively large current to a sub-array (e.g., the seventh sub-array SA7) in the center of the light-emitting cell region LCR. According to example embodiments, because the seventh sub-array SA7 substantially in the center of the light-emitting cell region LCR includes a relatively small number of light-emitting cells LC, even when the relatively large current is applied to the seventh sub-array SA7, the total power consumption by the seventh sub-array SA7 may be reduced because the seventh cell block BLK7 includes fewer light-emitting cells.

Alternately, in an example embodiment, the light-emitting device 100 may include the first and fourth sub-arrays SA1 and SA4, which are at outer portions of the light-emitting cell region LCR and include a smaller number of light-emitting cells than other sub-arrays. When the light-emitting device 100 is used for a light source module of a lighting apparatus for a vehicle, the light-emitting device 100 may have a low need to irradiate light to upper outer areas in front of a user in a direction in which the user travels. The number of light-emitting cells LC included in each of the first and fourth sub-arrays SA1 and SA4 at the outer portion of the light-emitting cell region LCR may be adjusted to be less than the number of light-emitting cells LC included in each of other sub-arrays (i.e., second, third, fifth, sixth, eighth, and ninth sub-arrays SA2, SA3, SA5, SA6, SA8, and SA9), and thus, the light source module including the light-emitting device 100 may not irradiate light to unnecessary areas.

The pad regions PDR and the light-emitting cell region LCR may be spaced apart from each other in a lateral direction and may not overlap each other in the Z direction. Because the light-emitting device 100 includes the pad region PDR and the light-emitting cell region LCR, which are spaced apart from each other in the lateral direction, the density of light-emitting cells LC may be increased in the light-emitting cell region LCR. Furthermore, the plurality of pads 144 may be in the pad region PDR adjacent to an edge of the light-emitting device 100, and thus, the formation of a bonding wire 400 configured to connect driver chips to the plurality of pads 144 may be facilitated. Although FIG. 3A illustrates an example in which the plurality of pads 144 are arranged in zigzag in two rows in each of the pad regions PDR, example embodiments are not limited thereto. For example, a plurality of pads may be arranged in one row.

In some example embodiments, in a plan view, the light-emitting cell region LCR may take up more than half of the total area of the light-emitting device 100. For example, a planar area of the light-emitting cell region LCR may be in a range of about 50% to about 90% of the total planar area of the light-emitting device 100.

A plurality of light-emitting cells LC may be arranged in a matrix form in the light-emitting cell region LCR. Each of the light-emitting cells LC may include unit light-emitting devices 120U. Each of the plurality of light-emitting cells LC may be included in one of the first to ninth sub-arrays SA1 to SA9. Each of the plurality of light-emitting cells LC may have an X-directional length or Y-directional length of about 10 μm to several mm. However, example embodiments are not limited thereto.

The pads 144 may be arranged in the pad region PDR. The pads 144 may be electrically connected to at least one of the unit light-emitting devices 120U.

First and second partition walls 111 and 112 may be disposed on the unit light-emitting devices 120U. The first and second partition walls 111 and 112 may surround each of the plurality of unit light-emitting devices 120U in a plan view. Although the first and second partition walls 111 and 112 are referred to as separate components for brevity, the first and second partition walls 111 and 112 may form a single continuous structure. However, example embodiments are not limited thereto, and the first and second partition walls 111 and 112 may be separated from each other. According to example embodiments, each of the first and second partition walls 111 and 112 may include any one of silicon (Si), silicon carbide (SiC), sapphire (crystallized $Al_2O_3$), and gallium nitride (GaN).

The first and second partition walls 111 and 112 may have round corner shapes such that a top surface of each of the light-emitting cells LC has a rectangular shape with round corners. Accordingly, cracks may be prevented from being formed in the first and second partition walls 111 and 112, and thus, the reliability of the light-emitting device 100 may be improved.

The first partition wall 111 may extend between the plurality of light-emitting cells LC in the light-emitting cell region LCR to distinguish (i.e., separate) the plurality of light-emitting cells LC from each other. The second partition wall 112 may extend along a periphery of the light-emitting cell region LCR. In a view from above, the second partition wall 112 may surround the first partition wall 111. A first width W1, which is a width of the first partition wall 111 in a lateral direction (e.g., a Y direction), may be less than a second width W2, which is a width of the second partition wall 112 in the lateral direction (e.g., the Y direction). For example, the first width W1 may range from about 10 μm to about 100 μm, and the second width W2 may range from about 10 μm to about 1 mm. According to example embodiments, because the second partition wall 112 having a relatively great width is along the periphery of the light-emitting cell region LCR, the structural stability of the light-emitting device 100 may be improved. When the light-emitting device 100 is used as, for example, a light source of a headlamp for a vehicle, a resistance to external impact may be increased due to the first and second partition walls 111 and 112, and thus, the reliability of the light-emitting device 100 may be improved.

A plurality of cell spaces CU may be defined by the first and second partition walls 111 and 112. The first and second partition walls 111 and 112 may vertically overlap third etched units E3. Bottom surfaces of the first and second partition walls 111 and 112 may be in contact with the top surface of the first insulating layer 131.

A reflective layer 161 may be disposed on sidewalls of the first and second partition walls 111 and 112. The reflective layer 161 may reflect light emitted from a plurality of unit light-emitting devices 120U. The reflective layer 161 may be formed on both sidewalls of the first partition wall 111 and a sidewall of the second partition wall 112, which faces the cell space CU. An insulating liner 166 may be formed on a sidewall of the second partition wall 112, which faces the pad region PDR. For example, the insulating liner 166 may include silicon oxide, silicon nitride, silicon oxynitride, and/or aluminum oxide.

In example embodiments, the reflective layer 161 may include a metal layer including silver (Ag), aluminum (Al), nickel (Ni), chromium (Cr), gold (Au), platinum (Pt), palladium (Pd), tin (Sn), tungsten (W), rhodium (Rh), iridium (Ir), ruthenium (Ru), magnesium (Mg), zinc (Zn), or a combination thereof. In other example embodiments, the reflective layer 161 may include a resin layer (e.g., a polyphthalamide (PPA) layer) containing a metal oxide, such as titanium oxide or aluminum oxide. In other example embodiments, the reflective layer 161 may include a distributed Bragg reflector (DBR) layer. For example, the DBR layer may have a structure in which a plurality of insulating films having different refractive indexes are repeatedly stacked several to several hundred times. Each of the insulating films in the DBR layer may include oxide, nitride, or a combination thereof, for example, $SiO_2$, SiN, $SiO_xN_y$, $TiO_2$, $Si_3N_4$, $Al_2O_3$, TiN, AlN, $ZrO_2$, TiAlN, or TiSiN.

According to example embodiments, the first and second partition walls 111 and 112 and the reflective layer 161 may prevent the absorption of light emitted from one light-emitting cell LC into an adjacent light-emitting cell LC (hereinafter, referred to as 'inter-cell interference'). Thus, contrast characteristics of the light-emitting device 100 may be improved. Also, the unit light-emitting devices 120U may be completely separated from each other by the third etched units E3, and thus, inter-cell interference may be prevented, and the contrast characteristics of the light-emitting device 100 may be improved.

A fluorescent layer 180 may be provided in the plurality of cell spaces CU on top surfaces of the plurality of unit light-emitting devices 120U. As shown in FIG. 3B, the fluorescent layer 180 may substantially completely fill the plurality of cell spaces CU. A top surface of the fluorescent layer 180 may be at the same level as top surfaces of the first and second partition walls 111 and 112. The top surface of the fluorescent layer 180 may be substantially planar or have concave/convex portions.

The plurality of fluorescent layers 180 may convert color (i.e., wavelength) of light emitted from the plurality of unit light-emitting devices 120U into a desired color (i.e., wavelength). The plurality of fluorescent layers 180 may include a resin containing a phosphor dispersed therein or a film containing a phosphor. For example, the plurality of fluorescent layers 180 may include a phosphor film in which phosphor particles are uniformly dispersed at a certain concentration. The phosphor particles may be a wavelength conversion material that changes the wavelength of light emitted from the plurality of unit light-emitting devices 120U. To improve the density and color uniformity of the phosphor particles, the fluorescent layer 180 may include at least two kinds of phosphor particles having different size distributions.

In an example embodiment, the phosphor may have various colors and various compositions such as an oxide-based composition, a silicate-based composition, a nitride-based composition, and a fluoride-based composition. For example, $\beta$-SiAlON:$Eu^{2+}$(green), (Ca, Sr)AlSiN$_3$:$Eu^{2+}$(red), La$_3$Si$_6$N$_{11}$:$Ce^{3+}$(yellow), K$_2$SiF$_6$:$Mn_4^+$(red), SrLiAl$_3$N$_4$:Eu (red), Ln$_{4-x}$(EuzM$_{1-z}$)$_x$Si$_{12-y}$Al$_y$O$_{3+x+y}$N$_{18-x-y}$($0.5 \leq x \leq 3$, $0 < z < 0.3$, $0 < y \leq 4$)(red), K$_2$TiF$_6$:$Mn_4^+$(red), NaYF$_4$:$Mn_4^+$ (red), NaGdF$_4$:$Mn_4^+$(red), and the like may be used as the phosphor. However, the kind of the fluorescent material is not limited thereto.

In an example embodiment, a wavelength conversion material such as a quantum dot may be further over the fluorescent layer 180. The quantum dot may have a core-shell structure using a III-V or II-VI compound semiconductor. For example, the quantum dot may have a core such as CdSe and InP and a shell such as ZnS and ZnSe. In addition, the quantum dot may include a ligand for stabilizing the core and the shell.

The fluorescent layers 180 may include the same material. However, example embodiments are not limited thereto. The fluorescent layers 180 in some of the plurality of cell spaces CU may include different materials from the fluorescent layers 180 in other cell spaces CU.

In some cases, unlike that shown in FIG. 3B, the reflective layer 161 on the first and second partition walls 111 and 112 may be omitted. In this case, the sidewall of the first partition wall 111 and the sidewall of the second partition wall 112 may be in direct contact with the fluorescent layer 180.

A stack structure 120 may include a first conductive semiconductor layer 122, the active layer 124, and a second conductive semiconductor layer 126, which are sequentially stacked. The first conductive semiconductor layer 122, the active layer 124, and the second conductive semiconductor layer 126, which are in each of the light-emitting cells LC of the light-emitting cell region LCR, may constitute the unit light-emitting devices 120U. The unit light-emitting devices 120U may include first etched units E1, which expose a bottom surface of the first conductive semiconductor layer 122, a side surface of the active layer 124, and a side surface of the second conductive semiconductor layer 126. By forming the first etched units E1, a component (e.g., a reflective electrode 145) electrically connected to the first conductive semiconductor layer 122 may be formed.

Unit light-emitting devices 120U corresponding to different light-emitting cells LC may be separated from each other by the third etched units E3. As described below, because the third etched units E3 are formed by removing portions of the stack structure 120, a plurality of unit light-emitting devices 120U spaced apart from each other in a lateral direction may be formed in the light-emitting cell region LCR. A portion of the stack structure 120, which may not operate as the unit light-emitting device 120U, may remain in the pad region PDR. The portion of the stack structure 120, which may not operate as the unit light-emitting device 120U, may be interposed between the support structure 155 and the second partition wall 112 and surround the plurality of unit light-emitting devices 120U in plan view.

The first conductive semiconductor layer 122 may be an n-type conductive nitride semiconductor layer. The first conductive semiconductor layer 122 may include a material, which satisfies a formula of In$_x$Al$_y$Ga$_{(1-x-y)}$N ($0 \leq x < 1$, $0 \leq y < 1$, $0 \leq x+y < 1$), and be doped with n-type impurities, such as silicon.

In an example embodiment, the first conductive semiconductor layer 122 may include a first conductive semiconductor contact layer and a current diffusion layer. An impurity concentration of the first conductive semiconductor contact layer may be in a range of $2 \times 10^{18}$ cm$^{-3}$ to $9 \times 10^{19}$ cm$^{-3}$. A thickness of the first conductive semiconductor contact layer may be about 1 μm to about 5 μm. The current diffusion layer may have a structure in which a plurality of In$_x$Al$_y$Ga$_{(1-x-y)}$N layers (where $0 \leq x$, $y \leq 1$, and $0 \leq x+y \leq 1$) having different compositions or different impurity contents are alternately stacked. The current diffusion layer may have an n-type superlattice structure in which n-type GaN layers and/or Al$_x$In$_y$Ga$_z$N layers (where $0 \leq x,y,z \leq 1$ and $x+y+z \neq 0$) each having a thickness of about 1 nm to about 500 nm are alternately stacked. An impurity concentration of the current diffusion layer may be in a range of $2 \times 10^{18}$ cm$^{-3}$ to $9 \times 10^{19}$ cm$^{-3}$.

The active layer 124 may be interposed between the first conductive semiconductor layer 122 and the second conductive semiconductor layer 126 and emit light having some energy by recombination of electrons and holes. The active layer 124 may have a multiple quantum well (MQW) structure in which quantum well layers and quantum barrier layers are alternately stacked. For example, each of the quantum well layers and each of the quantum barrier layers may include In$_x$Al$_y$Ga$_{(1-x-y)}$N layers (where $0 \leq x$, $y \leq 1$, and $0 \leq x+y \leq 1$) having different compositions. For example, the quantum well layer may include In$_x$Ga$_{1-x}$N (where $0 \leq x \leq 1$), and the quantum barrier layer may include GaN or AlGaN. A thickness of each of the quantum well layer and the quantum barrier layer may be in a range of about 1 nm to about 50 nm. The active layer 124 is not limited to having the MQW structure and may have a single quantum well structure.

The first conductive semiconductor layer 122 may be a p-type conductive nitride semiconductor layer. The second conductive semiconductor layer 126 may include a material, which satisfies a formula of p-type $In_xAl_yGa_{(1-x-y)}N$ ($0 \leq x < 1$, $0 \leq y < 1$, $0 \leq x+y < 1$), and be doped with p-type impurities, for example, magnesium (Mg).

In an example embodiment, the second conductive semiconductor layer 126 may include an electron blocking layer, a p-type lightly doped GaN layer, and a p-type heavily doped GaN layer provided as a contact layer. For example, the electron blocking layer may have a structure in which a plurality of $In_xAl_yGa_{(1-x-y)}N$ layers (where $0 \leq x$, $y \leq 1$, and $0 \leq x+y \leq 1$) having a thickness of about 5 nm to about 100 nm and having different compositions or different impurity contents are alternately stacked, or may include a single layer including $Al_yGa_{(1-y)}N$ (where $0 < y \leq 1$). An energy bandgap of the electron blocking layer may decrease in a direction away from the active layer 124. For example, an aluminum (Al) content of the electron blocking layer may decrease in a direction away from the active layer 124.

The light-emitting device 100 may further include first to third insulating layers 131, 133, and 135, a buried insulating layer 137, a support structure 155, an adhesive layer 151, a first electrode 141, a cover electrode 142, a reflective electrode 145, and an interconnection electrode 147, which are on the unit light-emitting devices 120U.

The first insulating layer 131 may cover a bottom surface and a sidewall of each of the unit light-emitting devices 120U. Accordingly, adjacent unit light-emitting devices 120U may be prevented from being directly electrically connected to each other. The first insulating layer 131 may partially expose the bottom surface of the second conductive semiconductor layer 126. The first to third insulating layers 131, 133, and 135 may include, for example, silicon oxide, silicon nitride, or silicon oxynitride. However, example embodiments are not limited thereto.

The first electrode 141 may be in contact with the bottom surface of the second conductive semiconductor layer 126, which is exposed by the first insulating layer 131. Here, the bottom surface of the second conductive semiconductor layer 126 may refer to a surface opposite to a surface of the second conductive semiconductor layer 126, which faces the first conductive semiconductor layer 122. The first electrode 141 and a cover electrode 143, the reflective electrode 145, and an interconnection electrode 147, which will be described below, may include Ag, Al, Ni, Ti, Cr, Au, Pt, Pd, Sn, W, Rh, Ir, Ru, Mg, Zn, or a combination thereof.

The cover electrode 143 may be disposed on the first electrode 141. The cover electrode 143 may include a multilayer metal structure. The pads 144 may be formed at the same level as the cover electrode 143 and include the same material as the cover electrode 143. However, example embodiments are not limited thereto.

The second insulating layer 133 may be disposed on the cover electrode 143 and the pads 144. Thus, the second insulating layer 133 may electrically insulate the cover electrode 143 from the reflective electrode 145 described below.

The reflective electrode 145 may include a material having a high reflectivity. The reflective electrode 145 may cover a wide portion of the second insulating layer 133 and reflect light emitted from the unit light-emitting device 120U toward the fluorescent layer 180, and thus, the optical efficiency of the light-emitting device 100 may be improved. The reflective electrode 145 may be electrically connected to the first conductive semiconductor layer 122, which is exposed by not being covered by the first and second insulating layers 131 and 133.

The third insulating layer 135 may cover the second insulating layer 133 and the reflective electrode 145. The third insulating layer 135 may prevent unintended electrical connection between the interconnection electrode 147 and the reflective electrode 145.

The interconnection electrode 147 may connect the unit light-emitting devices 120U to the pads 144, respectively. The interconnection electrode 147 may connect the unit light-emitting device 120U of the preceding light-emitting cell LC to the unit light-emitting device 120U of the following light-emitting cell LC in each of the first to ninth sub-arrays SA1 to SA9. For example, in FIG. 3B, the interconnection electrode 147 may connect the first conductive semiconductor layer 122 of the unit light-emitting device 120U on the right side of the drawing to the second conductive semiconductor layer 126 of the unit light-emitting device 120U on the left side of the drawing. A connection relationship between the unit light-emitting devices 120U and the pads 144 and a connection relationship between the unit light-emitting devices 120U will be described below with reference to FIGS. 5A to 6B.

The buried insulating layer 137 may be on the third insulating layer 135 and the interconnection electrode 147. A bottom surface of the buried insulating layer 137 may be a substantially planar surface. However, example embodiments are not limited thereto. The buried insulating layer 137 may include a silicon resin, an epoxy resin, or an acrylic resin.

The support structure 155 may be on the buried insulating layer 137. The support structure 155 may be combined with the buried insulating layer 137 by the adhesive layer 151. According to example embodiments, the adhesive layer 151 may include an electrically insulating material, for example, silicon oxide, silicon nitride, a polymer such as an ultraviolet (UV)-curing material, or resins. In example embodiments, the adhesive layer 151 and the buried insulating layer 137 may include the same material or constitute a single continuous layer. In an example embodiment, the adhesive layer 151 may include a eutectic adhesive material, such as AuSn or NiSi. The support structure 155 may include a sapphire substrate, a glass substrate, a transparent conductive substrate, a silicon substrate, or a silicon carbide substrate, but example embodiments are not limited thereto.

The support structure 155 may include a support substrate 153 and an upper insulating film 152 and a lower insulating film 154, which cover both surfaces of the support substrate 153. The upper insulating film 152 may cover a first surface of the support substrate 153, which faces a wiring structure 140, and the lower insulating film 154 may cover a second surface of the support substrate 153, which faces a printed circuit board PCB. The upper insulating film 152 may be spaced apart from the wiring structure 140 with a first adhesive layer 156 therebetween in a vertical direction (Z direction). In example embodiments, the upper insulating film 152 may be in contact with the first surface of the support substrate 153, and the lower insulating film 154 may be in contact with the second surface of the support substrate 153. However, example embodiments are not limited thereto. For example, at least one middle film may be interposed between the upper insulating film 152 and the support substrate 153 and/or between the lower insulating film 154 and the support substrate 153. The at least one middle film may include an insulating material, a semiconductor material, a conductive material, or a combination thereof.

The support substrate 153 may include an insulating substrate or a conductive substrate. In example embodiments, the support substrate 153 may have an electric resistance of at least several MΩ for example, at least 50 MΩ. The greater the electrical resistance of the support substrate 153, the better electrical insulating characteristics of the support structure 155. For example, the support substrate 153 may include doped silicon, undoped silicon, $Al_2O_3$, tungsten (W), copper (Cu), a bismaleimide triazine (BT) resin, an epoxy resin, polyimide, a liquid crystal (LC) polymer, a copper clad laminate, or a combination thereof, but example embodiments are not limited thereto.

In example embodiments, the support substrate 153 may have a thickness of at least 150 μm (e.g., about 200 μm to about 400 μm) in a vertical direction (i.e., a Z direction). When the support substrate 153 has an excessively small thickness, emission characteristics of the light source module 100 may be adversely affected. For example, the warpage of the support substrate 153 may occur, and thus, a pitch between the plurality of light-emitting cells CL may be undesirably changed. When the support substrate 153 has an excessively great thickness, components around the support substrate 153 may be deformed due to stress caused by the support substrate 153.

Each of the upper insulating film 152 and the lower insulating film 154 may have an electric resistance of at least several tens of MΩ for example, at least 50 MΩ. The greater the electrical resistance of each of the upper insulating film 152 and the lower insulating film 154, the better electrical insulating characteristics of the support structure 155. For example, each of the upper insulating film 152 and the lower insulating film 154 may include $SiO_2$, $Si_3N_4$, $Al_2O_3$, $HfSiO_4$, $Y_2O_3$, $ZrSiO_4$, $HfO_2$, $ZrO_2$, $Ta_2O_5$, $La_2O_3$, or a combination thereof, but example embodiments are not limited to the materials described above. In example embodiments, the upper insulating film 152 may include the same material as the lower insulating film 154. In other example embodiments, the upper insulating film 152 and the lower insulating film 154 may include different materials.

In example embodiments, each of the upper insulating film 152 and the lower insulating film 154 may have a thickness of several nm to several tens of μm in the vertical direction (Z direction). For instance, each of the upper insulating film 152 and the lower insulating film 154 may have a thickness of about 100 nm to about 1000 nm in the vertical direction (Z direction). When the upper insulating film 152 and the lower insulating film 154 have excessively small thicknesses, withstanding voltage characteristics of the support structure 155 may be degraded. Thus, it may be difficult to obtain desired insulating characteristics between a substrate (refer to PCB in FIG. 2A) and the support substrate 153 or between the wiring structure 140 and the printed circuit board PCB when the support structure 155 is mounted in a package. When the upper insulating film 152 and the lower insulating film 154 have excessively great thicknesses, the warpage of the support substrate 153 may worsen due to stress caused by the upper insulating film 152 and the lower insulating film 154, thereby adversely affecting emission characteristics.

According to example embodiments, by providing an adhesive layer between the support structure 155 and the substrate PCB, the light-emitting device 100 may be mounted on the substrate PCB.

The bonding wire 400 may be connected to the pad 144, and the light-emitting device 100 may be connected to driver chips (refer to 210_1 to 210_9 in FIG. 2A) through the bonding wire 400.

An encapsulant 540 configured to protect the bonding wire 400 may cover an upper portion of the second partition wall 112, the pad region PDR, and the edge region ER. Thus, the bonding wire 400 and the first to third fences 171, 172, and 173 may be covered by the encapsulant 540.

Figure 4A:
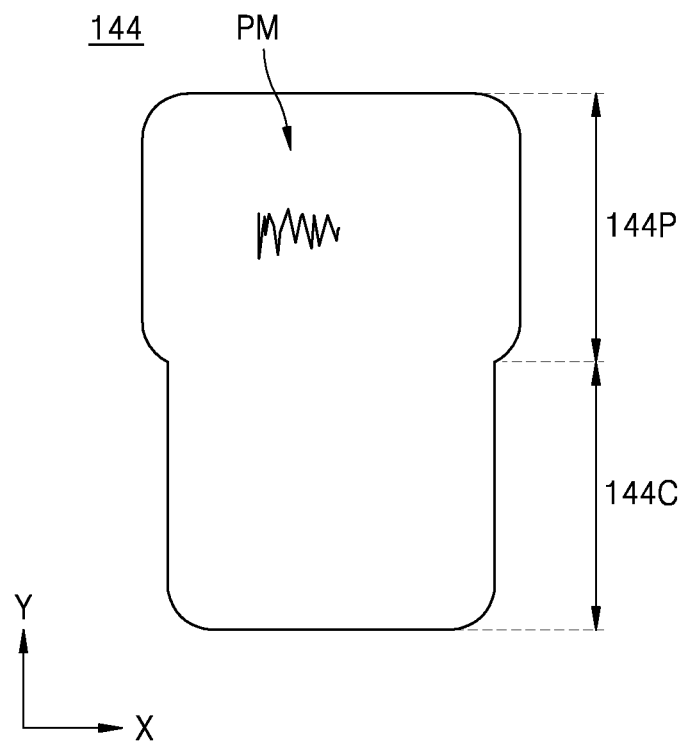
FIGS. 4A, 4B, 4C and 4D are diagrams of pads included in a light-emitting device according to example embodiments.

FIG. 4A is a plan view of a pad 144 included in a light-emitting device 100 according to example embodiments.

Referring to FIGS. 3B and 4A, the pad 144 may include a probe contact portion 144P and a current injection portion 144C.

The probe contact portion 144P may be a portion configured to contact a probe during an inspection of the light-emitting device 100. For example, the inspection may be performed after unit light-emitting devices 120U are formed and before the light-emitting device 100 is mounted on a package substrate. Defects in the unit light-emitting devices 120U may be inspected using the probe contact portion 144P, and characteristics of the unit light-emitting devices 120U may be checked, and thus, an operating current of each of the unit light-emitting devices 120U may be corrected to compensate for a tolerance.

The probe contact portion 144P may include a probe mark PM, which is a scratch mark formed by a contact of the probe contact portion 144P with the probe. Thus, an arithmetical average roughness of the current injection portion 144C may be lower than that of the probe contact portion 144P. Here, based on a center line corresponding to the average of heights of a roughness curve in a cross-section of a measured region, the arithmetical average roughness may be a value obtained by dividing the sum of areas offset from the center line by a length of the measured region.

The current injection portion 144C may be a portion into which an operating current for an operation of each of the unit light-emitting devices 120U is injected through a bonding wire 400. The bonding wire 400 may be connected to the current injection portion 144C of the pad 144. The probe mark PM may not be formed on the current injection portion 144C.

According to example embodiments, an X-directional width of the current injection portion 144C may be less than an X-directional width of the probe contact portion 144P. Thus, the probe contact portion 144P may be easily distinguished from the current injection portion 144C, and the bonding wire 400 may be connected to a portion, which is not damaged (i.e., scratched) by the probe.

Although each of the current injection portion 144C and the probe contact portion 144P is illustrated as having a rectangular shape with round corners in FIG. 4A, example embodiments are not limited thereto, and the current injection portion 144C and the probe contact portion 144P may have different shapes. For example, the current injection portion 144C may have a rectangular shape with round corners, and the probe contact portion 144P may have a substantially circular shape.

The probe mark PM formed on the probe contact portion 144P may damage a surface of the pad 144, thereby degrading current injection efficiency or causing a contact failure. According to example embodiments, the bonding wire 400 may be connected to a portion other than a portion in contact with the probe, thereby enhancing the reliability of a light-emitting device (refer to 100 in FIG. 3A).

Figure 4B:
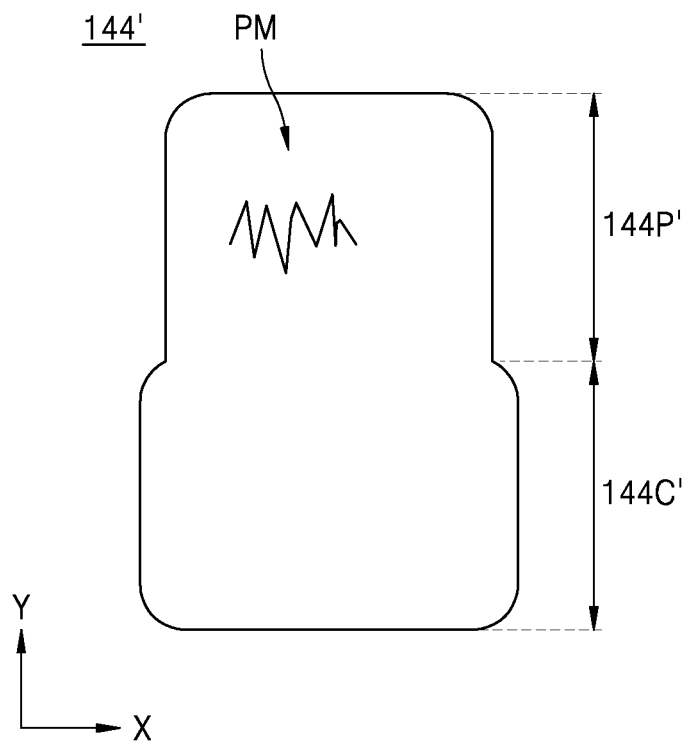

FIG. 4B is a plan view of a pad 144' included in a light-emitting device according to example embodiments.

The same descriptions as given with respect to FIG. 4A are omitted for brevity, and differences between the pads 144 and 144' of FIGS. 4A and 4B are mainly described.

Referring to FIG. 4B, unlike the illustration in FIG. 4A, an X-directional width of a current injection portion 144C' may be greater than an X-directional width of a probe contact portion 144P', and the probe contact portion 144P' may be easily distinguished from the current injection portion 144C'. Thus, a bonding wire 400 may be connected to a portion, which is not damaged by contact with a probe, thereby enhancing the electrical reliability of a light-emitting device (refer to 100 in FIG. 3A).

Figure 4C:
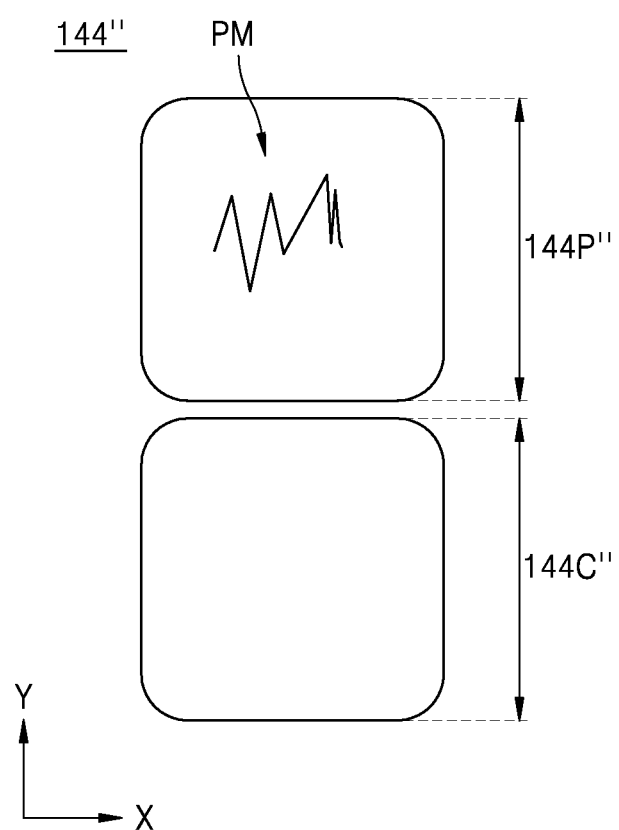
Figure 4D:
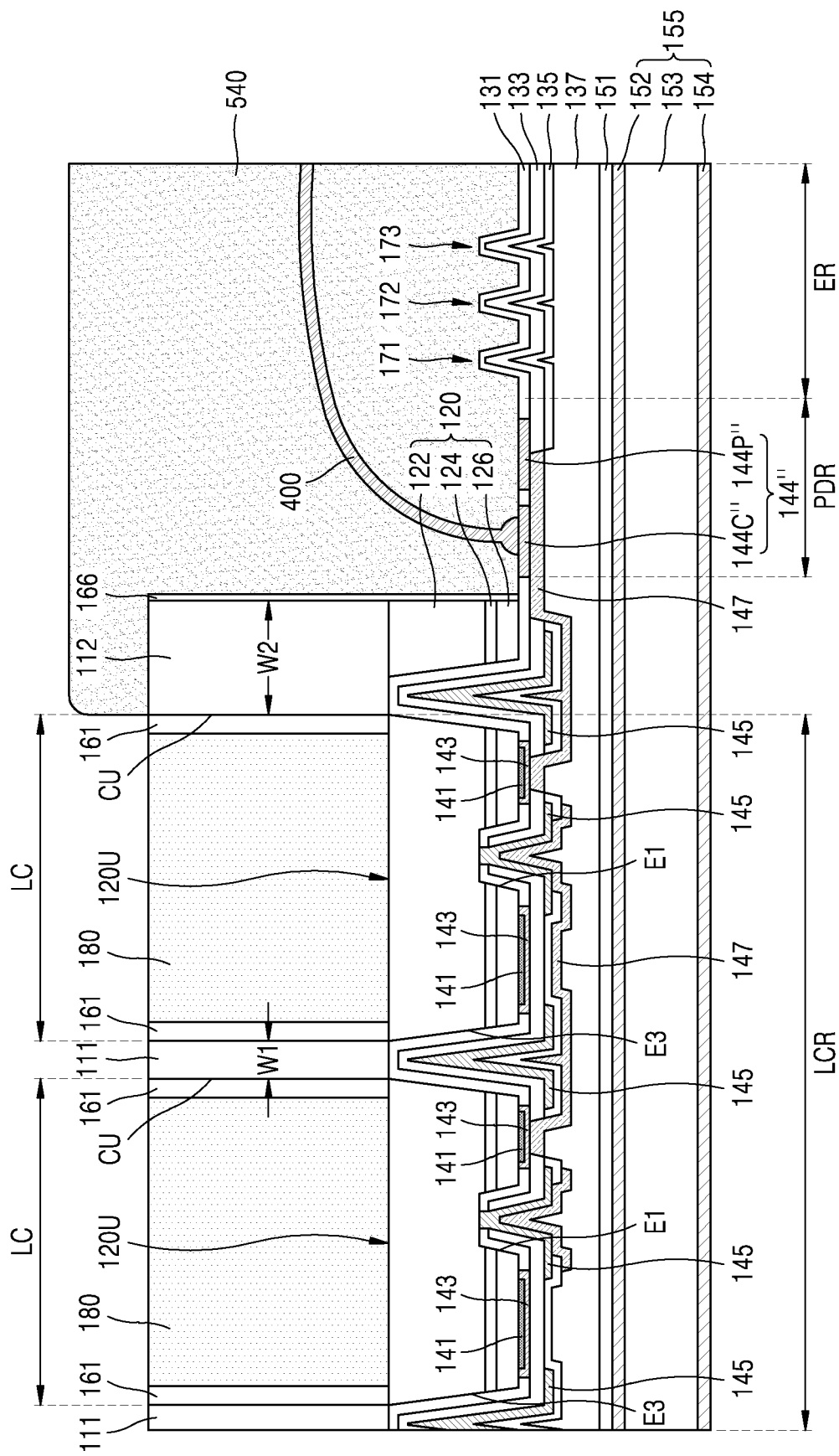

FIG. 4C is a plan view of a pad 144" included in a light-emitting device according to example embodiments. FIG. 4D is a cross-sectional view of a light-emitting device corresponding to the example embodiment shown in FIG. 4C.

The same descriptions as given with respect to FIG. 4A are omitted for brevity, and differences between the pads 144 and 144" of FIGS. 4A and 4C are mainly described.

Referring to FIGS. 4C and 4D, a probe contact portion 144P" and a current injection portion 144C" may be spaced apart from each other in a lateral direction. According to example embodiments, an interconnection electrode 147 may be connected to each of a probe contact portion 144P" and a current injection portion 144C". Accordingly, the probe contact portion 144P" and the current injection portion 144C" may have substantially the same electric potential.

According to example embodiments, because the probe contact portion 144P" and the current injection portion 144C" are separated from each other, the probe contact portion 144P' and the current injection portion 144C' may be easily distinguished from each other. Thus, a bonding wire 400 may be connected to a portion that is not damaged by contacting with a probe, thereby enhancing the electrical reliability of a light-emitting device (refer to 100 in FIG. 3A).

Figure 5A:
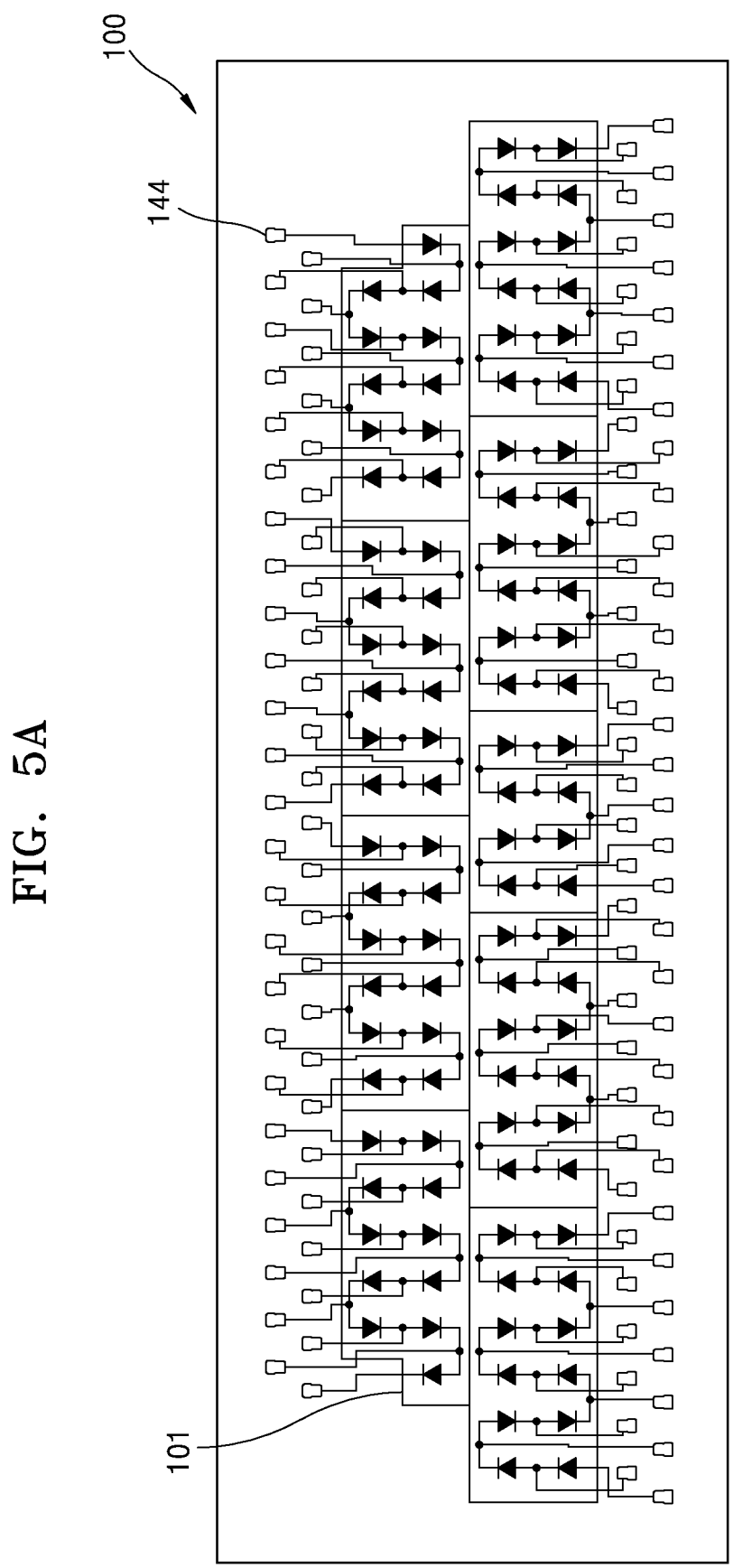
FIGS. 5A, 5B, 6A and 6B are circuit diagrams showing connection relationships between unit light-emitting devices and pads, which are included in light-emitting devices according to example embodiments.
Figure 5B:
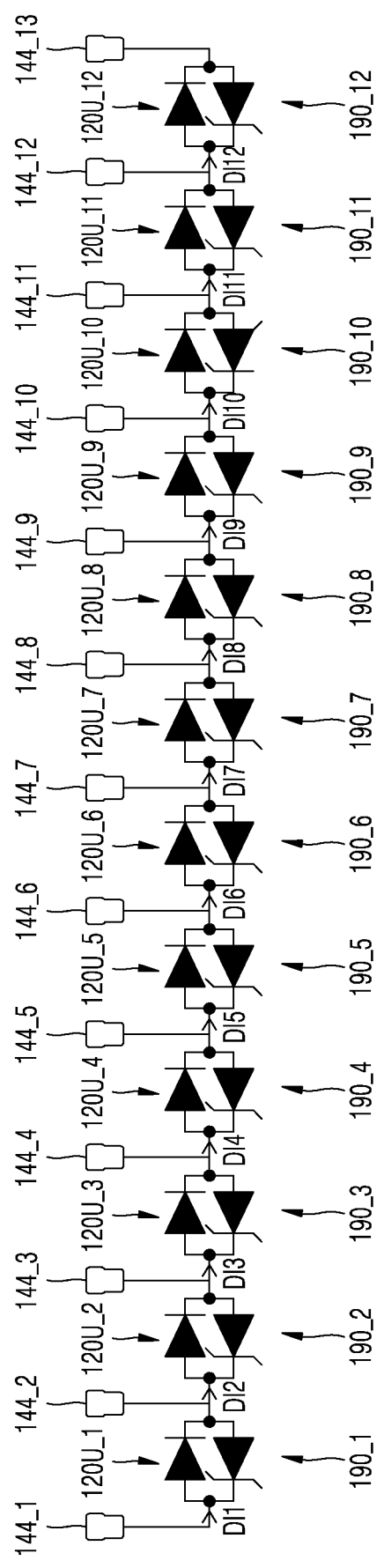

FIG. 5A is a circuit diagram showing a connection relationship between the first to ninth sub-arrays SA1 to SA9 and the pads 144 of FIG. 3A. FIG. 5B is a circuit diagram showing a connection relationship between unit light-emitting devices 120U and protective elements 190 of the second sub-array SA2.

Referring to FIGS. 5A and 5B, each of the unit light-emitting devices 120U is illustrated as an LED. As described above, according to example embodiments, each of first and fourth sub-arrays SA1 and SA4 may include eleven unit light-emitting devices 120U, each of second, third, fifth, sixth, eighth, and ninth sub-arrays SA2, SA3, SA5, SA6, SA8, and SA9 may include twelve unit light-emitting devices 120U, and a seventh sub-array SA7 may include eight unit light-emitting devices 120U.

Thus, twelve pads 144 may be connected to each of the first and fourth sub-arrays SA1 and SA4, thirteen pads 144 may be connected to each of the second, third, fifth, sixth, eighth, and ninth sub-arrays SA2, SA3, SA5, SA6, and SA8, and nine pads 144 may be connected to the seventh sub-array SA7.

As described above, the first to ninth sub-arrays SA1 to SA9 may be electrically insulated from each other, and operations of the first to ninth sub-arrays SA1 to SA9 may be controlled by respectively different driver chips. Accordingly, the control of brightness of the unit light-emitting devices 120U included in each of the first to ninth sub-arrays SA1 to SA9 may be subdivided, and operating speed of the light-emitting device (refer to 100 in FIG. 3A) may be improved. Each of the unit light-emitting devices 120U may be connected to driver chips (refer to 210 in FIG. 2A) configured to control the corresponding one of the unit light-emitting devices 120U. The driver chips 210 may adjust brightness of each of the plurality of unit light-emitting devices 120U by using a pulse width modulation (PWM) scheme and/or a pulse amplitude modulation (PAM) scheme.

The unit light-emitting devices 120U included in the second sub-array SA2 may include first to twelfth unit light-emitting devices 120U_1 to 120U_12. The pads 144 connected to the second sub-array SA2 may include first to thirteenth pads 144_1 to 144_13.

Anodes of the first to twelfth unit light-emitting devices 120U_1 to 120U_12 may be respectively connected to the first to twelfth pads 144_1 to 144_12 in sequential order. A cathode of a preceding one of the first to twelfth unit light-emitting devices 120U_1 to 120U_12 may be connected to an anode of a following one thereof. For example, a cathode of the first unit light-emitting device 120U_1 may be connected to an anode of the second unit light-emitting device 120U_2. A cathode of the twelfth unit light-emitting device 120U_12 may be connected to the thirteenth pad 144_13.

Thus, each of the first to twelfth unit light-emitting devices 120U_1 to 120U_12 may be connected between two pads 144. For instance, the first unit light-emitting device 120U_1 may be connected between the first and second pads 144_1 and 144_2, and the second unit light-emitting device 120U_2 may be connected between the second and third pads 144_2 and 144_3.

The first to twelfth unit light-emitting devices 120U_1 to 120U_12 may respectively receive first to twelfth driving currents DI1 to DI12 through the first to thirteenth pads 144_1 to 144_13 in sequential order. The first to twelfth driving currents DI1 to DI12 may be pulse currents, which vary according to a PAM scheme and/or a PWM scheme. A second driver chip (refer to 210_2 in FIG. 1B) may control the brightness of the first to twelfth unit light-emitting devices 120U_1 to 120U_2 by adjusting amplitudes and/or pulse widths of the first to twelfth driving currents DI1 to DI12.

However, example embodiments are not limited thereto, and the first to twelfth unit light-emitting devices 120U_1 to 120U_2 may be driven by voltages. In this case, the second driver chip 210_2 may control the brightness of the first to twelfth unit light-emitting devices 120U_1 to 120U_2 by adjusting amplitudes or pulse widths of voltages between the first to thirteenth pads 144_1 to 144_13.

A light-emitting device (refer to 100 in FIG. 3A) may include a plurality of protective elements 190. According to example embodiments, the plurality of protective elements 190 may be Zener diodes. However, example embodiments are not limited thereto. The plurality of protective elements 190 may correspond to the plurality of unit light-emitting devices 120U in a one-to-one manner. For example, the plurality of protective elements 190 may respectively include first to twelfth protective elements 190_1 to 190_12 corresponding respectively to the first to twelfth unit light-emitting devices 120U_1 to 120U_12 in sequential order.

The first to twelfth protective elements 190_1 to 190_12 may be respectively connected in parallel to the first to twelfth unit light-emitting devices 120U_1 to 120U_12 in sequential order. The first to twelfth protective elements 190_1 to 190_12 may be respectively connected in reverse to the first to twelfth unit light-emitting devices 120U_1 to 120U_12 in sequential order to form closed loops.

For example, a cathode of the first protective element 190_1 may be connected to the anode of the first unit light-emitting device 120U_1, and an anode of the first protective element 190_1 may be connected to the cathode of first unit light-emitting device 120U_1. Connection relationships between the second to twelfth protective elements 190_1 to 190_12 and the second to twelfth unit light-emitting devices 120U_1 to 120U_12 may be similar to the connection relationship between the first protective element 190_1 and the first unit light-emitting device 120U_1.

According to example embodiments, the plurality of protective elements 190 may be formed in an edge region (refer to ER in FIG. 3B). According to other example embodiments, the plurality of protective elements 190 may be formed in driver chips (refer to 210 in FIG. 1B). According to other example embodiments, the plurality of protective elements 190 may be formed in any one of a pad region (refer to PDR in FIG. 3A) and a light-emitting cell region (refer to LCR in FIG. 3A). Also, some of the plurality of protective elements 190 may be formed in the edge region (refer to ER in FIG. 3A), and others of the plurality of protective elements 190 may be formed in the driver chips 210.

The first to twelfth protective elements 190_1 to 190_2 may respectively and sequentially prevent the occurrence of breakdown in the first to twelfth unit light-emitting devices 120U_1 to 120U_12 due to a reverse current. As a result, the electrical reliability of the unit light-emitting devices 120U may be improved, and thus, the reliability of the light-emitting device 100 may be improved.

Figure 6A:
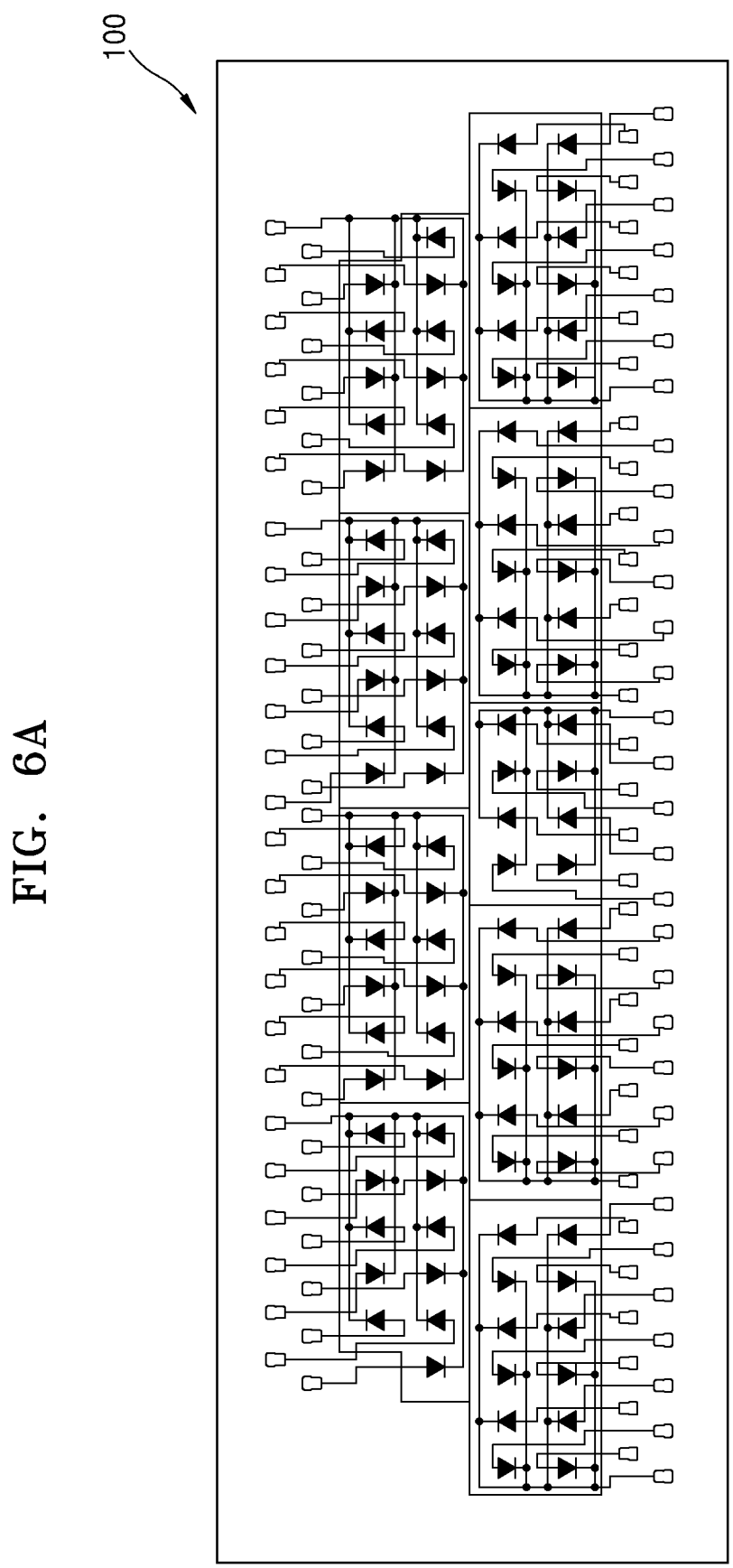
Figure 6B:
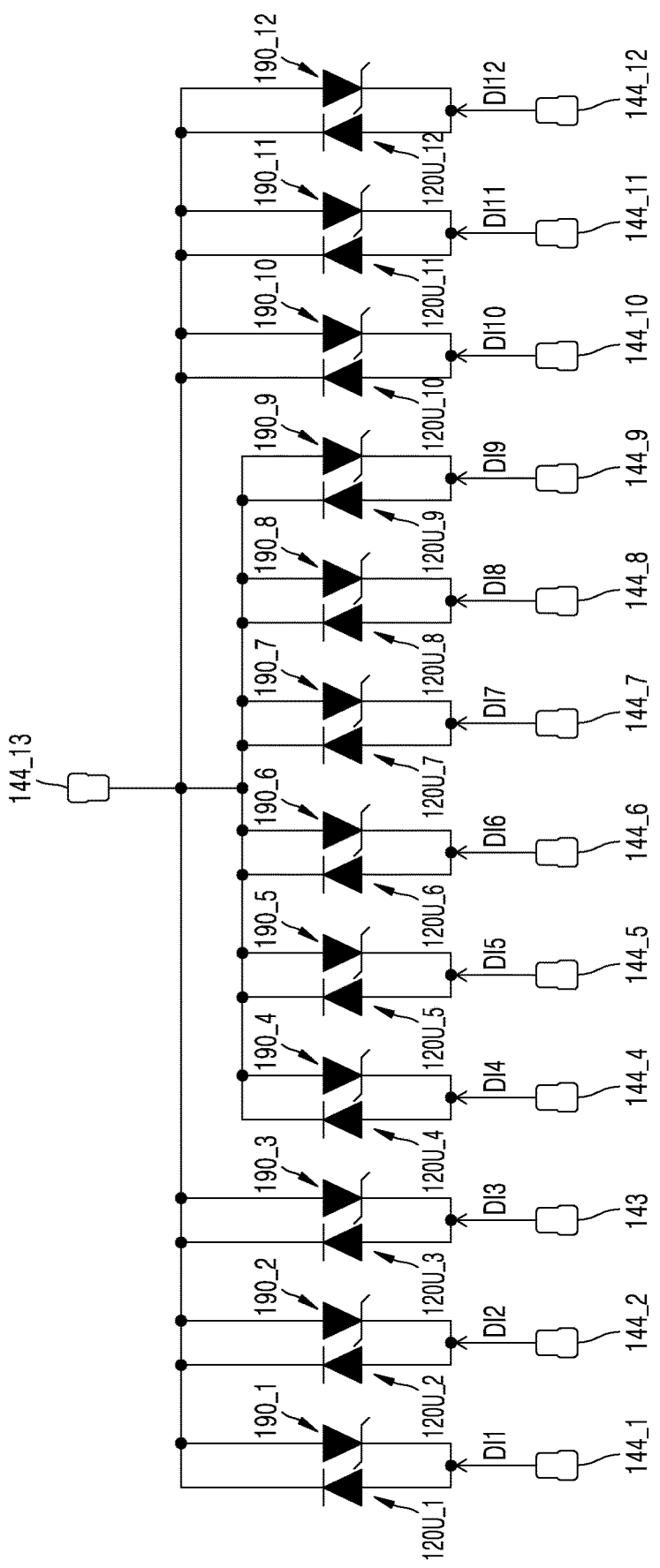

FIG. 6A is a circuit diagram showing a connection relationship between the first to ninth sub-arrays SA1 to SA9 and the pads 144 of FIG. 3A. FIG. 6B is a circuit diagram showing a connection relationship between unit light-emitting devices 120U and protective elements 190 of the second sub-array SA2.

The same descriptions as given with respect to FIGS. 5A and 5B is omitted for brevity, and differences between the connection relationships shown in FIGS. 5A and 5B and the connection relationships shown in FIGS. 6A and 6B are mainly described.

Anodes of first to twelfth unit light-emitting devices 120U_1 to 120U_12 may be respectively connected to first to twelfth pads 144_1 to 144_12 in sequential order. Each of the cathodes of the first to twelfth unit light-emitting devices 120U_1 to 120U_12 may be connected to a thirteenth pad 144_13. Thus, each of the first to twelfth unit light-emitting devices 120U_1 to 120U_12 may be connected between two pads 144. For example, the first unit light-emitting device 120U_1 may be connected between the first and thirteenth pads 144_1 and 144_13, and the second unit light-emitting device 120U_2 may be connected between the second and thirteenth pads 144_2 and 144_13.

Figure 7A:
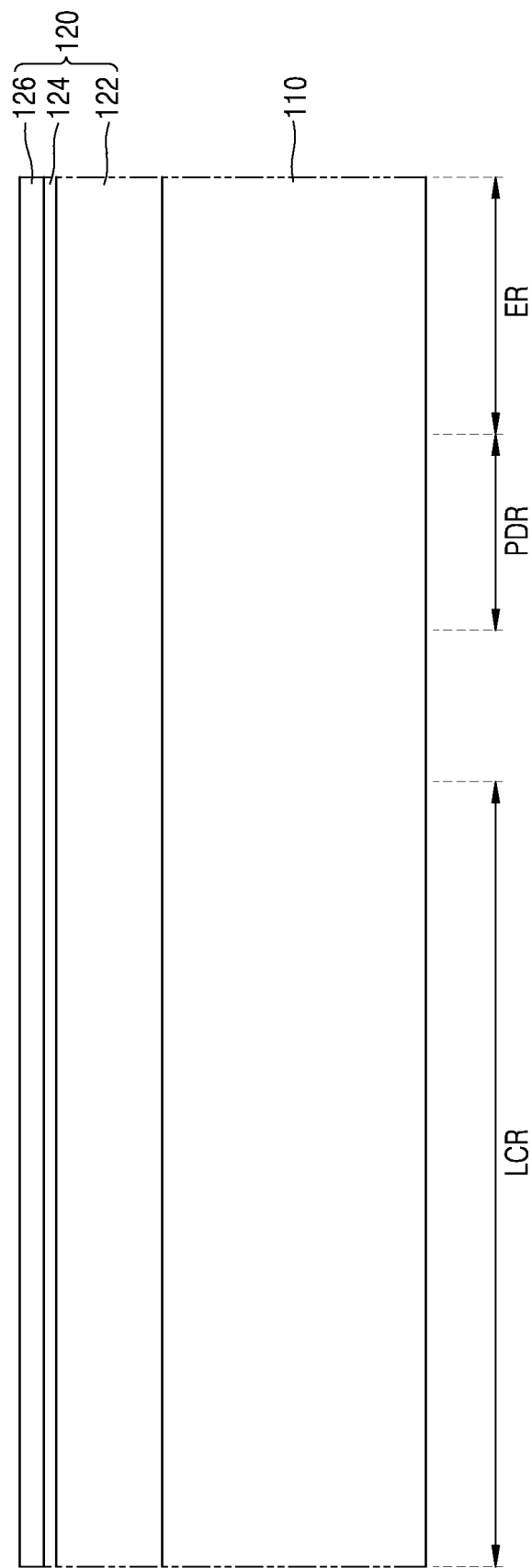

FIGS. 7A to 7O are cross-sectional views of a process sequence of a method of manufacturing a light-emitting device according to example embodiments. FIGS. 7A to 7O illustrate a portion corresponding to the cross-sectional view of FIG. 3B.

Referring to FIG. 7A, a stack structure 120 may be formed on a substrate 110.

In example embodiments, the substrate 110 may include a silicon (Si) substrate, a silicon carbide (SiC) substrate, a sapphire substrate, and/or a gallium nitride (GaN) substrate. The substrate 110 may include a light-emitting cell region LCR, a pad region PDR and an edge region ER.

The stack structure 120 may include a first conductive semiconductor layer 122, an active layer 124, and a second conductive semiconductor layer 126, which are sequentially formed on a first surface 110F1 of the substrate 110.

Figure 7B:
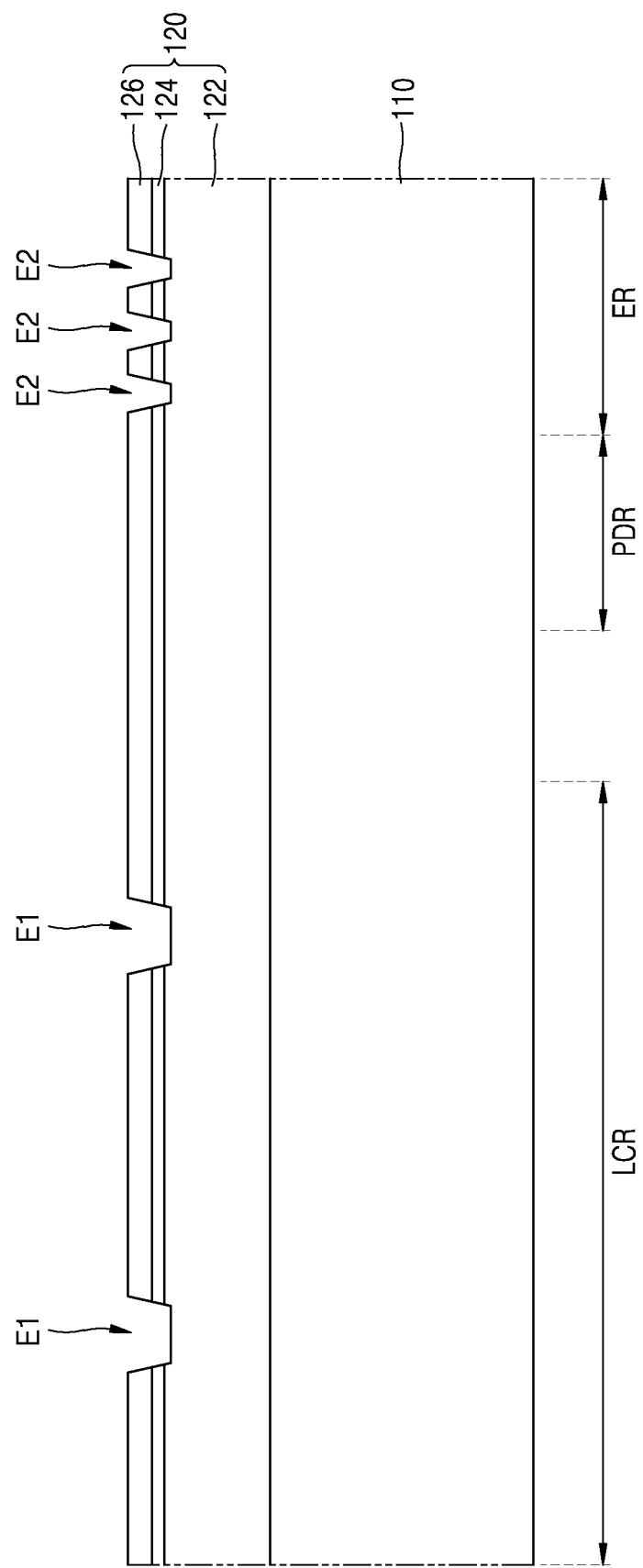

Referring to FIG. 7B, a mask pattern may be formed on the stack structure 120, and portions of the stack structure 120 may be removed using the mask pattern as an etch mask to form first and second etched units E1 and E2. The first and second etched units E1 and E2 may expose a top surface of the first conductive semiconductor layer 122. The first etched units E1 may be formed in the light-emitting cell region LCR, and the second etched units E2 may be formed in an edge region ER. The second etched units E2 may be filled with first to third insulating layers (refer to 131, 133, and 135 in FIG. 3B) and a buried insulating layer (refer to 137 in FIG. 3B), which will be described below, thereby forming first to third fences (refer to 171, 172, and 173 in FIG. 3B).

Figure 7C:
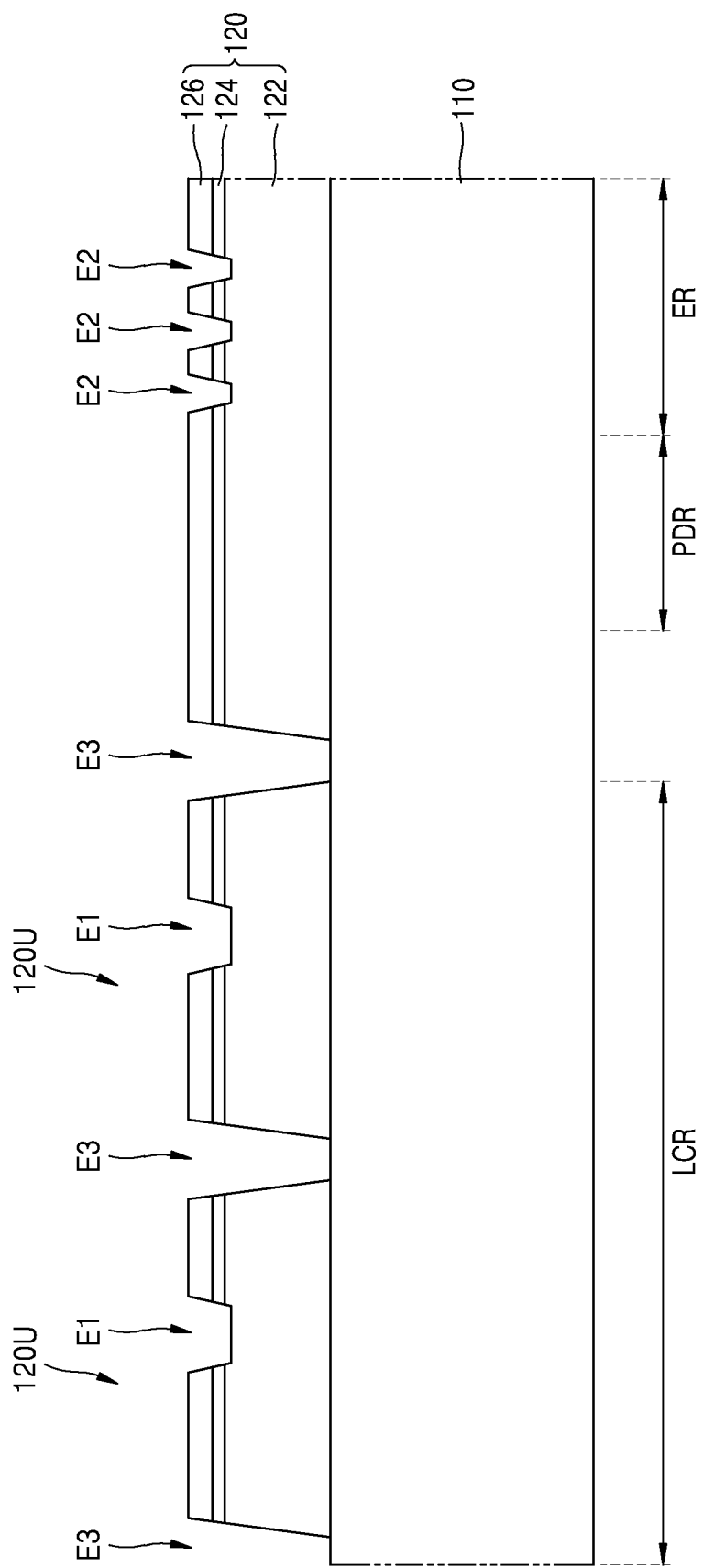

Referring to FIG. 7C, portions of the stack structure 120 in the light-emitting cell region LCR may be removed to form third etched units E3. The third etched units E3 may expose a surface of the substrate 110. The third etched units E3 may separate the stack structure 120 including a single continuous material layer into a plurality of unit light-emitting devices 120U, which are spaced apart from each other. The third etched units E3 may separate the unit light-emitting devices 120U formed in the light-emitting cell region LCR from the stack structure 120 formed in the pad region PDR and the edge region ER.

Referring to FIG. 7D, the first insulating layer 131 may be formed to conformally cover the plurality of unit light-emitting devices 120U. The first insulating layer 131 may include, for example, silicon oxide, silicon nitride, and/or silicon oxynitride.

Referring to FIG. 7E, portions of the first insulating layer 131 may be removed to expose a surface of the second conductive semiconductor layer 126, and a first electrode 141, a cover electrode 143, and a pad 144 may be formed.

The first electrode 141 and the cover electrode 143 may be formed on the surface of the second conductive semiconductor layer 126 in the light-emitting cell region LCR, and the pad 144 may be formed on the surface of the second conductive semiconductor layer 126 in the pad region PDR. The first electrode 141 may be in contact with the second conductive semiconductor layer 126, and the cover electrode 143 may cover the first electrode 141.

The pad 144 and the first electrode 141 may be in contact with the second conductive semiconductor layer 126. A planar shape of the pad 144 may be similar to one of those described with reference to FIGS. 4A to 4C. The pad 144 may include the same material as the cover electrode 143 and be formed at substantially the same time as the cover electrode 143. However, example embodiments are not limited thereto. For example, the pad 144 may be formed using a different process from the cover electrode 143 and include a different material from the cover electrode 143.

Referring to FIG. 7F, the second insulating layer 133 may be formed to conformally cover the resultant workpiece of FIG. 7D. The second insulating layer 133 may include the same material as the first insulating layer 131. However, example embodiments are not limited thereto.

Figure 7G:
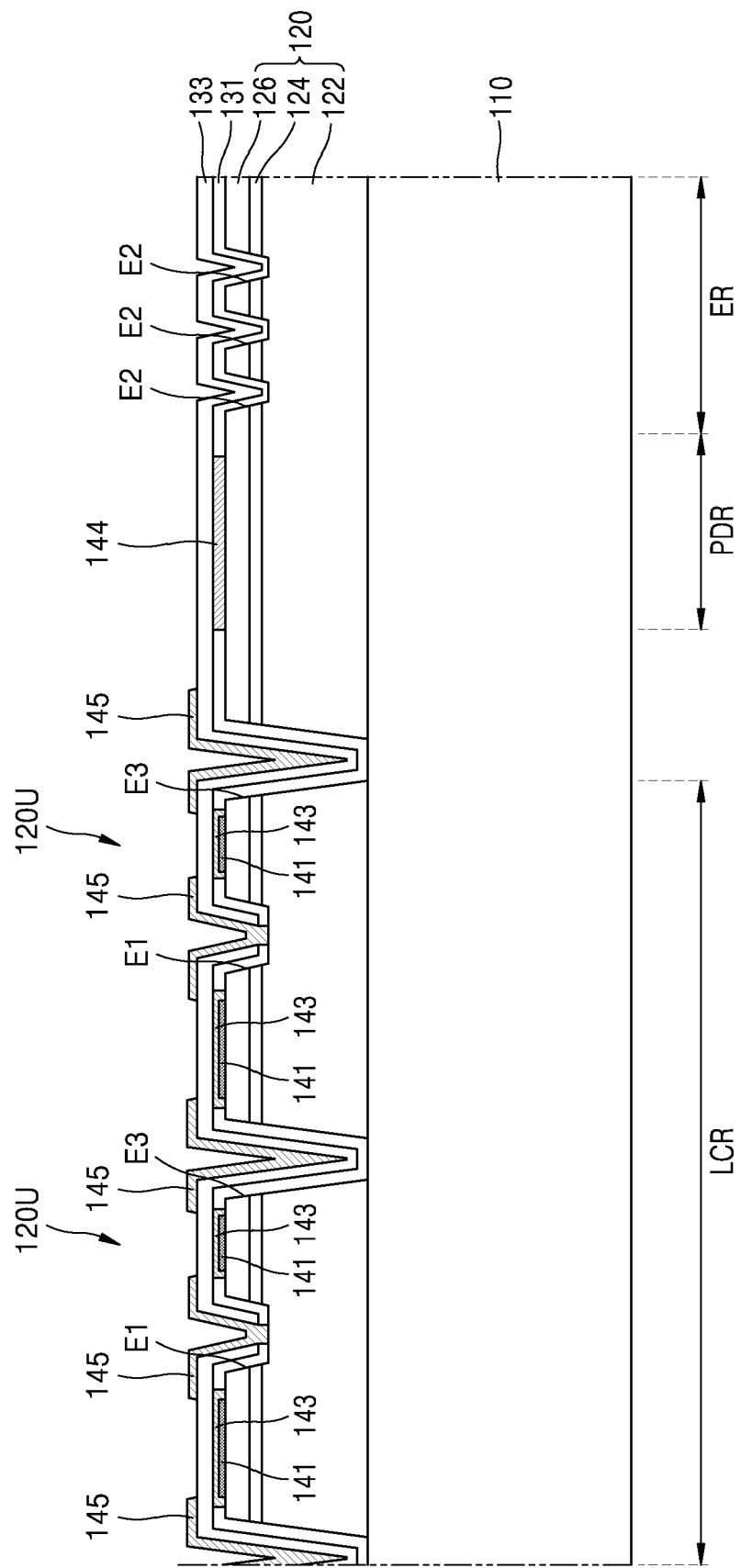

Referring to FIG. 7G, the first and second insulating layers 131 and 133 may be partially removed to partially expose a surface of the first conductive semiconductor layer 122, and a reflective electrode 145 may be then formed. The reflective electrode 145 may be in contact with the first conductive semiconductor layer 122 and have a high reflectivity. The reflective electrode 145 may not only have a portion in contact with the first conductive semiconductor layer 122 but also further cover the second insulating layer 133 on the first and third etched units E1 and E3. Accordingly, light emitted from the unit light-emitting devices 120U may be prevented from being irradiated in an opposite direction, and thus, the optical efficiency of a light-emitting device (refer to 100 in FIG. 3A) may be improved.

Referring to FIG. 7H, the third insulating layer 135 may be formed to conformally cover the resultant workpiece of FIG. 7G. The third insulating layer 135 may include the same material as the first insulating layer 131. However, example embodiments are not limited thereto.

Figure 7I:
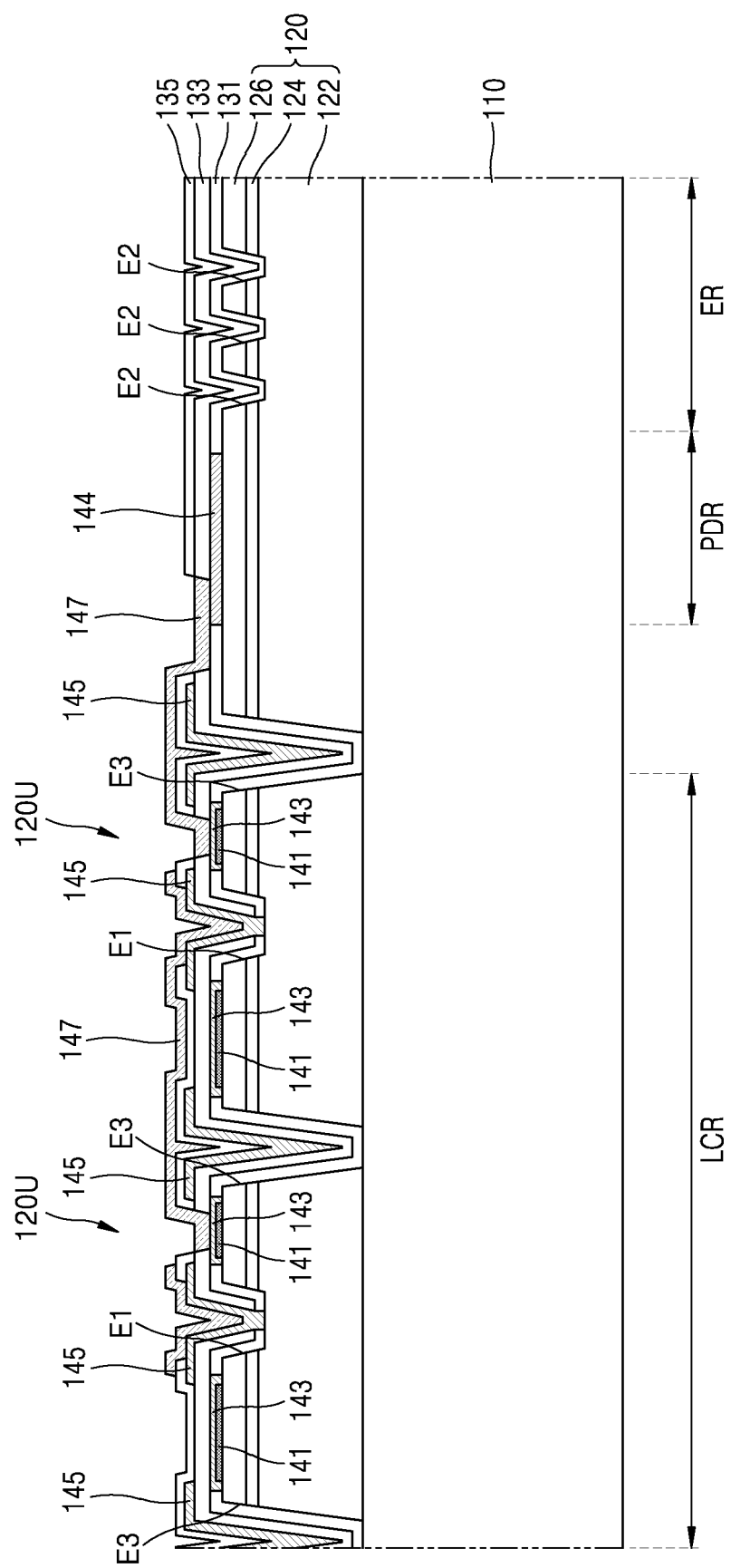

Referring to FIG. 7I, the first to third insulating layers 131, 133, and 135 may be partially removed to partially expose top surfaces of the cover electrode 143, the pad 144, and the reflective electrode 145, and an interconnection electrode 147 may be then formed.

The interconnection electrode 147 may connect the cover electrode 143 to the pad 144 to provide an electrical path between the pads 144 and the second conductive semiconductor layer 126. The interconnection electrode 147 may connect the cover electrode 143 to the reflective electrode 145 to provide an electrical path between the first conductive semiconductor layer 122 of any one of the unit light-emitting devices 120U and the second conductive semiconductor layer 126 of another one of the unit light-emitting devices 120U. Although not clearly shown in FIG. 7I, the interconnection electrode 147 may connect the reflective electrode 145 to the pad 144 to provide an electrical path between the pads 144 and the first conductive semiconductor layer 122.

Figure 7J:
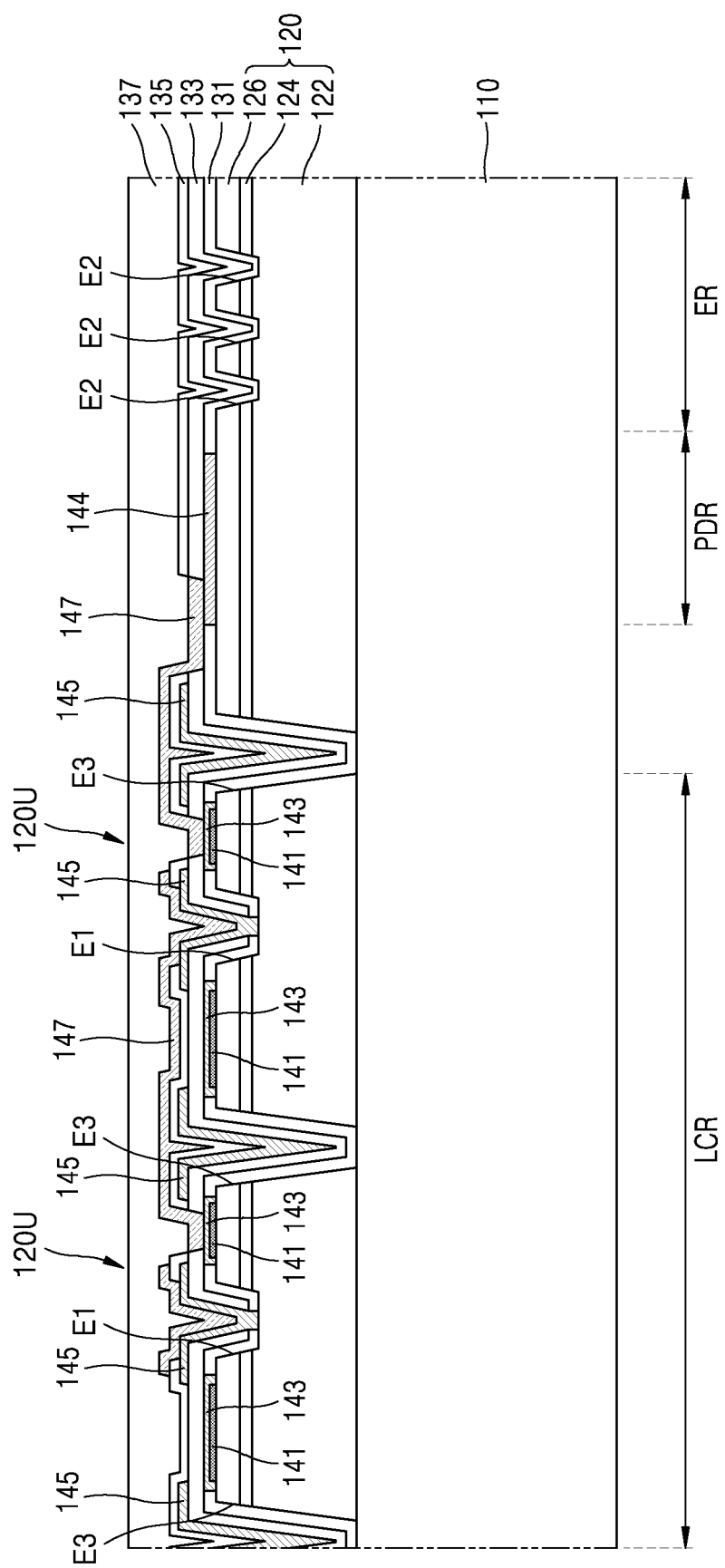

Referring to FIG. 7J, the buried insulating layer 137 may be provided on the workpiece of FIG. 7I. A planarization process may be performed on one surface of the buried insulating layer 137 that is, for example, a surface opposite to the surface facing the substrate 110. The one surface of the buried insulating layer 137 may be a substantially planar surface. The buried insulating layer 137 may include a silicon resin, an epoxy resin, or an acrylic resin.

Figure 7K:
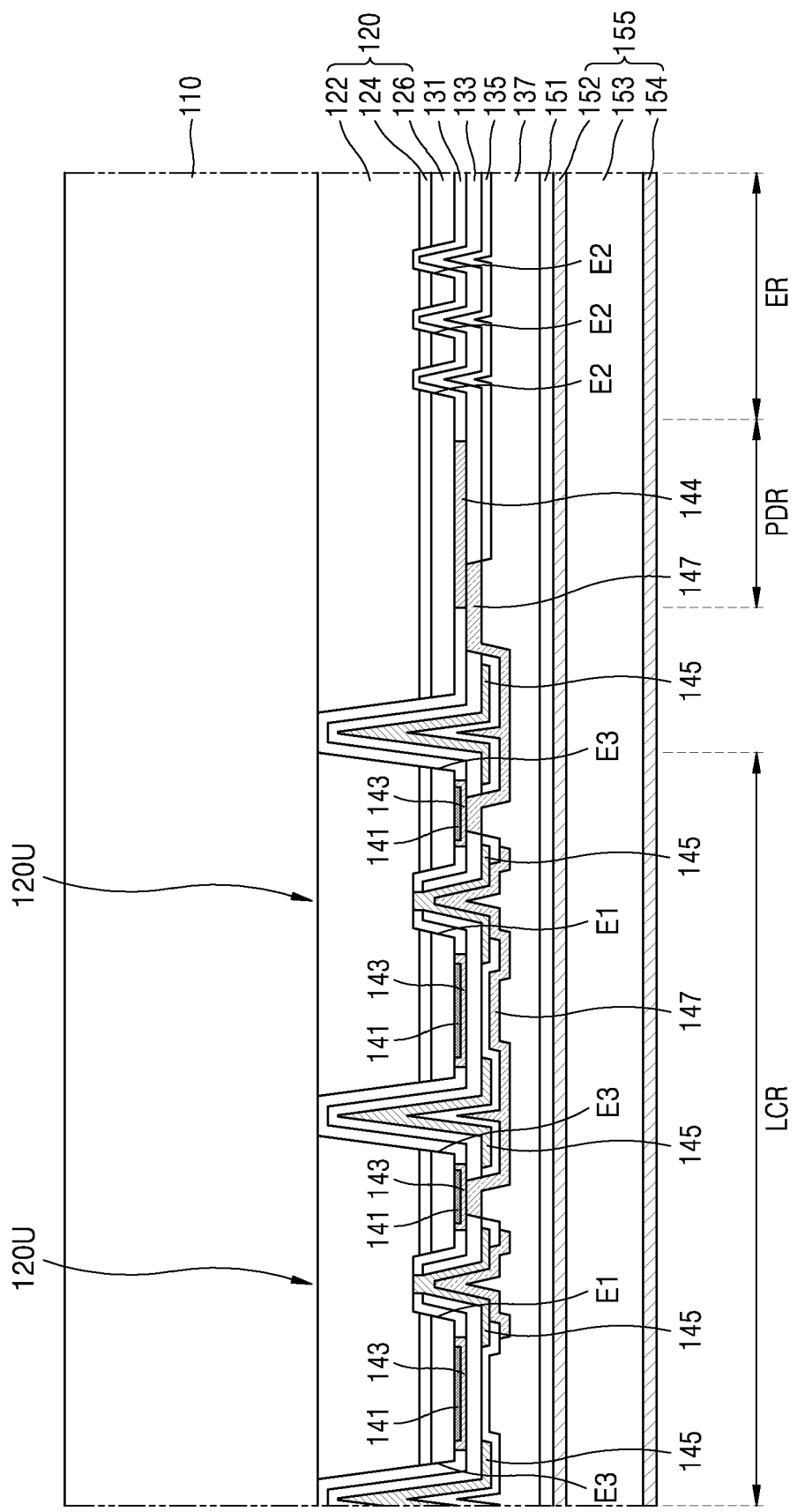

Referring to FIG. 7K, an adhesive layer 151 may be provided on the buried insulating layer 137, a support structure 155 may be adhered onto the adhesive layer 151. Thereafter, orientation of the resultant workpiece of FIG. 7J may be reversed.

Figure 7L:
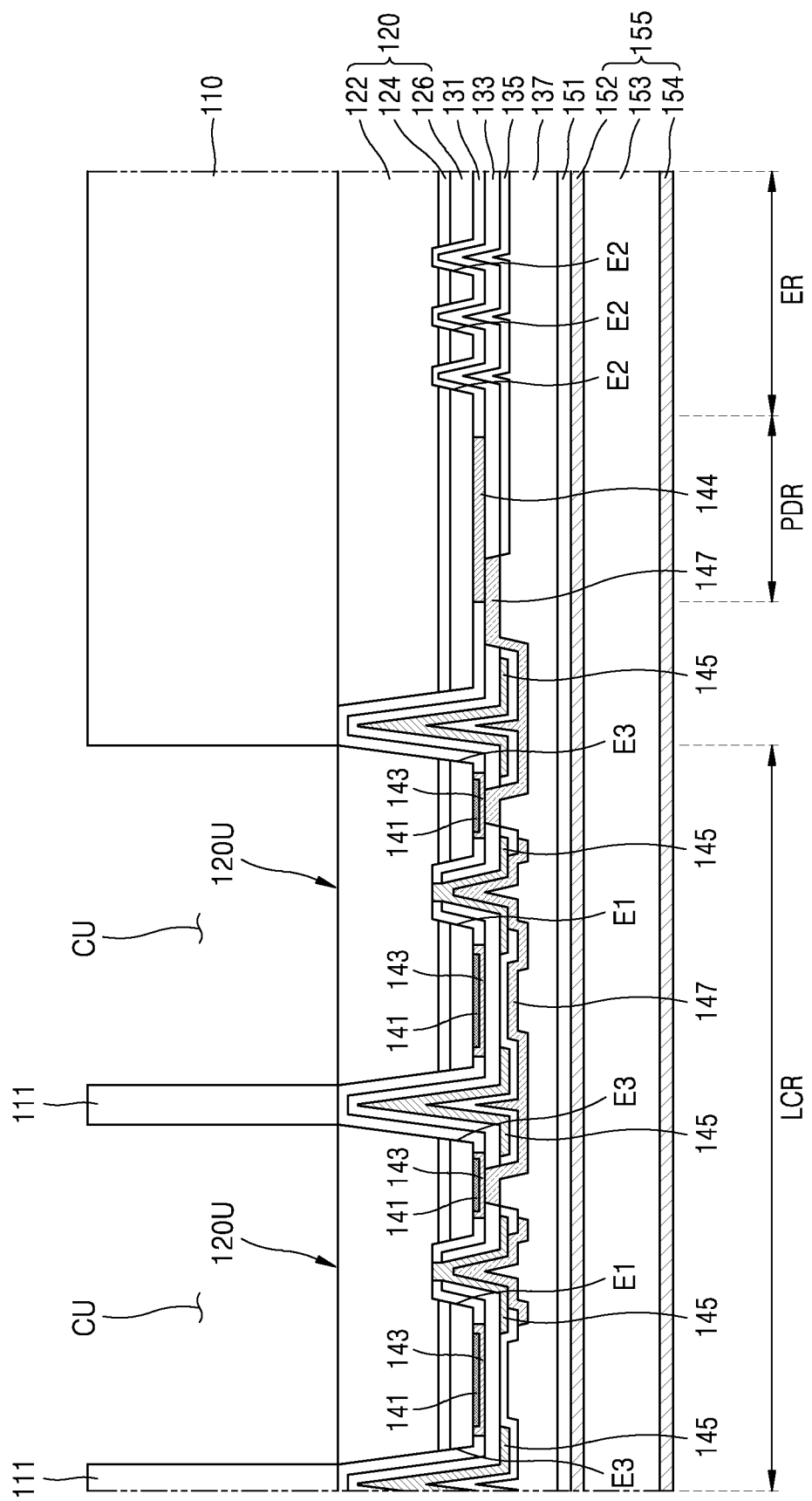

Referring to FIG. 7L, a mask pattern may be formed on the substrate 110, and portions of the substrate 110 may be removed using the mask pattern as an etch mask, and thus, a plurality of cell spaces CU may be formed in the light-emitting cell region LCR of the substrate 110. The substrate 110 may remain in the pad region PDR and the edge region ER.

Portions of the substrate 110 patterned on the plurality of cell spaces CU in the light-emitting cell region LCR may be referred to as first partition walls 111. The first partition walls 111 may vertically overlap the third etched units E3. The plurality of light-emitting device devices 120U may be respectively positioned inside the plurality of cell spaces CU. The top surface of the first conductive semiconductor layer 122 may be exposed at bottoms of the plurality of cell spaces CU.

In some cases, a concave/convex structure may be further formed by etching the top surface of the first conductive semiconductor layer 122, which is exposed at the bottoms of the plurality of cell spaces CU or exposed by the cell spaces CU. In this case, light extraction efficiency of the unit light-emitting devices 120U may be improved.

Figure 7M:
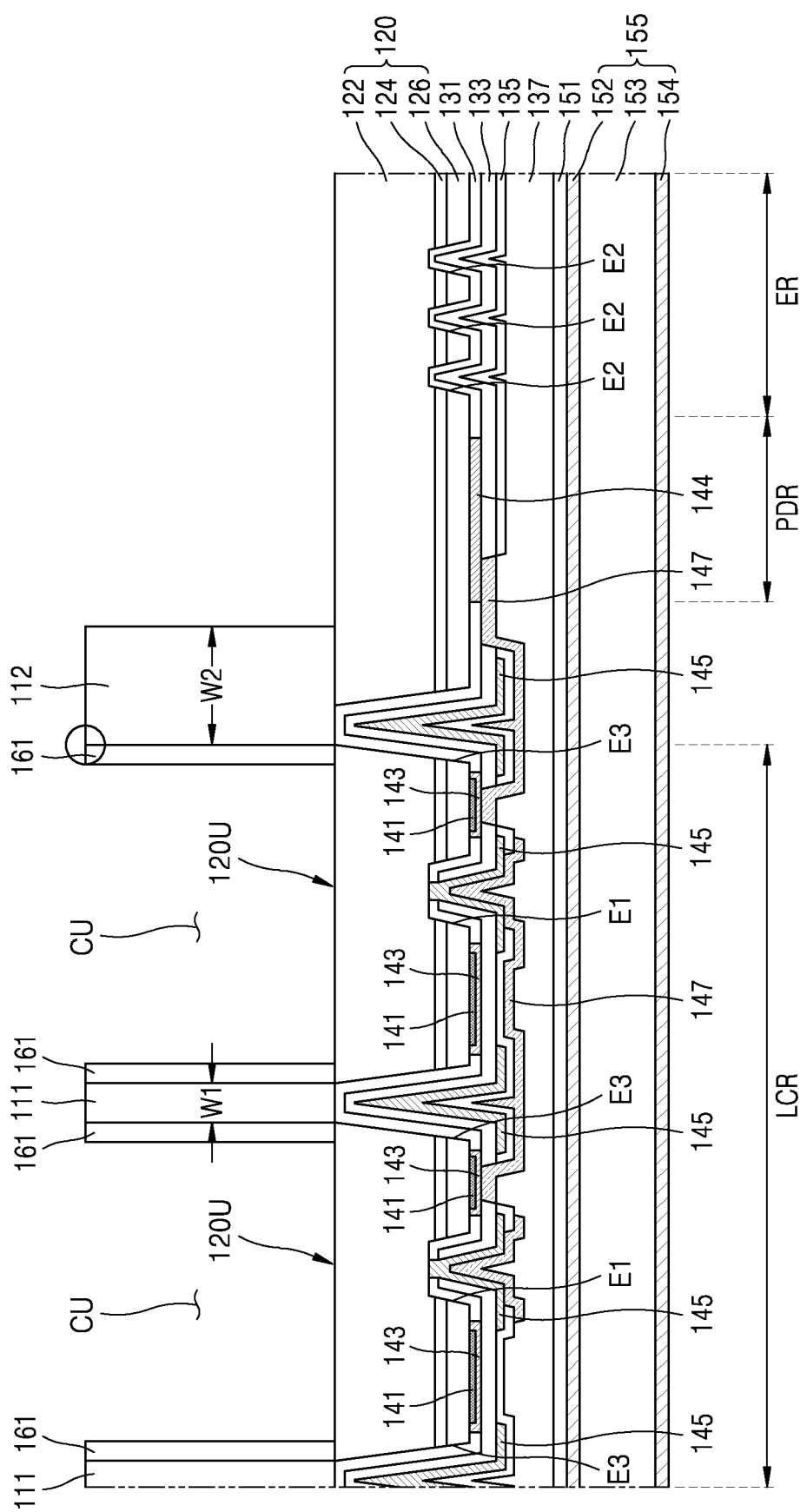

Referring to FIG. 7M, a conductive layer may be formed on the top surface of the substrate 110 and sidewalls of the plurality of cell spaces CU. An anisotropic etching process may be performed on the conductive layer to form reflective layers 161. The reflective layers 161 may cover sides of the first partition walls 111 and sidewalls of second partition walls 112, which face the first partition walls 111.

Figure 7N:
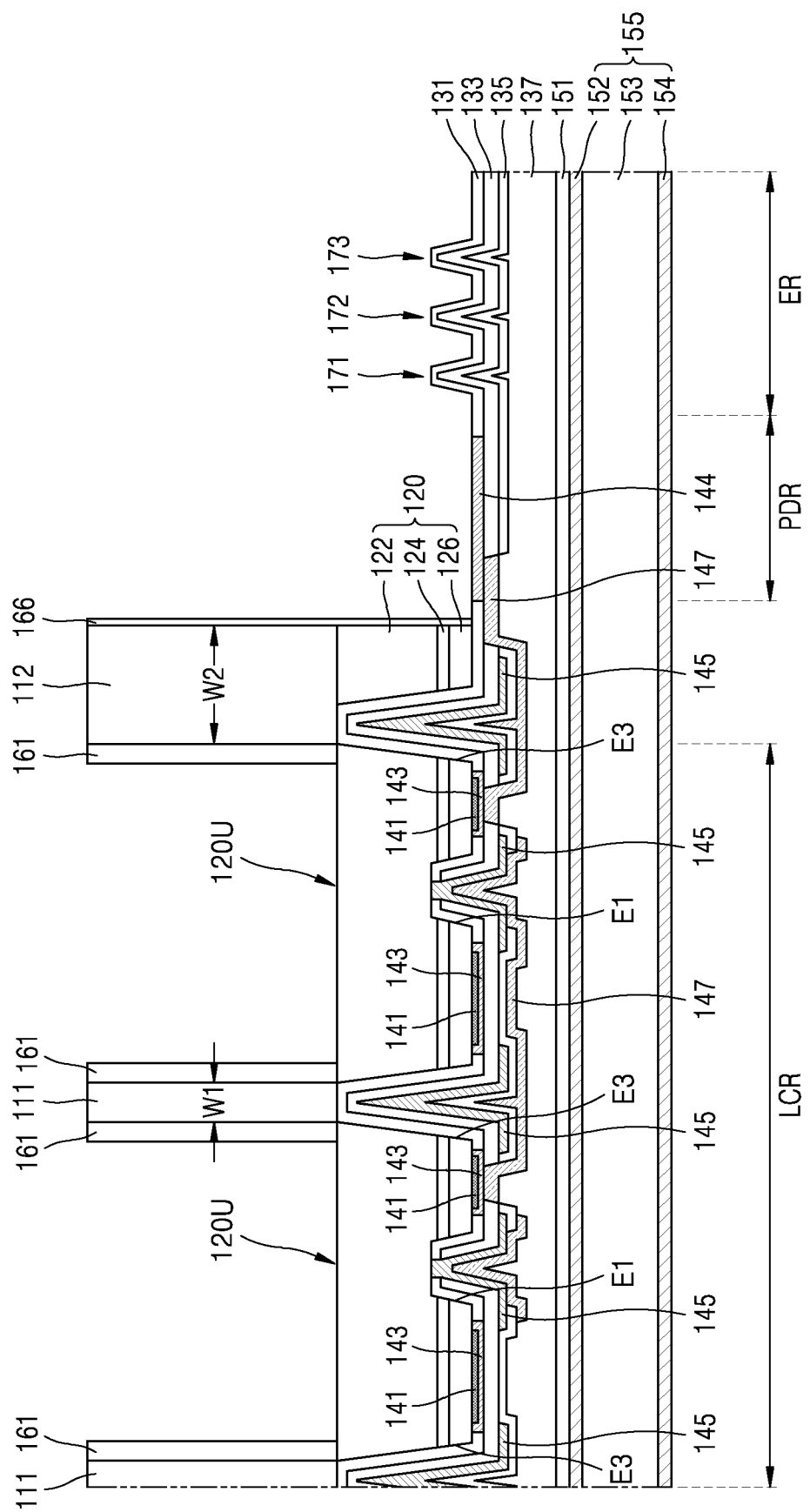

Referring to FIG. 7N, a mask pattern may be formed to cover the light-emitting cell region LCR and expose a portion of the pad region PDR and the edge region ER. Thereafter, the substrate 110 and the stack structure 120 may be etched using the mask pattern as an etch mask. Subsequently, an insulating material (e.g., silicon oxide) may be deposited on the resultant workpiece, and an isotropic etching process may be performed to form an insulating liner 166 on sidewalls of the second partition walls 122 in the pad region PDR. The insulating material may also be deposited on the reflective layer 161, and thus, a thickness of the reflective layer 161 may be increased.

Due to the above-described process, the pad 144 in the pad region PDR and the first to third fences 171, 172, and 173 in the edge region ER may be exposed. The stack structure 120, which does not operate as the unit light-emitting device 120U, may remain under the second partition wall 112 in the pad region PDR.

Thereafter, referring to FIGS. 7N and 7O, a fluorescent layer 174 may be formed to fill the plurality of cell spaces CU.

According to example embodiments, the fluorescent layer 174 may be formed by applying or dispensing a resin containing phosphor particles dispersed therein into the plurality of cell spaces CU. The fluorescent layer 174 may include at least two kinds of phosphor particles having different size distributions so that the phosphor particles may be uniformly dispersed in each of the plurality of cell spaces CU.

Referring to FIGS. 3A and 3B, after the light-emitting devices 100 are individualized, the light-emitting devices 100 may be mounted on a package substrate or an interposer positioned on the package substrate, and bonding wires 400 may be formed using a wiring process.

FIGS. 8A to 8D are cross-sectional views of a light-emitting device according to example embodiments.

FIGS. 8A to 8D are cross-sectional views of a portion corresponding to FIG. 3B. The same descriptions as given with respect to FIGS. 3A to 3C are omitted for brevity, and differences between the light-emitting device 100 of FIGS. 3A to 3C and the light-emitting device of FIGS. 8A to 8D are mainly described.

Figure 8A:
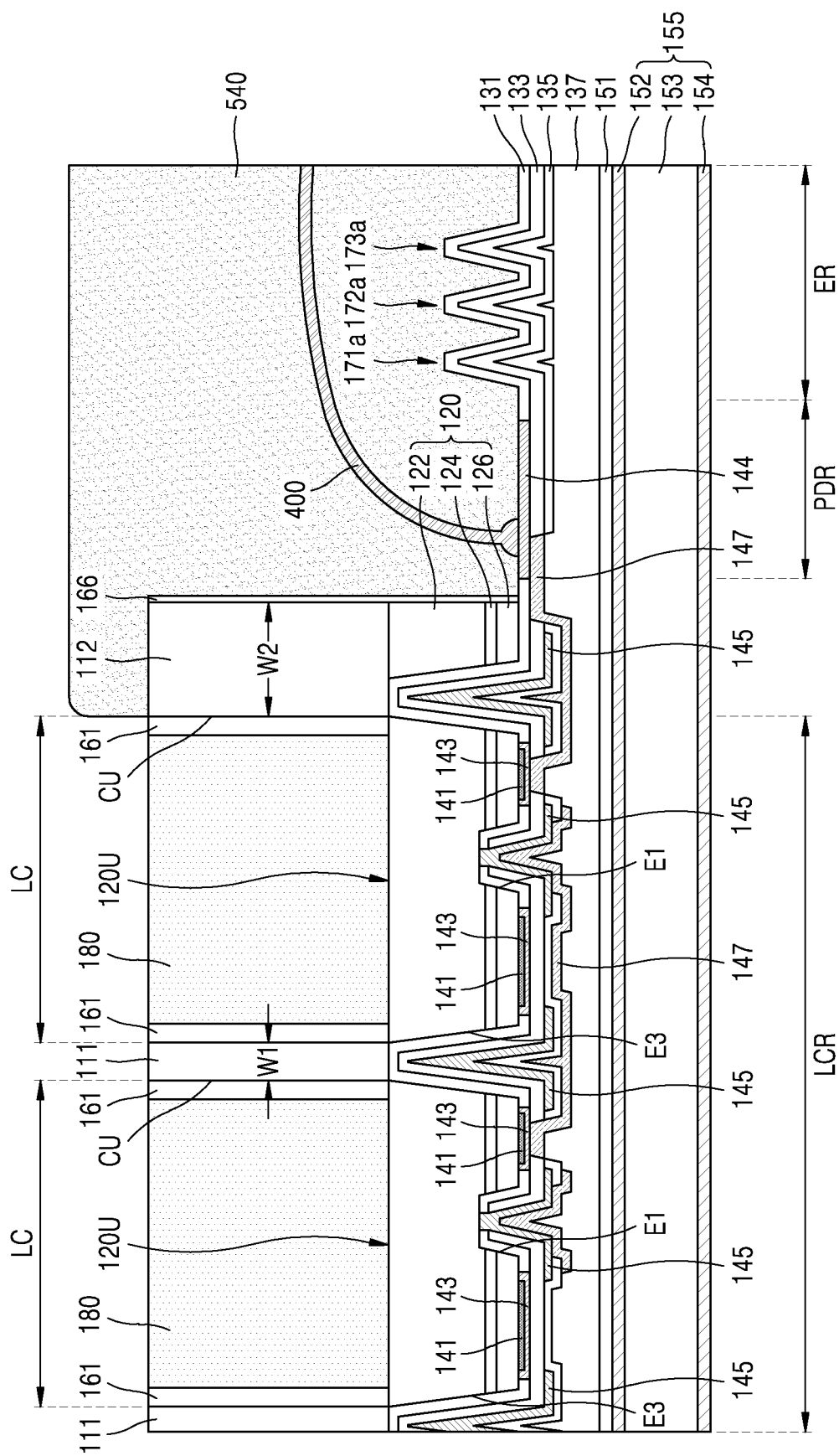

Referring to FIG. 8A, top surfaces of first to third fences 171a, 172a, and 173a may be at a higher level than a top surface of a first insulating layer 131 inside first etched units E1 and at a lower level than a top surface of the first insulating layer 131 inside a third etched unit E3.

In FIG. 8A, second etched units E2 for forming the first to third fences 171a, 172a, and 173a may be formed using a separate process from a process of forming the first etched units E1 to expose a first conductive semiconductor layer 122. Thus, the second etched units E2 may have a greater depth than the first etched units E1.

Referring to FIG. 8B, top surfaces of first to third fences 171b, 172b, and 173b may be at a lower level than a first insulating layer 131 positioned inside first etched units E1. According to example embodiments, the top surfaces of the first to third fences 171b, 172b, and 173b may be at a lower level than a top surface of an active layer 124 positioned inside the first etched units E1.

In FIG. 8B, second etched units E2 for forming the first to third fences 171b, 172b, and 173b may be formed using a separate process from a process of forming the first etched units E1 to expose a first conductive semiconductor layer 122. Thus, the second etched units E2 may have a smaller depth than the first etched units E1.

Figure 8C:
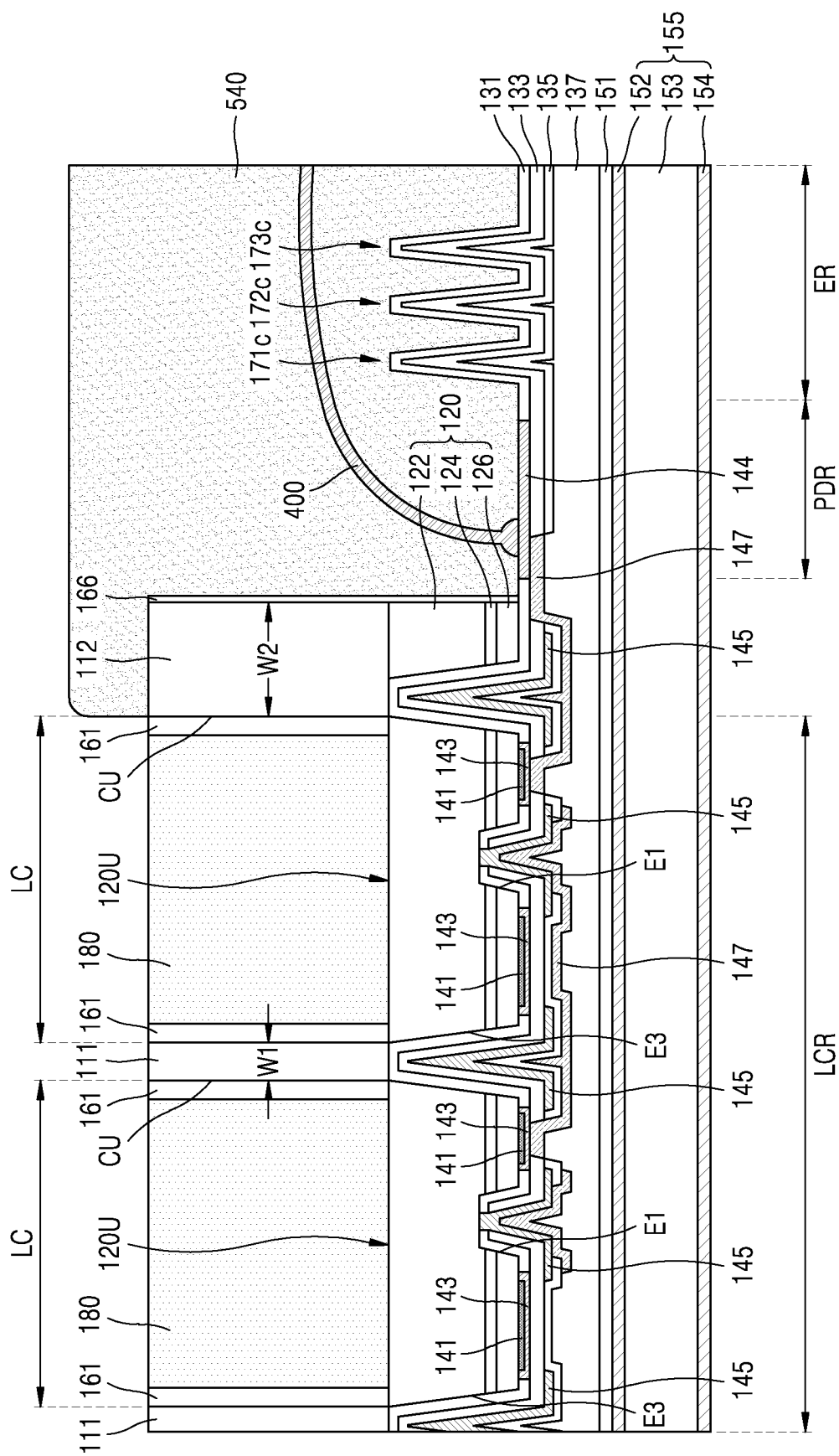

Referring to FIG. 8C, top surfaces of first to third fences 171c, 172c, and 173c may be at substantially the same level as a top surface of a first insulating layer 131 positioned inside a third etched unit E3. In this case, second etched units E2 for forming the first to third fences 171c, 172c, and 173c may be formed at substantially the same time as the third etched unit E3.

Figure 8D:
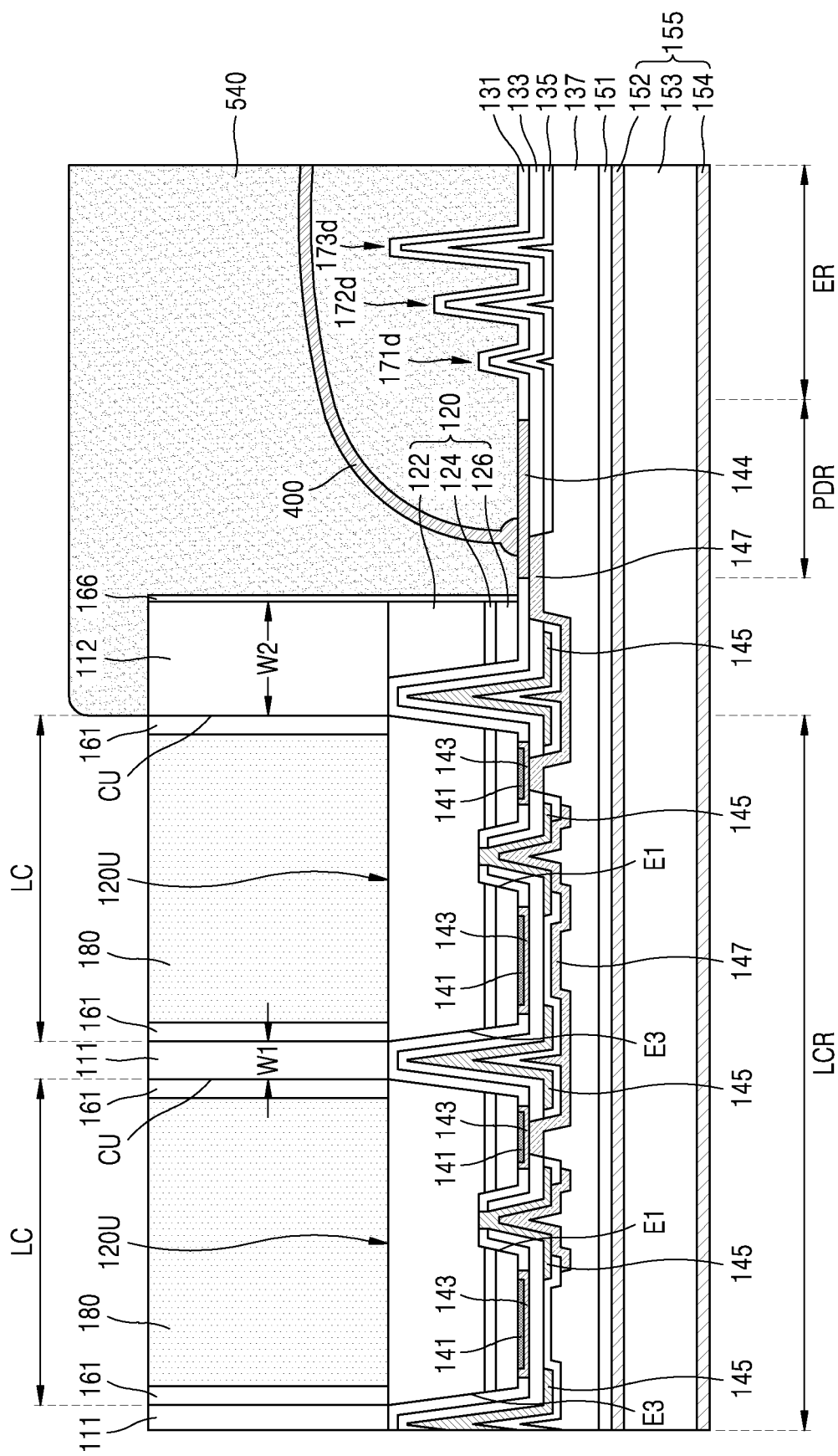

Referring to FIG. 8D, top surfaces of first to third fences 171d, 172d, and 173d may be at respectively different levels. Etched units for forming the first to third fences 171d, 172d, and 173d may be formed using respectively different etching processes. In an example, the top surface of the second fence 172d may be at a higher level than the top surface of the first fence 171d, and the top surface of the third fence 173d may be at a higher level than the top surface of the second fence 172d. However, example embodiments are not limited thereto.

Figure 9:
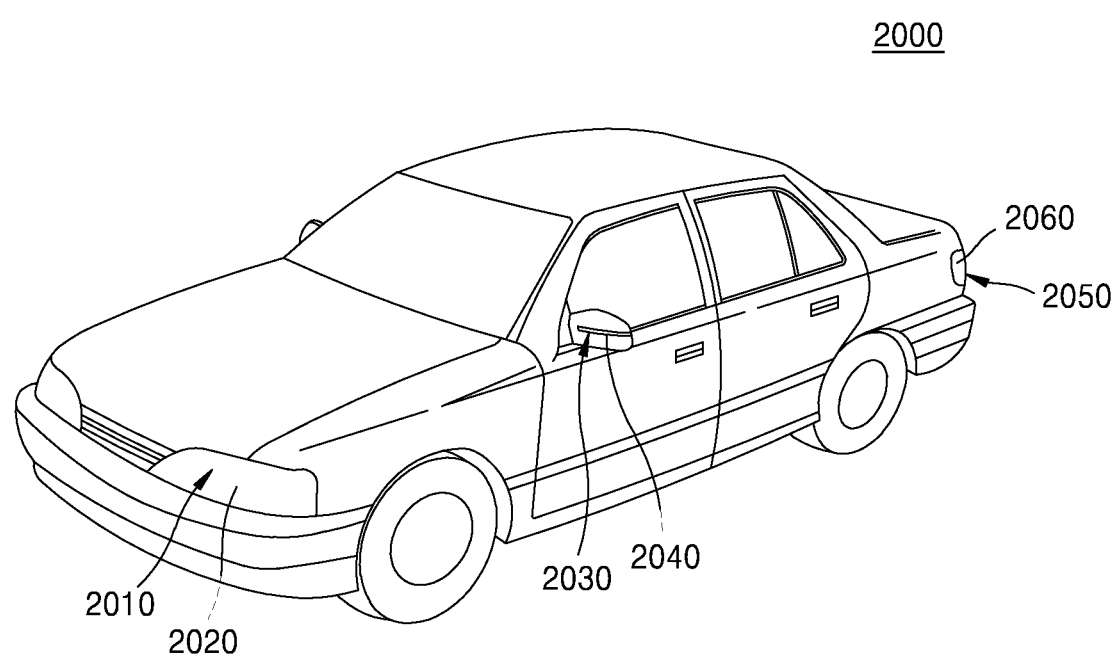
FIG. 9 is a schematic perspective view of a lighting apparatus according to example embodiments.

FIG. 9 is a schematic perspective view of a lighting apparatus according to example embodiments.

Referring to FIG. 9, a headlamp module 2020 may be installed in a headlamp portion 2010 of a vehicle. A side mirror lamp module 2040 may be installed in an outer side mirror portion 2030, and a tail lamp module 2060 may be installed in a tail lamp portion 2050. At least one of the headlamp module 2020, the side mirror lamp module 2040, and the tail lamp module 2060 may be implemented as one of the light source modules (refer to 10 and 10' in FIGS. 1A and 1B), which are described above.

Figure 10A:
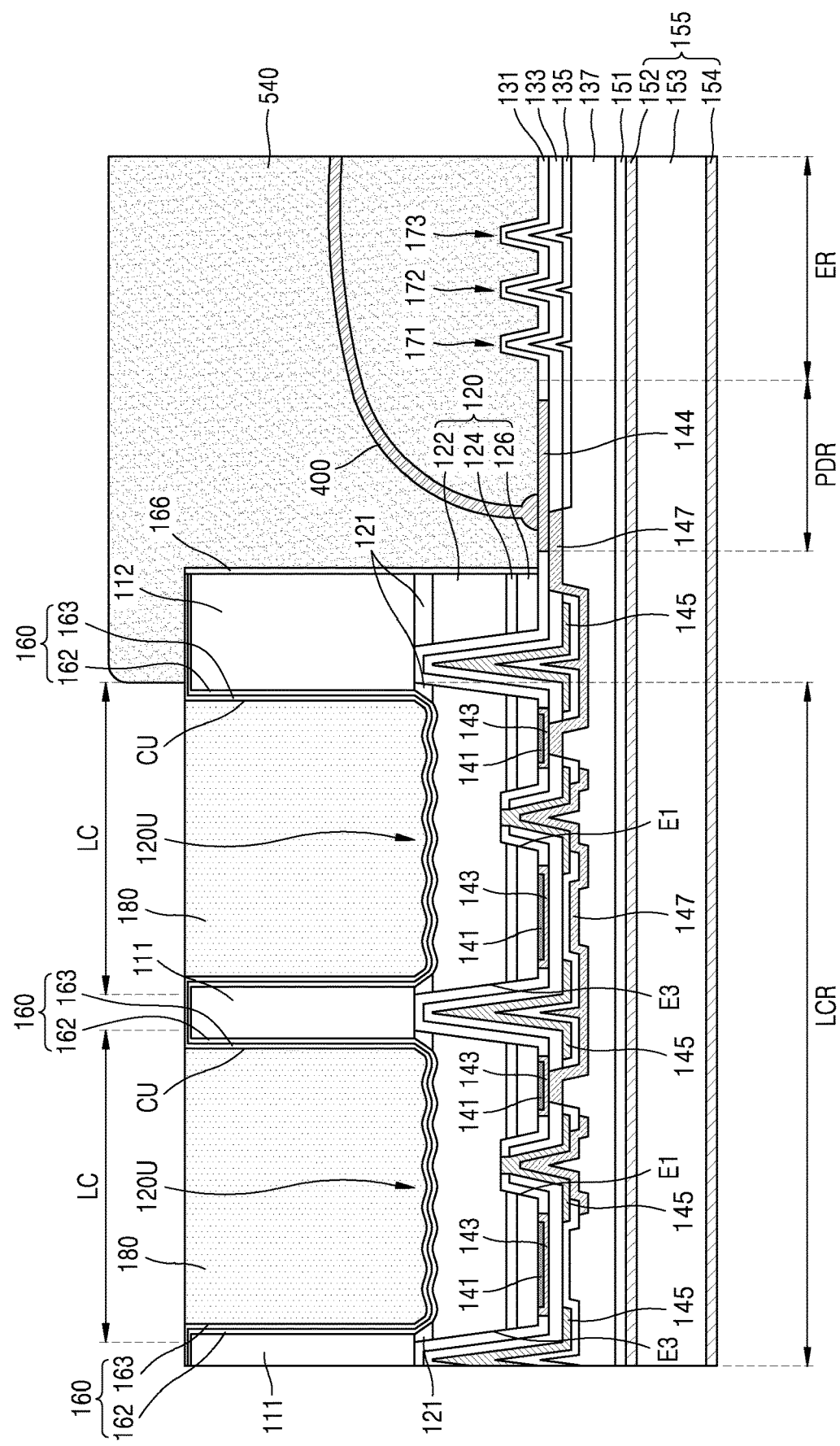
FIG. 10A is a cross-sectional view of a light-emitting device according to example embodiments.
Figure 10B:
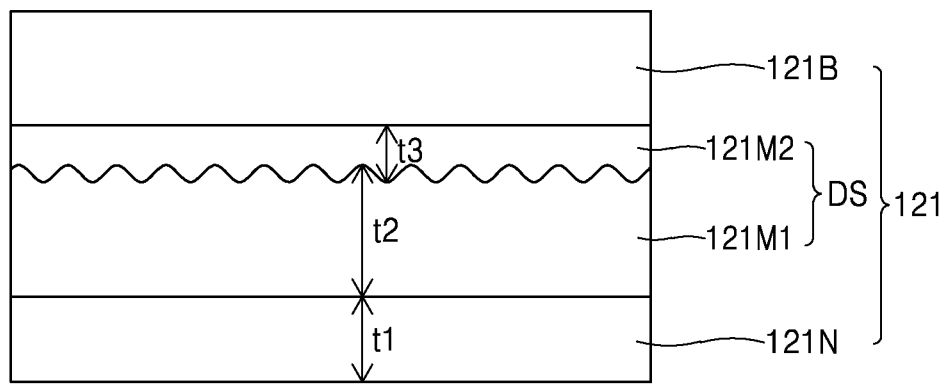
FIG. 10B is an enlarged partial cross-sectional view of a buffer structure of FIG. 10A.

FIG. 10A is a cross-sectional view of a portion of a light-emitting device according to example embodiments, which corresponds to FIG. 3B. FIG. 10B is an enlarged partial cross-sectional view of a buffer structure 121 of FIG. 10A.

The same descriptions as given with respect to FIGS. 3A to 3C are omitted for brevity, and differences between the light-emitting device 100 of FIGS. 3A to 3C and the light-emitting device of FIGS. 10A and 10B are mainly described.

Referring to FIGS. 10A and 10B, a buffer structure 121 may be interposed between a stack structure and first and second partition walls 111 and 112. The buffer structure 121 may reduce dislocation densities in a first conductive nitride semiconductor layer 122, an active layer 124, and a second conductive semiconductor layer 126, which are formed on a substrate (refer to 110 in FIG. 7A) that is a growth substrate. The buffer structure 121 may be interposed between the first partition wall and the first conductive nitride semiconductor layer 122. According to some example embodiments, a buffer layer may be etched in a process of forming the first partition wall 111 as shown in FIG. 7L, to form the buffer structure 121.

The buffer structure 121 may include a nucleation layer 121N, a dislocation-removing structure DS positioned on the nucleation layer 121N, and a buffer layer 121B positioned on the dislocation-removing structure DS.

The nucleation layer 121N may be a layer for forming nuclei for crystal growth. The nucleation layer 121N may prevent the occurrence of a melt-back phenomenon where gallium (Ga) included in another layer (e.g., a first material layer 121M1 or the buffer layer 121B) of the buffer structure 121 contacts and reacts with silicon (Si) included in the substrate for growing the buffer structure 121. Also, the nucleation layer 121N may assist the wetting of the dislocation-removing structure DS. In some example embodiments, the nucleation layer 121N may include aluminum nitride (AlN).

The dislocation-removing structure DS may include the first material layer 121M1 positioned on the nucleation layer 121N and a second material layer 121M2 positioned on the first material layer 121M1. The first material layer 121M1 may include $B_xAl_yIn_zGa_{1-x-y-z}N$ (where $0 \leq x < 1$, $0 < y < 1$, $0 \leq z < 1$, and $0 \leq x+y+z < 1$). In some example embodiments, a composition ratio of the first material layer 121M1 may be substantially constant from a bottom surface of the first material layer 121M1 to a top surface of the first material layer 121M1. That is, although the composition ratio of the first material layer 121M1 is intended to be constant from the bottom surface of the first material layer 121M1 to the top surface of the first material layer 121M1, changes in the composition due to constraints of an actual process may be allowed. In some example embodiments, an aluminum (Al) content of the first material layer 121M1 may be about 25 atomic percent (at %) to about 75 at %.

The second material layer 121M2 may have a different lattice constant from the first material layer 121M1. In some example embodiments, the second material layer 121M2 may include the same material as the nucleation layer 121N. For example, the second material layer 121M2 may include aluminum nitride (AlN). At an interface between the first and second material layers 121M1 and 121M2 (i.e., a top surface of the first material layer 121M1), a dislocation may be bent or a dislocation half-loop may be formed due to a difference in lattice constant between the first and second material layers 121M1 and 121M2 to reduce the dislocation.

Furthermore, a roughness of the top surface of the first material layer 121M1 may be higher than a roughness of a top surface of the nucleation layer 121N and a roughness of a top surface of the second material layer 121M2. The top surface of the first material layer 121M1 may have a roughness of about 10 nm to about 500 nm. The top surface of the nucleation layer 121N and the top surface of the second material layer 121M2 may have a roughness of about 0 nm to about 10 nm. That is, the top surface of the nucleation layer 121N and the top surface of the second material layer 121M2 may be substantially planar. A relatively high roughness of an interface between the first material layer 121M1 and the second material layer 121M2 (i.e., the top surface of the first material layer 121M1) may bend a dislocation and reduce a dislocation density. Here, the roughness may be an arithmetical average roughness described above. However, example embodiments are not limited thereto.

In some example embodiments, the lattice constant of the second material layer 121M2 may be lower than the lattice constant of the first material layer 121M1. Accordingly, tensile stress may be caused in the second material layer 121M2 and result in cracks. In this case, the second material layer 121M2 may be formed to a thickness t3 less than a thickness t1 of the nucleation layer 121N, and thus, tensile stress may be reduced to prevent the occurrence of cracks. As used herein, a thickness of a layer may be defined as a maximum thickness of the layer.

The buffer layer 121B may reduce differences in lattice constant and coefficient of thermal expansion (CTE) between a layer (e.g., the first conductive semiconductor layer 122) formed on the buffer structure 121 and the second material layer 121M2. For example, a lattice constant of the buffer layer 121B may be interposed between a lattice constant of the first conductive semiconductor layer 122 and a lattice constant of the second material layer 121M2. In addition, a CTE of the buffer layer 121B may be interposed between a CTE of the first conductive semiconductor layer 122 and a CTE of the second material layer 121M2. In some example embodiments, the buffer layer 121B may include the same material as the first material layer 121M1. In some example embodiments, the buffer layer 121B may include $B_xAl_yIn_zGa_{1-x-y-z}N$ (where 0≤x<1, 0<y<1, 0≤z<1, and 0≤x+y+z<1).

In some example embodiments, at least one of the nucleation layer 121N, the first material layer 121M1, the second material layer 121M2, and the buffer layer 121B may be doped with silicon (Si). The silicon doping process may reduce tensile stress or cause compressive stress to prevent the occurrence of cracks. For example, a silicon dopant concentration may be about 0 $cm^{-3}$ to about $10^{19}$ $cm^{-3}$.

According to the experimental example, when the thickness t3 of the second material layer 121M2 was about 15% or less or about 45% or more of a thickness t2 of the first material layer 121M1, it was observed that the luminous efficiency of the light-emitting device was rapidly reduced. In this case, a rapid increase in tensile stress may result in the rapid reduction in the luminous efficiency of the light-emitting device. The tensile stress may cause the occurrence of cracks.

In addition, when the thickness t3 of the second material layer 121M2 was about 15% or less or about 45% or more of the thickness t2 of the first material layer 121M1, it was observed that a direction of the warpage of the light-emitting device formed on a silicon substrate was changed. Positive (+) warpage may indicate that compressive stress was generated in the light-emitting device, and negative (−) warpage may indicate that tensile stress was generated in the light-emitting device. When the thickness t3 of the second material layer 121M2 was about 15% or less or about 45% or more of the thickness t2 of the first material layer 121M1, it can be seen from the direction of warpage that tensile stress was generated in the light-emitting device. The tensile stress may cause the occurrence of cracks.

Therefore, to increase luminous efficiency, reduce tensile stress, and prevent the occurrence of cracks, the first and second material layers 121M1 and 121M2 may be formed such that the thickness t3 of the second material layer 121M2 ranges from about 15% to about 45% of the thickness t2 of the first material layer 121M1.

In FIG. 10A, unlike in FIG. 3B, a concave/convex structure for improving light extraction efficiency may be formed on a top surface of the first conductive semiconductor layer 122.

Unlike in FIG. 3B, a passivation structure 160 may be positioned on a top surface and a sidewall of each of the first and second partition walls 111 and 112. The passivation structure 160 may include a first passivation layer 162 and a second passivation layer 163, which are conformally positioned on the top surface and the sidewall of each of the first and second partition walls 111 and 112. The passivation structure 160 may also be conformally positioned on a top surface of a light-emitting structure 120, which is positioned at the bottoms of the plurality of cell spaces CU. Thus, the first and second passivation layers 162 and 163 on the top surface of the light-emitting structure 120 may include a concave/convex structure.

In example embodiments, the first passivation layer 162 may include a first insulating material, and the second passivation layer 163 may include a second insulating material, which is different from the first insulating material. Each of the first insulating material and the second insulating material may include at least one of silicon oxide, silicon nitride, silicon oxynitride, aluminum oxide, and aluminum nitride.

According to some example embodiments, a first thickness of the passivation structure 160 formed on the top surfaces of the first and second partition walls 111 and 112 may be less than a second thickness of the passivation structure 160 formed on the sidewalls of the first and second partition walls 111 and 112. According to some example embodiments, the first thickness may range from about 0.1 μm to about 2 μm, and the second thickness may range from about 0.5 μm to about 5 μm.

In example embodiments, the first passivation layer 162 may have a relatively uniform thickness on the sidewall of each of the first and second partition walls 111 and 112. Here, the expression "relatively uniform thickness" may indicate that a minimum thickness of the first passivation layer 162 is within about 10% of a maximum thickness thereof. Also, the second passivation layer 163 may have a relatively uniform thickness on the sidewall of each of the first and second partition walls 111 and 112. In an example manufacturing process, the first and second passivation layers 162 and 163 may be formed using a material having excellent step coverage characteristics or a manufacturing process (e.g., an atomic layer deposition (ALD) process), which is advantageous in forming materials having excellent step coverage characteristics.

For example, the first thickness of the passivation structure 160 formed on the top surfaces of the first and second partition walls 111 and 112 may be less than a critical thickness for the passivation structure 160 to act as a light waveguide. For example, when the first thickness of the passivation structure 160 positioned on the top surface of each of the first and second partition walls 111 and 112 is greater than the critical thickness, light emitted from one light-emitting cell LC may be directed into an adjacent light-emitting cell LC through the passivation structure 160 formed on the first and second partition walls 111 and 112. Accordingly, when one light-emitting cell LC is turned on, light may be absorbed or penetrated into a light-emitting cell LC adjacent thereto, and thus, the adjacent light-emitting cell LC may be difficult to be put into a complete off state. When the first thickness of the passivation structure 160 positioned on the top surface of each of the first and second partition walls 111 and 112 is less than the critical thickness, light emitted from one light-emitting cell may be blocked from an adjacent light-emitting cell.

The first thickness may be less than or equal to the second thickness. In particular, the first thickness may be less than a critical thickness for the passivation structure 160 to act as a light guide. Accordingly, the passivation structure 160 may provide a sufficient thickness to prevent contamination of a fluorescent layer 180, while undesired light crosstalk between adjacent light-emitting cells LC due to the passivation structure 160 formed on the first and second partition walls 111 and 112 may be prevented.

According to example embodiments, unlike in FIG. 10A, the passivation structure may include at least three layers. For instance, a third passivation layer having a composition similar to that of the first passivation layer 162 may be further provided on the second passivation layer 163 of FIG. 10A. In this case, the passivation structure may have a triple structure. In addition, a fourth passivation layer having a composition similar to that of the second passivation layer 163 may be provided on the third passivation layer. In this case, the passivation structure may have a quadruple structure.

Figure 11A:
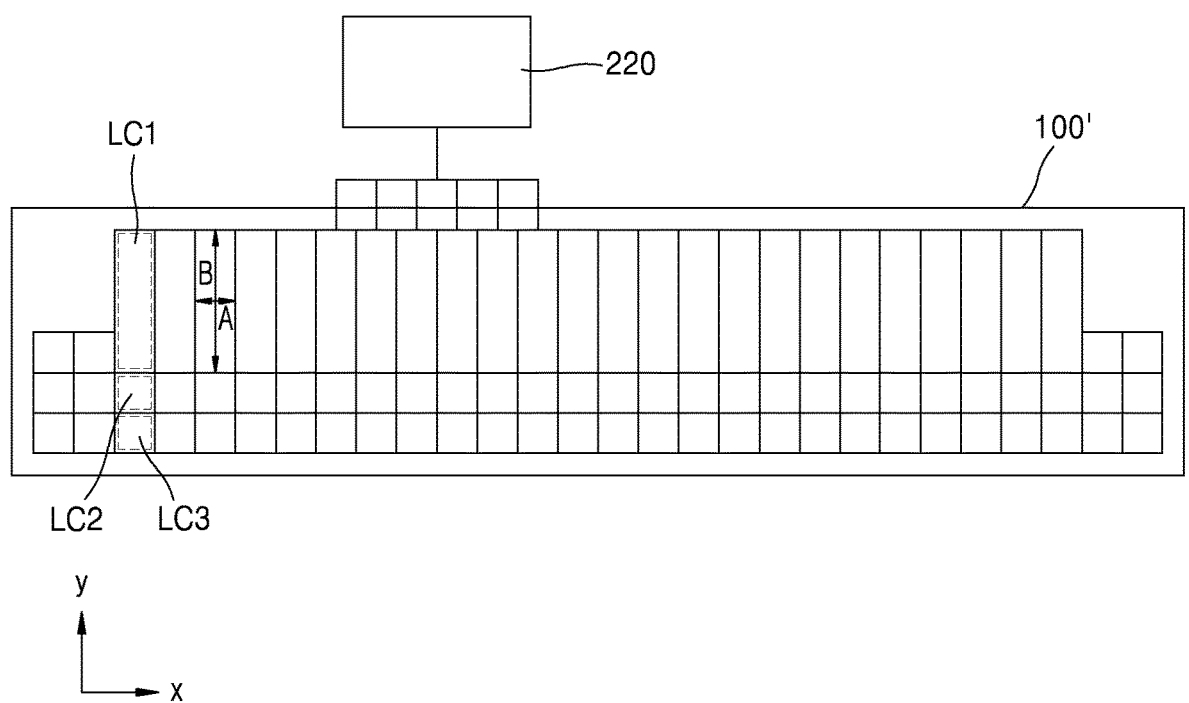
FIG. 11A is a schematic diagram of a light-emitting device according to example embodiments.

FIG. 11A is a schematic diagram of a light-emitting device 100' according to example embodiments.

Referring to FIG. 11A, the light-emitting device 100' may include first to third light-emitting cells LC1, LC2, and LC3.

The plurality of first light-emitting cells LC1 may be arranged adjacent to each other in an X direction. In some example embodiments, the plurality of first light-emitting cells LC1 may have substantially the same size and shape. Each of the first light-emitting cells LC1 may include at least one unit light-emitting device (refer to 120U in FIG. 3B). However, example embodiments are not limited thereto, and each of the first light-emitting cells LC1 may include two to twenty, two to fifteen, two to ten, two to seven, or two to five unit light-emitting devices 120U.

The plurality of second light-emitting cells LC2 may be arranged adjacent to each other in the X direction. In some example embodiments, the plurality of second light-emitting cells LC2 may have substantially the same size and shape. The plurality of second light-emitting cells LC2 may be adjacent to the plurality of first light-emitting cells LC1 in a Y direction.

In some example embodiments, a dimension of the first light-emitting cell LC1 in the X direction may be substantially equal to a dimension of the second light-emitting cell LC2 in the X direction. In some example embodiments, a side surface of the first light-emitting cell LC1, which extends in the Y direction, may be aligned with a side surface of the second light-emitting cell LC2, which extends in the Y direction.

A dimension of the first light-emitting cell LC1 in the Y direction may be greater than a dimension of the second light-emitting cell LC2 in the Y direction. In some example embodiments, the dimension of the first light-emitting cell LC1 in the Y direction may be about 1.5 to 4.5 times the dimension of the second light-emitting cell LC2 in the Y direction.

The first light-emitting cell LC1 may have a dimension of A in the X direction and a dimension of B in the Y direction. In this case, a ratio of A to B may be in a range of about 1:1.5 to about 1:4.5. Here, the dimension (i.e., A) of the first light-emitting cell LC1 in the X direction may refer to a distance between two partition walls positioned opposite to each other in the X direction in the first light-emitting cell LC1, and the dimension (i.e., B) of the first light-emitting cell LC1 in the X direction may refer to a distance between two partition walls positioned opposite to each other in the Y direction in the first light-emitting cell LC1.

In some example embodiments, the ratio of A to B may be about 1:1.3 to about 1:8, about 1:1.4 to about 1:6, about 1:1.5 to about 1:4.5, about 1:1.8 to about 1:4, or about 1:2 to about 1:3.5 and may include any range therebetween.

The plurality of third light-emitting cells LC3 may be adjacent to the plurality of second light-emitting cells LC2 in the Y direction. Also, the plurality of third light-emitting cells LC3 may be spaced apart from the plurality of first light-emitting cells LC1 with the plurality of second light-emitting cells LC2 therebetween.

In some example embodiments, the third light-emitting cells LC3 may have substantially the same size and shape as the second light-emitting cells LC2. In some example embodiments, a dimension of the third light-emitting cell LC3 in the X direction may be substantially equal to the dimension of the second light-emitting cell LC2 in the X direction. In some example embodiments, a dimension of the third light-emitting cell LC3 in the Y direction may be substantially equal to the dimension of the second light-emitting cell LC2 in the Y direction. The light-emitting device 100' may be controlled by a driver chip 220. The driver chip 220 may control on-off operations of the first light-emitting cells LC1. When one first light-emitting cell LC1 is on or off via the control of the driver chip 220, at least one unit light-emitting structure (refer to 120U in FIG. 3B) included in the one first light-emitting cell LC1 may be all turned on or off at substantially the same time.

Figure 11B:
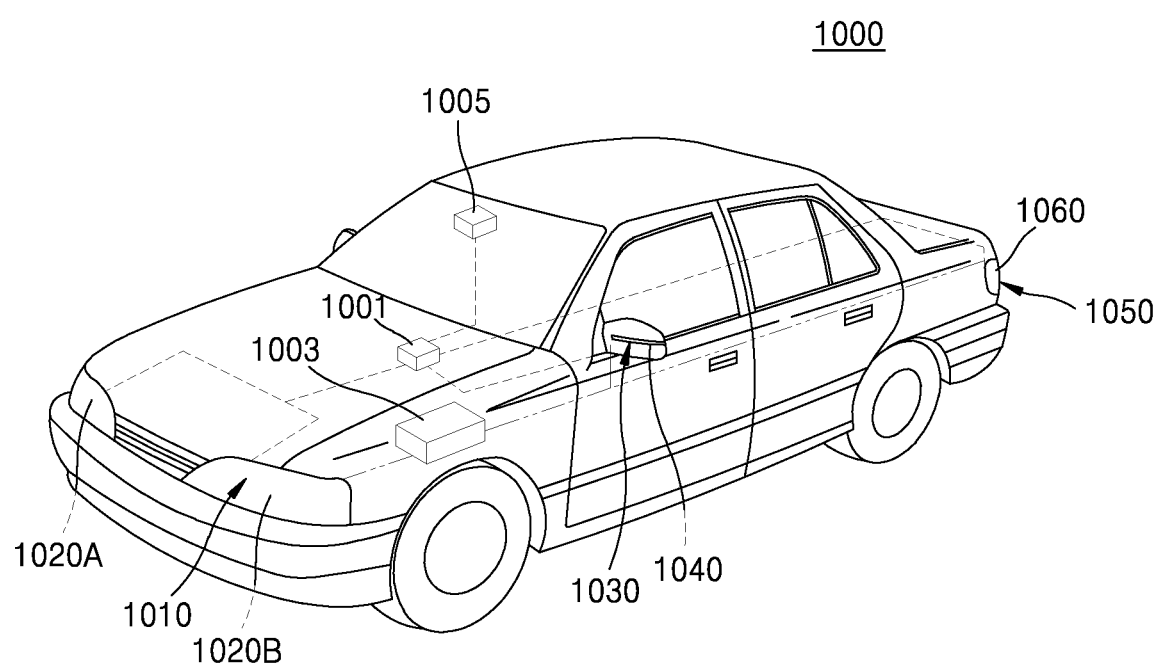
FIG. 11B is a perspective view of a vehicle according to an example embodiment.

FIG. 11B is a perspective view of a vehicle 1000 according to an example embodiment.

Although FIG. 11B illustrates an automobile as the vehicle 1000, the vehicle 1000 is not limited thereto. The vehicle 1000 may be a land vehicle such as a bicycle, a tricycle, a passenger car, a caterpillar tractor, a train, or a tram; a marine vehicle such as a ship, a boat, and a submarine; and an air vehicle such as a plane and a helicopter, but example embodiments are not limited thereto.

Referring to FIG. 11B, headlamp modules 1020A and 1020B may be installed in a headlamp portion 1010 of the vehicle 1000. A side mirror lamp module 1040 may be installed in an outer side mirror portion 1030, and a tail lamp module 1060 may be installed in a tail lamp portion 1050. The headlamp modules 1020A and 1020B may be light source modules including the light-emitting device 100' described above.

A power supply device 1003 embedded in the vehicle 1000 may supply power to each of the headlamp modules 1020A and 1020B, the side mirror lamp module 1040, and the tail lamp module 1060. Also, a controller 1001 embedded in the vehicle 1000 may be configured to control operations including on/off operations of the headlamp modules 1020A and 1020B, the side mirror lamp module 1040, and the tail lamp module 1060.

The controller 1001 may be the driver chip (refer to 220 in FIG. 11A) described above. Alternatively, the controller 1001 may be electrically connected to the driver chip 220 and configured to control the driver chip 220.

The vehicle 1000 may further include a vision recognition device 1005. The vision recognition device 1005 may detect an object in front of the vehicle 1000 and movements of the object. The vision recognition device 1005 may include a camera, a processor, and an output device. The camera may receive a front view and convert the front view into digital data. The processor may identify a position to which light emitted by the headlamp modules 1020A and 1020B is to be irradiated and a position to which the light is not to be irradiated, by using the digital data. The output device may transmit a processing result of the processor to the controller 1001.

Figure 11C:
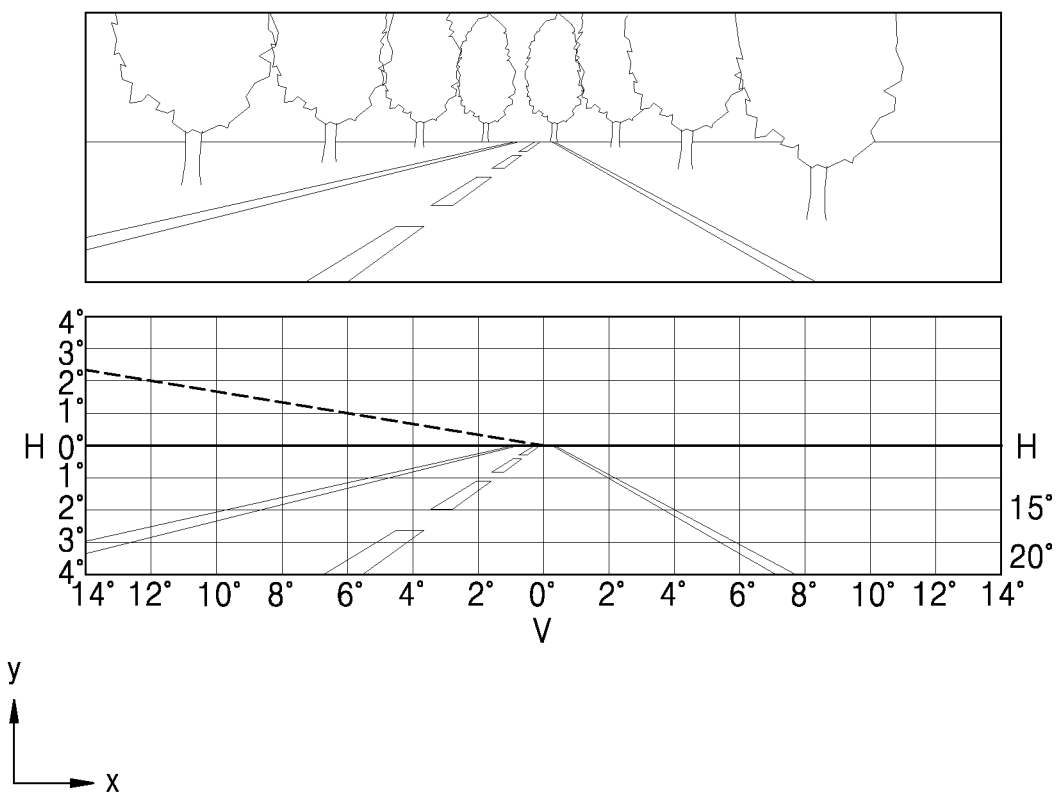
FIG. 11C is a schematic diagram showing a landscape recognized by a vision recognition device of a vehicle.

FIG. 11C is a schematic diagram showing a landscape recognized by the vision recognition device 1005 of the vehicle 1000 of FIG. 11B.

An upper diagram of FIG. 11C shows a recognized real landscape, and a lower diagram thereof shows results obtained by extracting main recognition objects from the recognized real landscape.

Referring to FIG. 11C, the vehicle 1000 may be located on a road, and the vision recognition device 1005 of the vehicle 1000 may recognize objects within a range of about −4 degrees)(°) to +4° in a vertical direction by using the horizon H as a reference point of the vertical direction. Also, the vision recognition device 1005 may recognize objects within a range of about −14° to +14° in a lateral direction by using a front direction V as a reference point of the lateral direction. However, it will be understood by one skilled in the art that a recognition range in the vertical direction and/or the lateral direction may be increased or reduced as needed.

The vision recognition device 1005 may identify each of stationary objects and moving objects in the above-described ranges of viewing angle.

Figure 11D:
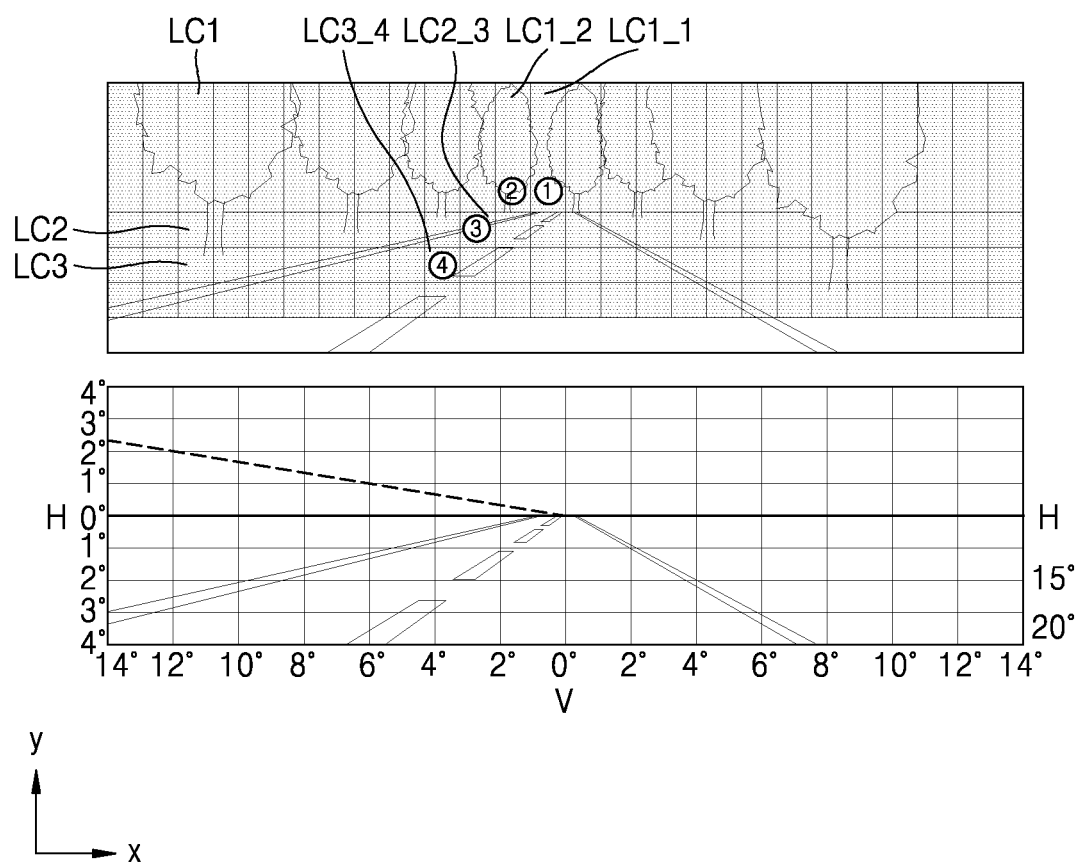
FIG. 11D is a conceptual diagram showing a range of light emitted by headlamp modules of FIG. 11B in the recognized landscape.

FIG. 11D is a conceptual diagram showing a range of light emitted by the headlamp modules 1020A and 1020B of FIG. 11B in the landscape recognized by the vision recognition device 1005 of FIG. 11B.

Referring to FIG. 11D, light emitted by the headlamp modules 1020A and 1020B may illuminate an area within a range of about −1° to +4° in a vertical direction and may illuminate an area within a range of about −14° to +14° in a lateral direction. Here, the lateral direction may be the X direction in FIG. 11A and the description thereof, and the vertical direction may be the Y direction in FIG. 11A and the description thereof. Accordingly, the headlamp modules 1020A and 1020B may irradiate light to portions corresponding to a plurality of first light-emitting cells LC1, a plurality of second light-emitting cells LC2, and a plurality of third light-emitting cells LC3, which are sequentially arranged from top to bottom.

Each of the first, second, and third light-emitting cells LC1, LC2, and LC3 may be controlled to be turned on or off as needed. On-off operations of each of the first to third light-emitting cells LC1, LC2, and LC3 may be controlled by the driver chip 220. In particular, when another vehicle approaches the vehicle 1000 of FIG. 11B in the front, light emitted by the first light-emitting cell LC1 may disturb the driving of the other vehicle because the first light-emitting cell LC1 is configured to irradiate light to a relatively high position, which is far away from the first light-emitting cell LC1. Therefore, on/off operations of some light-emitting regions may be dynamically controlled in response to a position of the other vehicle so as not to disturb the driving of the other vehicle that approaches in the front.

Hereinafter, for convenience of description, some of light-emitting cells included in the first light-emitting cell LC1 are referred to as LC1_1 and LC1_2, some of the light-emitting cell included in the second light-emitting cell LC2 are referred to as LC2_3, and some of the light-emitting cell included in the third light-emitting cell LC3 are referred to as LC3_4. Specifically, when another vehicle approaches the vehicle 1000 at a position ①, the driver chip 220 may turn off a first light-emitting cell LC1_1 corresponding to the position ①. Thereafter, when the other vehicle gradually approaches, the other vehicle may be at a position ②. In this case, the driver chip 220 may turn off a second light-emitting cell LC1_2 corresponding to the position ② and turn on the first light-emitting cell LC_1 corresponding to the position ①.

In some example embodiments, when it is determined that the other vehicle is between the positions ① and ②, the driver chip 220 may simultaneously turn off a plurality of light-emitting cells.

Subsequently, when the other vehicle further approaches and reaches a position ③, the driver chip 220 may turn off a second light-emitting cell LC2_3 corresponding to the position ③ and turn on the first light-emitting cell LC1_2 corresponding to the position ②. Furthermore, when the other vehicle further approaches and reaches a position ④, the driver chip 220 may turn off a third light-emitting cell LC3_4 corresponding to the position ④ and turn on the turned-off second light-emitting cell LC2_3 corresponding to the position ③ again.

As described above, by recognizing a position of another vehicle, which approaches the vehicle 1000, and turning off a light-emitting region corresponding to the position, driving safety may be improved by facilitating the driving of the other vehicle. Although a case in which only one vehicle approaches the vehicle 10000 has been described above, it will be understood by one skilled in the art that the driver chip 220 may operate in the same manner as described above even when at least two vehicles approach the vehicle 1000.

While example embodiments have been particularly shown and described, it will be understood that various changes in form and details may be made therein without departing from the spirit and scope of the following claims.

What is claimed is:

1. A light-emitting device comprising:
   a support substrate having a light-emitting cell region, a pad region and an edge region, the edge region surrounding the light-emitting cell region and the pad region;
   a plurality of unit light-emitting devices arranged in a matrix in the light-emitting cell region and spaced apart from each other;
   a plurality of pads formed in the pad region;
   partition walls arranged on the plurality of unit light-emitting devices, the partition walls defining a plurality of cell spaces respectively corresponding to the plurality of unit light-emitting devices;
   a plurality of fluorescent layers arranged on the plurality of unit light-emitting devices in the plurality of cell spaces;
   a plurality of insulating layers provided between the support substrate and the plurality of unit light-emitting devices; and
   a fence provided around the plurality of unit light-emitting devices and the plurality of pads, protruding in a direction perpendicular to a top surface of the support substrate, and comprising the plurality of insulating layers,
   wherein the light-emitting device has a cuboid shape, a first length of the light-emitting device in a first direction is greater than a second length of the light-emitting device in a second direction, the first direction is parallel to a top surface of the support substrate, and the second direction is parallel to the top surface of the support substrate and perpendicular to the first direction.

2. The light-emitting device of claim 1, wherein the first length is between about 1.1 times and 100 times the second length.

3. The light-emitting device of claim 1, wherein the pad region extends in the first direction, and
   wherein the plurality of pads are arranged along the first direction.

4. The light-emitting device of claim 1, wherein a third length of the light-emitting device in a third direction is less than or equal to about 1/10 the first length, and the third direction is perpendicular to the support substrate.

5. The light-emitting device of claim 1, wherein each of the plurality of pads comprises a probe contact portion and a current injection portion.

6. The light-emitting device of claim 5, wherein an arithmetical average roughness of the current injection portion is less than an arithmetical average roughness of the probe contact portion.

7. The light-emitting device of claim 5, wherein a width of the probe contact portion in the first direction is different from a width of the current injection portion in the first direction.

8. The light-emitting device of claim 5, wherein the probe contact portion is spaced apart from the current injection portion in the second direction.

9. The light-emitting device of claim 8, further comprising an interconnection electrode directly connected to each of the probe contact portion and the current injection portion.

10. A light-emitting device comprising:
a plurality of unit light-emitting devices arranged in a matrix shape and spaced apart from each other in a lateral direction;
a first insulating layer covering bottom surfaces of the plurality of unit light-emitting devices;
a second insulating layer covering a bottom surface of the first insulating layer;
a third insulating layer covering a bottom surface of the second insulating layer;
a buried insulating layer covering a bottom surface of the third insulating layer and comprising a planar surface;
an adhesive layer in contact with the planar surface of the buried insulating layer;
a support substrate in contact with the adhesive layer; and
a first fence provided around the plurality of unit light-emitting devices, protruding in a direction perpendicular to a top surface of the support substrate, and comprising at least two from among the first insulating layer, the second insulating layer and the third insulating layer,
wherein the light-emitting device has a rectangular planar shape and a first side of the rectangular planar shape is perpendicular to a second side of the rectangular planar shape,
wherein a first length of the first side is about 1.1 times to about 100 times a second length of the second side, and
wherein a thickness of the light-emitting device is less than about 1/10 the first length.

11. The light-emitting device of claim 10, wherein the first fence is disposed along a periphery of a first surface of the light-emitting device, the first side and the second side corresponding to the first surface, and
wherein the first fence surrounds the plurality of unit light-emitting devices and comprises the first insulating layer, the second insulating layer and the third insulating layer.

12. The light-emitting device of claim 11, wherein each of the plurality of unit light-emitting devices comprises a first conductive semiconductor layer, a second conductive semiconductor layer, and an active layer interposed between the first conductive semiconductor layer and the second conductive semiconductor layer,
wherein the first conductive semiconductor layer is farther from the support substrate than the second conductive semiconductor layer, and
wherein a top surface of the first fence is farther from the support substrate than a top surface of the active layer.

13. The light-emitting device of claim 11, wherein each of the plurality of unit light-emitting devices comprises a first conductive semiconductor layer, a second conductive semiconductor layer, and an active layer interposed between the first conductive semiconductor layer and the second conductive semiconductor layer,
wherein the first conductive semiconductor layer is farther from the support substrate than the second conductive semiconductor layer, and
wherein the top surface of the first fence is closer to the support substrate than the top surface of the active layer.

14. The light-emitting device of claim 11, wherein each of the plurality of unit light-emitting devices comprises a first conductive semiconductor layer, a second conductive semiconductor layer, and an active layer interposed between the first conductive semiconductor layer and the second conductive semiconductor layer,
wherein the first conductive semiconductor layer is farther from the support substrate than the second conductive semiconductor layer, and
wherein the top surface of the first fence is at substantially a same level as a top surface of the first conductive semiconductor layer.

15. The light-emitting device of claim 11, further comprising a second fence surrounding the first fence, the second fence comprising the first insulating layer, the second insulating layer and the third insulating layer.

16. The light-emitting device of claim 15, wherein a top surface of the first fence is at substantially a same level as a top surface of the second fence.

17. A light source module comprising:
a package substrate;
a light-emitting device disposed on the package substrate and comprising a plurality of unit light-emitting devices arranged in a matrix, the light-emitting device having a rectangular planar shape;
a plurality of insulating layers provided between the package substrate and the plurality of unit light-emitting devices; and
a fence provided on the package substrate around the plurality of unit light-emitting devices, protruding in a direction perpendicular to a top surface of the package substrate, and comprising the plurality of insulating layers; and
at least one driver chip configured to drive the light-emitting device,
wherein a first side of the rectangular planar shape is perpendicular to a second side of the rectangular planar shape,
wherein a first length of the first side is about 1.1 times to about 100 times a second length of the second side, and
wherein a thickness of the light-emitting device is less than about 1/10 the first length.

18. The light source module of claim 17, wherein each of the plurality of unit light-emitting devices comprises a light-emitting diode (LED),
wherein a first unit light-emitting device of the plurality of unit light-emitting devices comprises a first cathode and a first anode,
wherein a second unit light-emitting device of the plurality of unit light-emitting devices comprises a second cathode and a second anode, and
wherein the second anode is electrically connected to the first cathode.

19. The light source module of claim 18, further comprising:
a first Zener diode having a third anode and a third cathode; and
a second Zener diode having a fourth anode and a fourth cathode,
wherein the third anode is electrically connected to the first cathode, the third cathode is electrically connected to the first anode, the fourth anode is electrically connected to the second cathode, and the fourth cathode is electrically connected to the second anode.

20. The light source module of claim 19, wherein the plurality of insulating layers comprises:
a first insulating layer covering bottom surfaces of the plurality of unit light-emitting devices;
a second insulating layer covering a bottom surface of the first insulating layer;

a third insulating layer covering a bottom surface of the second insulating layer, wherein the light-emitting device comprises:

a buried insulating layer covering a bottom surface of the third insulating layer and comprising a planar surface;

an adhesive layer in contact with the planar surface of the buried insulating layer;

a support substrate in contact with the adhesive layer, the support substrate having a light-emitting cell region, a pad region, and an edge region; and a plurality of pads formed in the pad region and connected to the at least one driver chip, wherein the plurality of unit light-emitting devices are disposed in the light-emitting cell region, and wherein the fence comprises the first insulating layer.

* * * * *